United States Patent
Kim et al.

(10) Patent No.: US 9,673,237 B2
(45) Date of Patent: Jun. 6, 2017

(54) DEPTH PIXEL INCLUDED IN THREE-DIMENSIONAL IMAGE SENSOR, THREE-DIMENSIONAL IMAGE SENSOR INCLUDING THE SAME AND METHOD OF OPERATING DEPTH PIXEL INCLUDED IN THREE-DIMENSIONAL IMAGE SENSOR

(71) Applicant: SAMSUNG ELECTRONICS CO., LTD., Suwon-si, Gyeonggi-Do (KR)

(72) Inventors: Seoung-Hyun Kim, Hwaseong-si (KR); Yoon-Dong Park, Osan-si (KR); Yong-Jei Lee, Seongnam-si (KR); Joo-Yeong Gong, Suwon-si (KR); Hee-Woo Park, Seoul (KR); Seung-Won Cha, Daejeon (KR); Sung-Chul Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 677 days.

(21) Appl. No.: 14/101,376

(22) Filed: Dec. 10, 2013

(65) Prior Publication Data
US 2014/0225173 A1 Aug. 14, 2014

(30) Foreign Application Priority Data
Feb. 8, 2013 (KR) .......................... 10-2013-0014260

(51) Int. Cl.
*H01L 27/146* (2006.01)
(52) U.S. Cl.
CPC .... *H01L 27/14612* (2013.01); *H01L 27/1461* (2013.01); *H01L 27/14605* (2013.01); *H01L 27/14641* (2013.01)

(58) Field of Classification Search
CPC ........ G01S 7/4863; G01S 17/10; G01S 17/89; H01L 27/14643
See application file for complete search history.

(56) References Cited

U.S. PATENT DOCUMENTS

| 8,034,649 B2 | 10/2011 | Oshiyama et al. |
| 2010/0020209 A1 | 1/2010 | Kim |
| 2011/0001904 A1 | 1/2011 | Tachikawa et al. |

(Continued)

FOREIGN PATENT DOCUMENTS

| JP | 2009194005 A | 8/2009 |
| JP | 2010071832 A | 4/2010 |

(Continued)

*Primary Examiner* — Luke Ratcliffe
(74) *Attorney, Agent, or Firm* — Volentine & Whitt, PLLC

(57) ABSTRACT

A depth pixel of a three-dimensional image sensor includes a first photo gate which is turned on/off in response to a first photo control signal, a first photo detection area configured to generate first charges based on a received light reflected from a subject when the first photo gate is turned on, a first transmission gate which is turned on/off in response to a first transmission control signal, a first floating diffusion area configured to accumulate the first charges generated from the first photo detection area when the first transmission gate is turned on, and a first compensation unit configured to generate second charges which are different from the first charges based on ambient light components included in the received light to supply the second charges to the first floating diffusion area.

23 Claims, 42 Drawing Sheets

(56) References Cited

U.S. PATENT DOCUMENTS

| | | |
|---|---|---|
| 2011/0019049 A1 | 1/2011 | Jin et al. |
| 2011/0037969 A1* | 2/2011 | Spickermann ........ G01S 7/4863 |
| | | 356/5.01 |
| 2011/0090383 A1 | 4/2011 | Yamaguchi |
| 2011/0128423 A1 | 6/2011 | Lee et al. |
| 2011/0193940 A1 | 8/2011 | Park et al. |

FOREIGN PATENT DOCUMENTS

| | | |
|---|---|---|
| JP | 2011100845 A | 5/2011 |
| KR | 2011093453 A | 8/2011 |

* cited by examiner

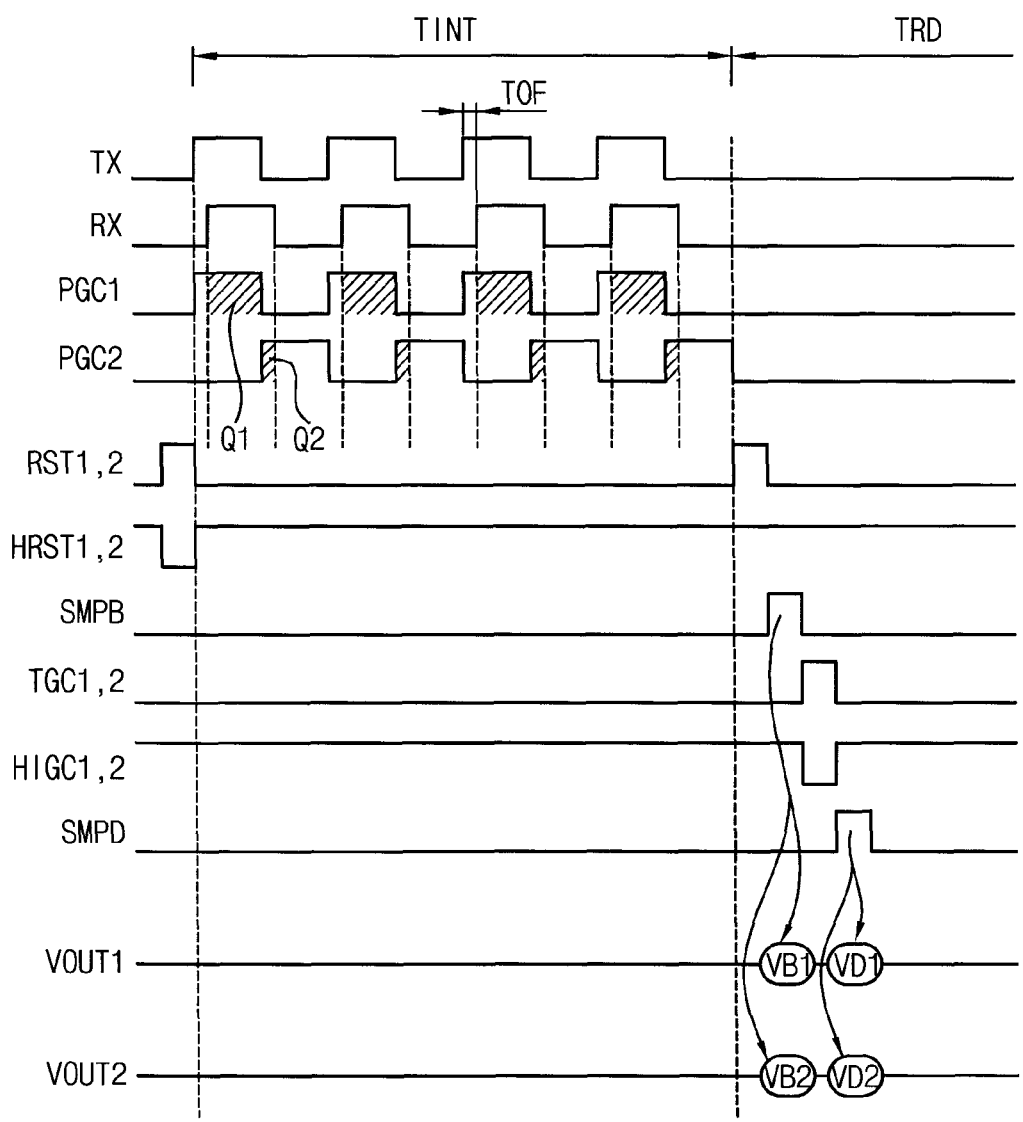

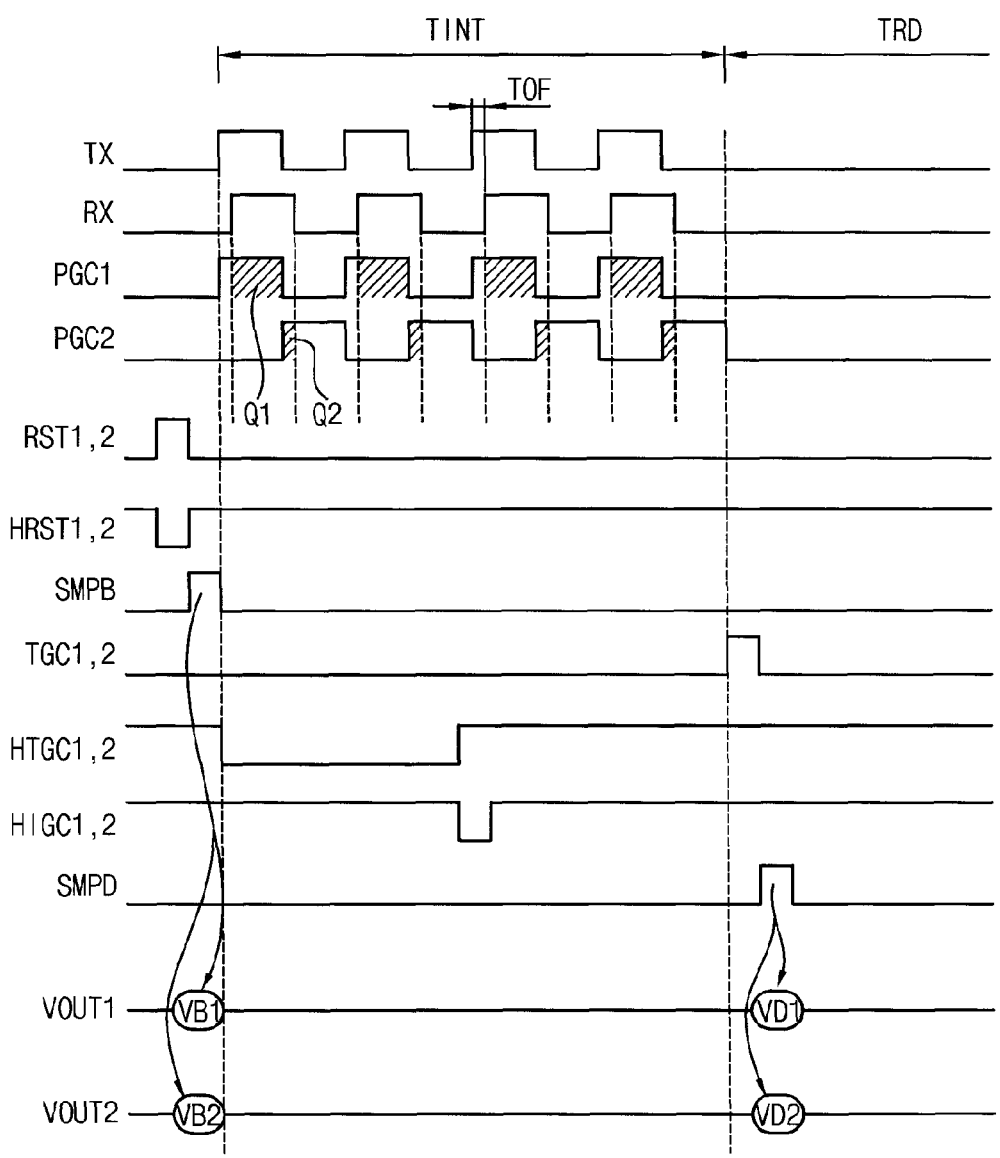

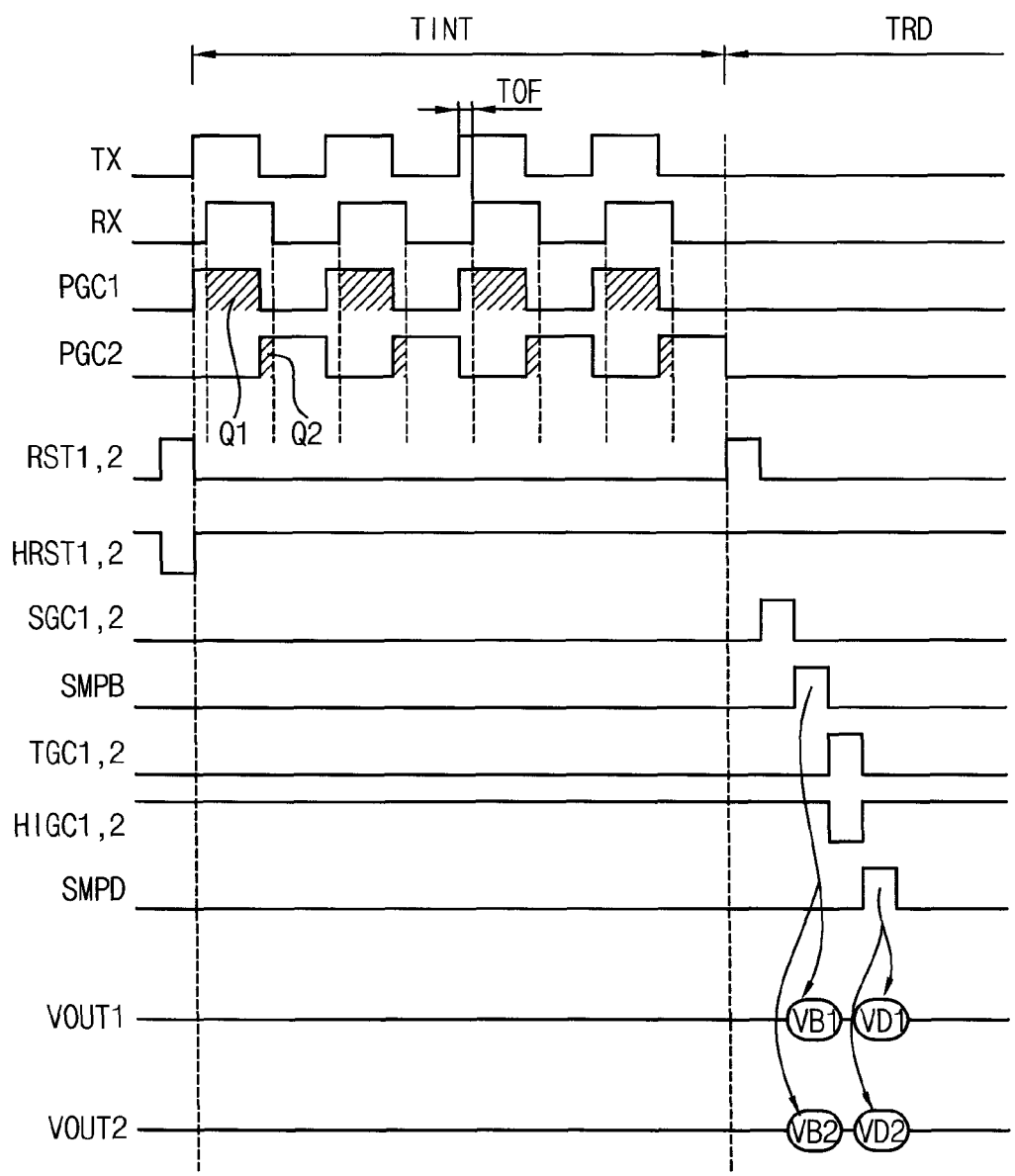

610a

610b

DEPTH PIXEL INCLUDED IN THREE-DIMENSIONAL IMAGE SENSOR, THREE-DIMENSIONAL IMAGE SENSOR INCLUDING THE SAME AND METHOD OF OPERATING DEPTH PIXEL INCLUDED IN THREE-DIMENSIONAL IMAGE SENSOR

CROSS-REFERENCE TO RELATED APPLICATION

A claim of priority under 35 USC §119 is made to Korean Patent Application No. 2013-0014260, filed on Feb. 8, 2013, in the Korean Intellectual Property Office (KIPO), the contents of which are herein incorporated by reference in their entirety.

BACKGROUND

Example embodiments relate generally to image sensors, and more particularly, example embodiments relate to a depth pixel included in a three-dimensional image sensor, the three-dimensional image sensor including a depth pixel, and a method of operating a depth pixel included in a three-dimensional image sensor.

An image sensor is a semiconductor device configured to convert an externally incident optical signal into an electrical signal which can used to derive image information corresponding to the optical signal. Recently, research has been directed towards the development of a three-dimensional image sensor which is capable of providing distance information as well as image information based on the optical signal. The three-dimensional image sensor may rely on distances between each of depth pixels and Time Of Flight (TOF) measurements to determine the distance of a subject. Here, TOF refers to a travel time of a laser pulse taken until the laser pulse returns to its origination through reflection after being irradiated onto the subject.

SUMMARY

According to example embodiments, a depth pixel of a three-dimensional image sensor a first photo gate which is turned on/off in response to a first photo control signal, a first photo detection area configured to generate first charges based on a received light reflected from a subject when the first photo gate is turned on, a first transmission gate which is turned on/off in response to a first transmission control signal, a first floating diffusion area configured to accumulate the first charges generated from the first photo detection area when the first transmission gate is turned on, and a first compensation unit. The first compensation unit is configured to generate second charges which are different from the first charges based on ambient light components included in the received light to supply the second charges to the first floating diffusion area.

The first compensation unit may include a first ambient light detection area and a first injection gate. The first ambient light detection area may generate the second charges based on the ambient light components. The first injection gate may be turned on/off in response to a first injection control signal.

The second charges generated from the first ambient light detection area may be injected into the first floating diffusion area when the first injection gate is turned on.

The first ambient light detection area may have a size which is smaller than a size of the first photo detection area.

The first ambient light detection area may be formed in a semiconductor substrate by doping first impurities, which are of a conductive type that is the same as a conductive type of the semiconductor substrate, at a concentration which is higher than a concentration of impurities doped in the semiconductor substrate.

The first ambient light detection area may be formed by gradually increasing the concentration of the first impurities in a direction towards a first surface of the semiconductor substrate to which the received light is incident.

The first compensation unit may further include a first reset transistor to initialize the first ambient light detection area in response to a first reset signal.

The first compensation unit may further include a second transmission gate and a first storage area. The second transmission gate may be turned on/off in response to a second transmission control signal. The first storage area may store the second charges generated from the first ambient light detection area when the second transmission gate is turned on.

The second charges stored in the first storage area may be injected into the first floating diffusion area when the first injection gate is turned on after the second transmission gate is turned on.

The first ambient light detection area may include a first impurity region and a second impurity region. The first impurity region may be formed in a semiconductor substrate by doping first impurities, which are of a conductive type which is the same as a conductive type of impurities doped in the semiconductor substrate, at a concentration which is higher that a concentration of the impurities doped in the semiconductor substrate. The second impurity area may be formed under the first impurity area in the semiconductor substrate by doping second impurities of a conductive type which is different from the conductive type of the first impurities.

The first ambient light detection area may further include a third impurity area formed over the first impurity area in the semiconductor substrate by doping the second impurities.

The first compensation unit may further include a first reset transistor to initialize the first storage area in response to a first reset signal.

The depth pixel may further include a second photo gate, a second photo detection area, a second transmission gate, a second floating diffusion area and a second compensation unit. The second photo gate may be turned on/off in response to a second photo control signal. The second photo detection area may generate third charges based on the received light when the second photo gate is turned on. The second transmission gate may be turned on/off in response to a second transmission control signal. The second floating diffusion area may accumulate the third charges generated from the second photo detection area when the second transmission gate is turned on. The second compensation unit may generate fourth charges which are different from the third charges based on the ambient light components to supply the fourth charges to the second floating diffusion area.

The depth pixel may further include a channel stop area between the first photo detection area and the second photo detection area.

The first photo control signal may be periodically toggled between a first logic level and a second logic level during a light collection period, and may have the first logic level during a readout period. The second charges may be generated and collected during the light collection period and injected into the first floating diffusion area during the light collection period or the readout period.

The depth pixel may further include a first output unit to generate an output voltage corresponding to a sum of the first and second charges.

The first output unit may include a first reset transistor, a first drive transistor and a first select transistor. The first reset transistor may initialize the first floating diffusion area in response to a first reset signal. The first drive transistor may amplify a voltage of the first floating diffusion area. The first select transistor may output the voltage amplified by the first drive transistor as the output voltage.

According to example embodiments, a depth pixel of a three-dimensional image sensor includes first and second photo detection areas configured to generate first charges based on a received light reflected from a subject, first and second floating diffusion areas configured to accumulate the first charges generated from the first and second photo detection areas, respectively, and first and second compensation units configured to generate second charges which are different from the first charges based on ambient light components included in the received light to supply the second charges to the first and second floating diffusion areas, respectively.

The depth pixel may further include first and second bridge diffusion areas and first and second photo gates. The first and second bridge diffusion areas may be adjacent to the first and second photo detection areas, respectively. The first and second photo gates may be formed over the first and second photo detection areas, respectively, to store the first charges generated from the first and second photo detection areas in the first and second bridge diffusion areas, respectively, in response to first and second photo control signals.

The depth pixel may further include first and second storage areas and first and second photo gates. The first and second storage areas may be spaced apart from the first and second photo detection areas, respectively. The first and second photo gates may electrically connect the first and second photo detection areas to the first and second storage areas, respectively, in response to first and second photo control signals.

The depth pixel may further include first and second bridge diffusion areas, first and second storage areas, first and second photo gates and first and second storage gates. The first and second bridge diffusion areas may be adjacent to the first and second photo detection areas, respectively. The first and second storage areas may be spaced apart from the first and second bridge diffusion areas, respectively. The first and second photo gates may be formed over the first and second photo detection areas, respectively, to store the first charges generated from the first and second photo detection areas in the first and second bridge diffusion areas, respectively, in response to first and second photo control signals. The first and second storage gates may electrically connect the first and second bridge diffusion areas to the first and second storage areas, respectively.

According to example embodiments, a three-dimensional image sensor includes a light source unit and a pixel array. The light source unit illuminates a modulated transmission light to a subject. The pixel array includes a plurality of depth pixels to generate distance information from the three-dimensional image sensor to the subject based on a received light reflected from the subject. A first depth pixel among the plural depth pixels includes a first photo gate which is turned on/off in response to a first photo control signal, a first photo detection area configured to generate first charges based on the received light when the first photo gate is turned on, a first transmission gate which is turned on/off in response to a first transmission control signal, a first floating diffusion area configured to accumulate the first charges generated from the first photo detection area when the first transmission gate is turned on, and a first compensation unit configured to generate second charges which are different from the first charges based on ambient light components included in the received light to supply the second charges to the first floating diffusion area.

A second depth pixel among the plural depth pixels, which is adjacent to the first depth pixel, may include a second photo gate, a second photo detection area, a second transmission gate and a second floating diffusion area. The second photo gate may be turned on/off in response to a second photo control signal. The second photo detection area may generate third charges based on the received light when the second photo gate is turned on. The second transmission gate may be turned on/off in response to a second transmission control signal. The second floating diffusion area may accumulate the third charges generated from the second photo detection area when the second transmission gate is turned on. The first compensation unit may be shared by the first and second depth pixels.

According to example embodiments, in a method of operating a depth pixel of a three-dimensional image sensor, first charges are generated during a light collection period based on received light reflected from a subject. Second charges which are different from the first charges are generated based on ambient light components included in the received light. The first charges are accumulated in a floating diffusion area during a readout period. The second charges are injected into the floating diffusion area.

The generating of the second charges may be performed during the light collection period. The injecting of the second charges into the floating diffusion area may be performed during the light collection period or the readout period.

BRIEF DESCRIPTION OF THE DRAWINGS

Illustrative, non-limiting example embodiments will become understood from the detailed description that follows in conjunction with the accompanying drawings.

FIGS. 7A and 7B are timing charts for reference in explaining an operational example of the depth pixel shown in FIG. 4.

FIGS. 11A and 11B are timing charts for reference in explaining an operational example of the depth pixel shown in FIG. 8.

FIGS. 20A and 20B are timing charts for reference in explaining an operational example of the depth pixel shown in FIG. 18.

DETAILED DESCRIPTION OF THE EMBODIMENTS

Figure 1:
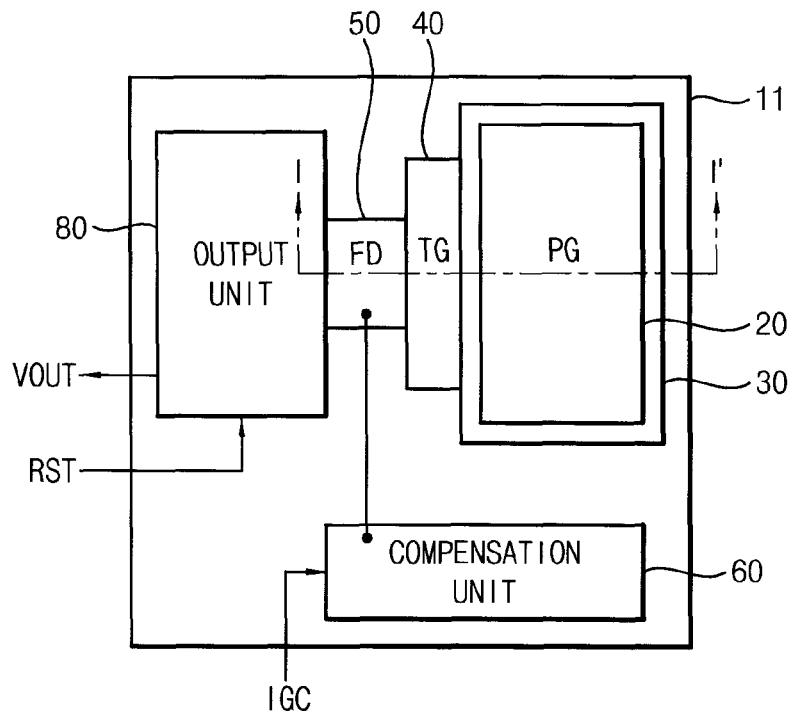
FIG. 1 is a plan view illustrating a depth pixel of a three-dimensional image sensor according to example embodiments.

Various example embodiments will be described more fully with reference to the accompanying drawings, in which embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
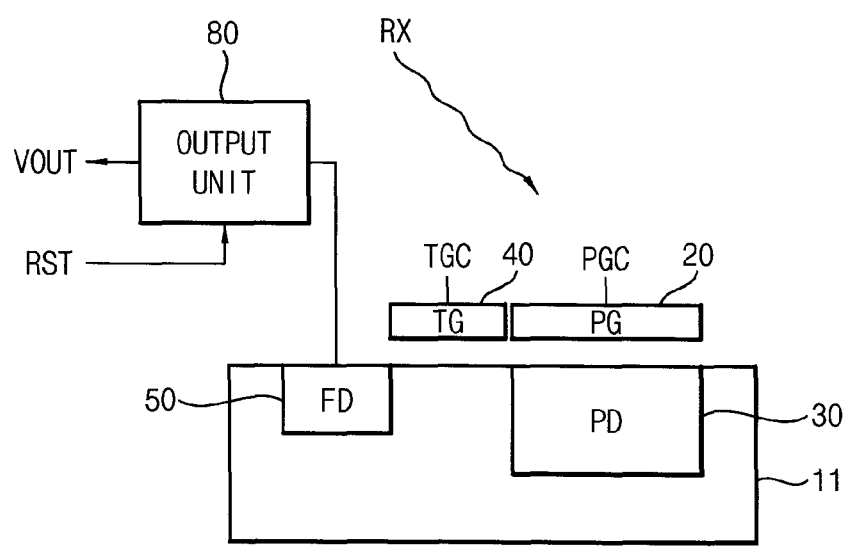
FIG. 2 is a view illustrating an example of a vertical structure of the depth pixel shown in FIG. 1.

FIG. 1 is a plan view illustrating a depth pixel of a three-dimensional image sensor according to example embodiments. FIG. 2 illustrates a sectional view taken along line I-I' of FIG. 1, and represents a vertical structure of the depth pixel shown in FIG. 1.

Referring to FIGS. 1 and 2, the depth pixel 10 included in the three-dimensional image sensor of example embodiments includes a photo gate 20, a photo detection area 30, a transmission gate 40, a floating diffusion area 50 and a compensation unit 60. The depth pixel 10 may further include an output unit 80.

The photo gate 20 is formed over a semiconductor substrate 11 and is turned on/off in response to a photo control signal PGC. The photo detection area 30 is formed in the semiconductor substrate 11 and generates first charges based on received light RX reflected from a subject when the photo gate 20 is turned on.

The transmission gate 40 is formed over the semiconductor substrate 11 and is turned on/off in response to a transmission control signal TGC. The floating diffusion area 50 is formed in the semiconductor substrate 11 to accumulate the first charges generated from the photo detection area 30 when the transmission gate 40 is turned on. In other words, the photo detection area 30 may be electrically connected to the floating diffusion area 50 in response to the transmission control signal TGC. Such an electric connection may be realized by a channel formed over the semiconductor substrate 11 between the two areas 30 and 50.

The compensation unit 60 is formed on and in the semiconductor substrate 11. The compensation unit 60 generates second charges having a polarity which is different (or opposite) from a polarity of the first charges based on ambient light components included in the received light RX, and supplies the second charges to the floating diffusion area 50 in response to an injection control signal IGC. A detailed structural example of the compensation unit 60 will be described later with reference to FIGS. 4, 5B, 8 and 9.

In one example embodiment, the first charges may be electrons and the second charges may be holes of electron-hole pairs. In another example embodiment, the first charges may be holes and the second charges may be electrons of electron-hole pairs.

The output unit 80 resets the floating diffusion area 50 in response to a reset signal RST and converts voltage of the floating diffusion area 50 into an electric signal to output the electric signal. In other words, the output unit 80 may generate an output voltage VOUT corresponding to the sum of the first changes and the second charges. A detailed structural example of the output unit 80 will be described later with reference to FIGS. 4 and 5A.

Figure 3:
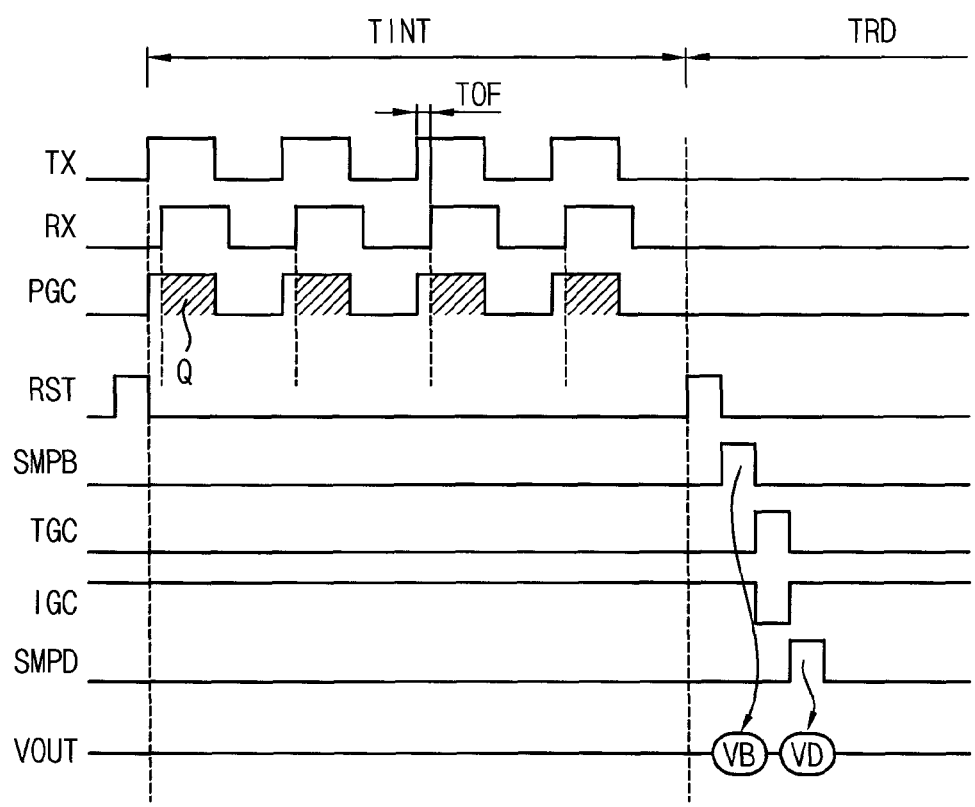
FIG. 3 is a timing chart for reference in explaining an operational example of the depth pixel shown in FIG. 1.

FIG. 3 is a timing chart for reference in describing an operational example of the depth pixel shown in FIG. 1.

Referring to FIGS. 1, 2 and 3, the depth pixel 10 resets the floating diffusion area 50 by activating the reset signal RST before a light collection period TINT.

The three-dimensional image sensor including the depth pixel 10 illuminates the modulated transmission light TX to the subject during the light collection period TINT. As will be described later with reference to FIGS. 30 and 34, the three-dimensional image sensor may include a light source or a light emitting device to illuminate the transmission light TX having periodically variable intensity to the subject. The transmission light TX is reflected from the subject and reaches the three-dimensional image sensor as the received light RX. The received light RX is delayed with respect to the transmission light TX by TOF (Time Of Flight).

The first charges are generated from the photo detection area 30 of the depth pixel 10 during the light collection period TINT by the received light RX. In detail, the photo control signal PGC has the periodically variable intensity during the light collection period TINT and photo charges Q corresponding to the activation duration of the photo control signal PGC are generated from the photo detection area 30 and collected as the first charges.

In this manner, the TOF can be calculated based on the quantity of photo charges Q corresponding to the phase of the photo control signal PGC. When the distance from the three-dimensional image sensor to the subject is D and velocity of light is c, the distance D may be calculated based on the equation "D=TOF*c/2". Although FIG. 3 shows only one photo control signal PGC having the phase the same as that of the transmission light TX, according to example embodiments, a plurality of photo control signals having phases which are different from the phase of the transmission light TX can be utilized to more accurately calculate the TOF.

In addition, the second charges are generated from the compensation unit 60 of the depth pixel 10 based on the ambient light components included in the received light RX during the light collection period TINT.

As the readout period TRD starts, the reset signal RST is primarily activated so that the floating diffusion area 50 is initialized. After the floating diffusion area 50 has been initialized, a first sampling control signal SMPB is activated so that the voltage of the floating diffusion area 50 is detected as a noise voltage VB. After the noise voltage VB has been detected, the transmission control signal TGC is activated so that the first charges are accumulated in the floating diffusion area 50. At the same time, the injection control signal IGC is activated so that the second charges are injected into the floating diffusion area 50. After the first and second charges have been accumulated/injected into the floating diffusion area 50, a second sampling control signal SMPD is activated so that the voltage of the floating diffusion area 50 is detected as a demodulated voltage VD. The demodulated voltage VD corresponds to the sum of the first and second charges. In addition, a difference between the demodulated voltage VD and the noise voltage VB may correspond to an effective voltage.

Although FIG. 3 shows that the reset signal RST is inactivated during the light collection period TINT, according to example embodiments, the reset signal RST may be activated before the light collection period TINT and may be maintained in an activated state.

The depth pixel 10 according to example embodiments includes the compensation unit 60 to inject the second charges generated based on ambient light components into the floating diffusion area 50. Since some of the first charges generated based on the received light RX are extinguished after being combined with the second charges, the three-dimensional image sensor including the depth pixel 10 can accurately measure the distance to the subject without performance degradation even when the ambient light is relatively strong.

Hereinafter, various examples of the depth pixel included in the three-dimensional image sensor according to example embodiments will be described.

FIG. 4 to FIG. 11 (that is, FIGS. 11A and 11B) are presented to explain example embodiments related to a compensation block that generates the second charges (for instance, holes) based on ambient light components included in the received light RX, and FIGS. 12 to 29 are presented to explain example embodiments related to a main sensing block that includes the photo detection area to generate the first charges (for instance, electrons) based on the received light RX.

Figure 4:
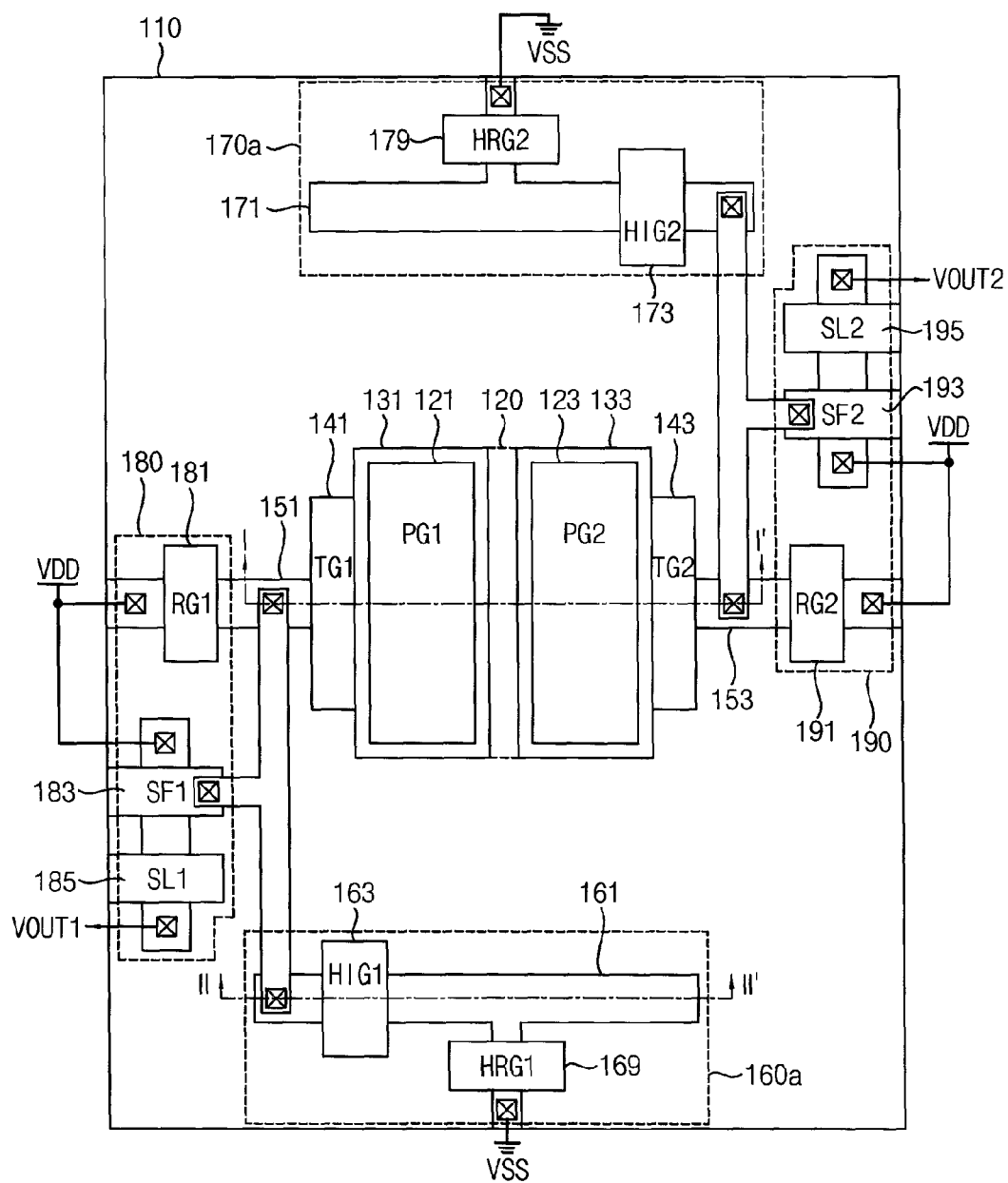
FIG. 4 is a plan view illustrating an example of the depth pixel shown in FIG. 1.
Figure 5A:
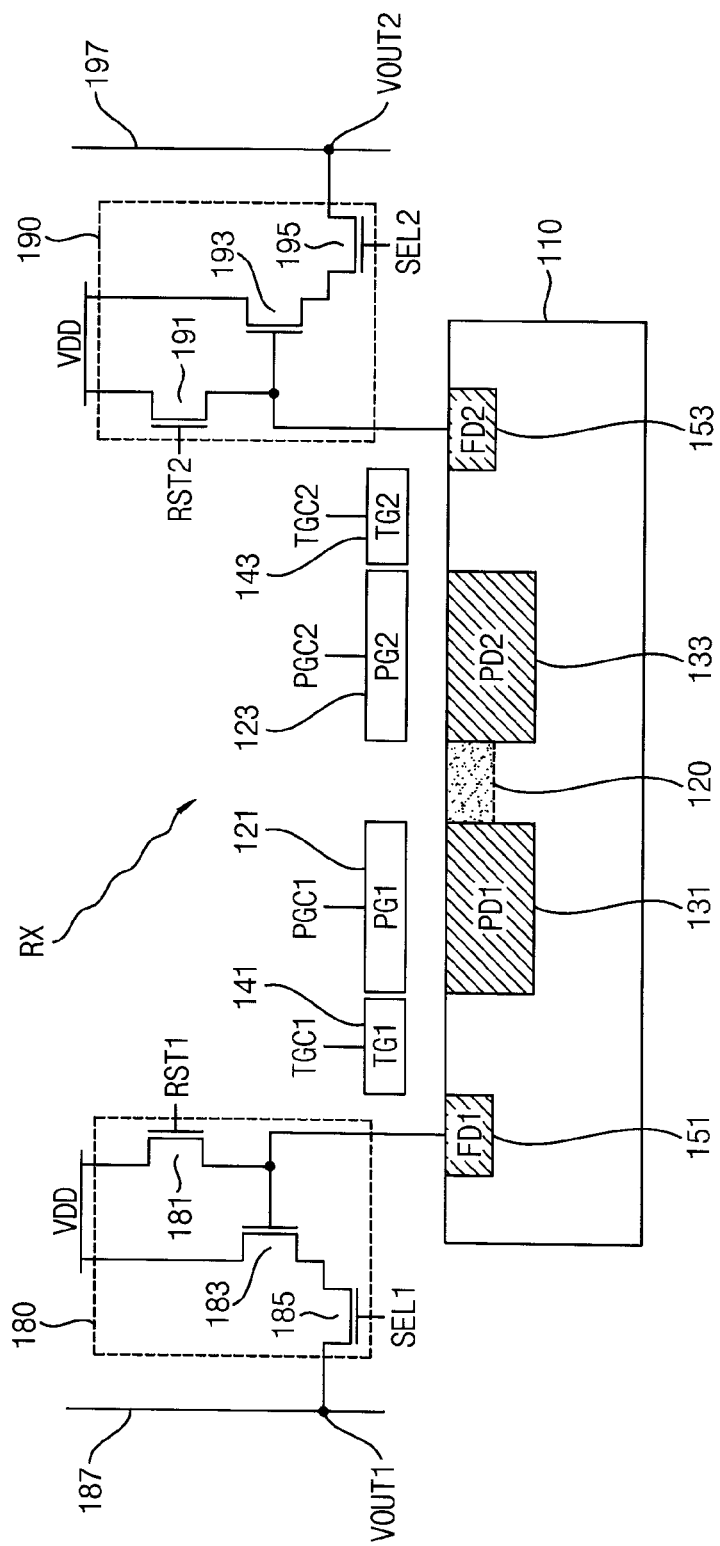
FIGS. 5A and 5B are views illustrating an example of a vertical structure of the depth pixel shown in FIG. 4.
Figure 5B:
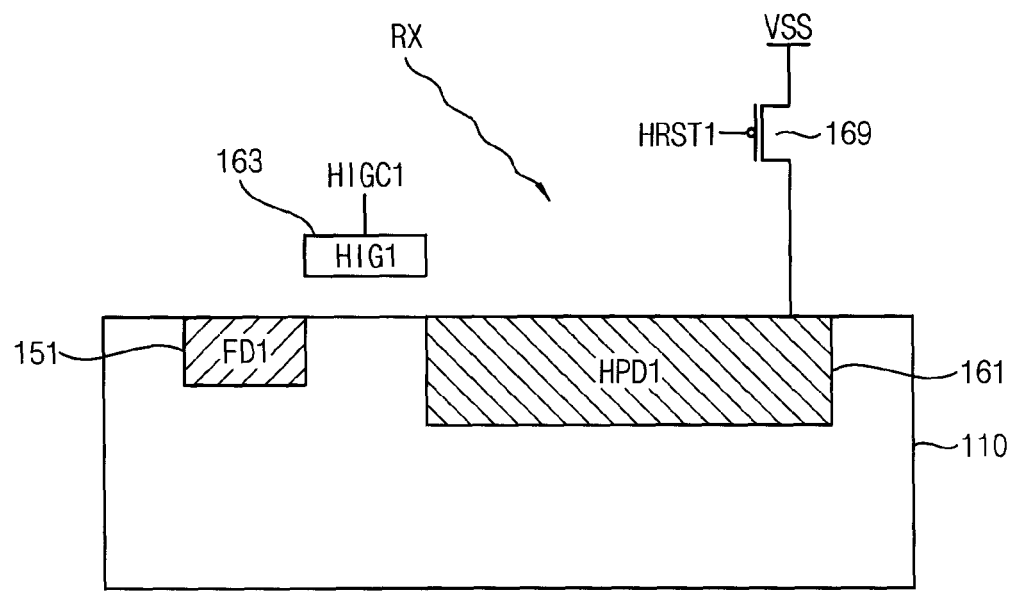

FIG. 4 is a plan view illustrating an example of the depth pixel shown in FIG. 1, FIG. 5A is a sectional view taken along line I-I' of FIG. 4, and FIG. 5B is a sectional view taken along line II-II' of FIG. 4. FIGS. 5A and 5B represent a vertical structure of the depth pixel shown in FIG. 4.

Referring to FIGS. 4, 5A and 5B, the depth pixel 100a includes a first photo gate 121, a first photo detection area 131, a first transmission gate 141, a first floating diffusion area 151 and a first compensation unit 160a. The depth pixel 100a may further include an output unit 180. In addition, the depth pixel 100a may further include a second photo gate 123, a second photo detection area 133, a second transmission gate 143, a second floating diffusion area 153, a second compensation unit 170a and a second output unit 190.

The depth pixel 100a may be formed by applying a CMOS process to the semiconductor substrate 100. For instance, the photo detection areas and the floating diffusion areas 151 and 153 may be formed in the semiconductor substrate 100 by implanting ions onto a top surface of the semiconductor substrate 100, and the photo gates 121 and 123 and the transmission gates 141 and 143 may be formed over the semiconductor substrate 100 through the deposition process or the etching process such that the photo gates 121 and 123 and the transmission gates 141 and 143 can be spaced apart from the semiconductor substrate 100. Although not shown in the drawings, an insulating layer, such as an oxide layer, may be interposed between the top surface of the semiconductor substrate 100 and the gates 121, 123, 141 and 143.

The first photo gate 121 may be turned on/off in response to a first photo control signal PGC1 and the first transmission gate 141 may be turned on/off in response to a first transmission control signal TGC1. The second photo gate 123 may be turned on/off in response to a second photo control signal PGC2 and the second transmission gate 143 may be turned on/off in response to a second transmission control signal TGC2. The first photo gate 121 may be disposed over the first photo detection area 131 and the first transmission gate 141 may be disposed between the first photo detection area 131 and the first floating diffusion area 151. The second photo gate 122 may be disposed over the second photo detection area 133 and the second transmission gate 143 may be disposed between the second photo detection area 133 and the second floating diffusion area 153.

The gates 121, 123, 141 and 143 may include polysilicon or transparent conducting oxide (TCO). For instance, the gates 121, 123, 141 and 143 may include indium tin oxide (ITO), indium zinc oxide (IZO), zinc oxide (ZnO), titanium dioxide ($TiO_2$) or a combination thereof.

As shown in FIGS. 5A and 5B, the received light RX may be incident into the depth pixel 100a from the top surface of the semiconductor substrate 110. In this case, the photo gates 121 and 123 may include a transparent conducting oxide. Meanwhile, in contrast FIGS. 5A and 5B, the received light RX may be incident into the depth pixel 100a from the bottom surface of the semiconductor substrate 110. In this case, the photo gates 121 and 123 may include an opaque conducting oxide.

The first photo detection area 131 may generate the first charges based on the received light RX reflected from the subject when the first photo gate 121 is turned on, and the first floating diffusion area 151 may accumulate the first charges generated from the first photo detection area 131 when the first transmission gate 141 is turned on. The second photo detection area 133 may generate third charges based on the received light RX when the second photo gate 123 is turned on, and the second floating diffusion area 153 may accumulate the third charges generated from the second photo detection area 133 when the second transmission gate 143 is turned on. The first charges have a polarity which is the same as that of the third charges.

The photo detection areas 131 and 133 and the floating diffusion areas 151 and 153 may be formed by doping impurities having a conductive type which is different from that of the semiconductor substrate 100. For instance, when the semiconductor substrate 110 is a p type semiconductor substrate, the photo detection areas 131 and 133 and the floating diffusion areas 151 and 153 may be formed by doping n type impurities. In this case, the first and third charges may be electrons of the electron-hole pairs. According to example embodiments, the photo detection areas 131 and 133 and the floating diffusion areas 151 and 153 may be formed by doping n type impurities at a concentration which is higher than a concentration of impurities in the semiconductor substrate 110, and the photo detection areas 131 and 133 may be implemented as photodiodes or pinned photodiodes.

The first output unit 180 may output an electric signal corresponding to the charges accumulated in the first floating diffusion area 151. The second output unit 190 may output an electric signal corresponding to the charges accumulated in the second floating diffusion area 153.

The first output unit 180 may include a first reset transistor 181, a first drive transistor 183 and a first select transistor 185. The first reset transistor 181 discharges the charges accumulated in the first floating diffusion area 151 in response to the first reset signal RST1 to initialize the first floating diffusion area 151 to the level of power supply VDD. The first drive transistor 183 may amplify the voltage of the first floating diffusion area 151. The first select transistor 185 may supply the voltage amplified by the first drive transistor 183 to a first output line 187 as a first output voltage VOUT1 in response to a first select signal SEL1.

The second output unit 190 may have a structure which is substantially the same as the structure of the first output unit 180. In detail, the second output unit 190 may include a second reset transistor 191, a second drive transistor 193 and a second select transistor 195. The second reset transistor 191 discharges the charges accumulated in the second floating diffusion area 153 in response to the second reset signal RST2 to initialize the second floating diffusion area 153 to the level of power supply VDD. The second drive transistor 193 may amplify the voltage of the second floating diffusion area 153. The second select transistor 195 may supply the voltage amplified by the second drive transistor 193 to a second output line 197 as a second output voltage VOUT2 in response to a second select signal SEL2.

The first compensation unit 160a may generate the second charges, which are different from the first charges, based on the ambient light components included in the received light RX and may supply the second charges to the first floating diffusion area 151. The second compensation unit 170a may generate the fourth charges, which are different from the third charges, based on the ambient light components and may supply the fourth charges to the second floating diffusion area 153. The fourth charges may have a polarity which is the same as that of the second charges.

The first compensation unit 160a may include a first ambient light detection area 161, a first injection gate 163 and a third reset transistor 169. The first ambient light detection area 161 may generate the second charges based on the ambient light components. The first injection gate 163 may be turned on/off in response to a first injection control signal HIGC1. When the first injection gate 163 is turned on, the second charges generated from the first ambient light detection area 161 may be injected into the first floating diffusion area 151. That is, the first ambient light detection area 161 may be electrically connected to the first floating diffusion area 151 in response to the first injection control signal HIGC1. At this time, the first ambient light detection area 161 and the first floating diffusion area 151 may be directly connected to each other through a channel formed over the semiconductor substrate 110 or may be indirectly connected to each other through a metal wire. The third reset transistor 169 discharges the charges accumulated in the first ambient light detection area 161 in response to a third reset signal HRST1 to initialize the first ambient light detection area 161 to the level of ground voltage VSS.

The second compensation unit 170*a* may have a structure which is substantially the same as the structure of the first compensation unit 160*a*. The second compensation unit 170*a* may include a second ambient light detection area 171, which generates the fourth charges based on the ambient light components, and a second injection gate 173 turned on/off in response to a second injection control signal HIGC2. When the second injection gate 173 is turned on, the fourth charges generated from the second ambient light detection area 171 may be injected into the second floating diffusion area 153. The second compensation unit 170*a* may include a fourth reset transistor 179 which discharges the charges accumulated in the second ambient light detection area 171 in response to a fourth reset signal HRST2 to initialize the second ambient light detection area 171 to the level of ground voltage VSS.

The ambient light detection areas 161 and 171 included in the compensation units 160*a* and 170*a* may be formed in the semiconductor substrate 110, and the injection gates 163 and 173 may be formed over the semiconductor substrate 110. The ambient light detection areas 161 and 171 may be formed by doping impurities having a conductive type which is the same as that of the semiconductor substrate 110. For instance, when the semiconductor substrate 110 is a p type semiconductor substrate, the ambient light detection areas 161 and 171 may be formed by doping p type impurities. In this case, the second and fourth charges may be holes of the electron-hole pairs.

In one example embodiment, the size of the first ambient light detection area 161 may be smaller than the size of the first photo detection area 131. Thus, the quantity of the second charges generated based on the ambient light components may be smaller than the quantity of the first charges generated based on the received light RX. Some of the first charges may be extinguished by combining with the second charges, and the first output voltage VOUT1 is generated based on the residual first charges so that degradation of the photo detection performance caused by the ambient light components may be inhibited. In the same way, the size of the second ambient light detection area 171 may be smaller than the size of the second photo detection area 133.

The depth pixel 100*a* may further include a channel stop area 120. The channel stop area 120 is formed in the semiconductor substrate 110 between the first photo detection area 131 and the second photo detection area 133 by doping impurities having a conductive type which is the same as that of the semiconductor substrate 110 at concentration which is higher than a concentration of impurities in the semiconductor substrate 110. The channel stop area 120 may block charges from being transmitted from the first photo detection area 131 to the second photo detection area 133, and/or from being transmitted from the second photo detection area 133 to the first photo detection area 131.

Meanwhile, the depth pixel 100*a* according to example embodiments may be divided into a main sensing block to generate/collect electrons based on the received light RX, and a compensation block to generate/collect holes based on the ambient light components. In this case, the main sensing block may include photo gates 121 and 123, photo detection areas 131 and 133, transmission gates 141 and 143, floating diffusion areas 151 and 153 and output units 180 and 190 and the compensation block may include first and second compensation units 160*a* and 170*a*. In addition, the depth pixel 100*a* according to example embodiments may be divided into two half pixels. In this case, the first half pixel may include the photo gate 121, the first photo detection areas 131, the first transmission gate 141, the first floating diffusion area 151, the first compensation unit 160*a*, and the first output unit 180, and the second half pixel may include the second photo gate 123, the second photo detection area 133, the second transmission gate 143, the second floating diffusion area 153, the second compensation unit 170*a* and the second output unit 190.

Although FIG. 4 illustrates a unit pixel in which each half pixel includes one output unit and the unit pixel includes one main sensing block and one compensation block, according to example embodiments, plural half pixels may share all or part of the output unit and plural main sensing blocks may share all or part of the compensation block.

Figure 6A:
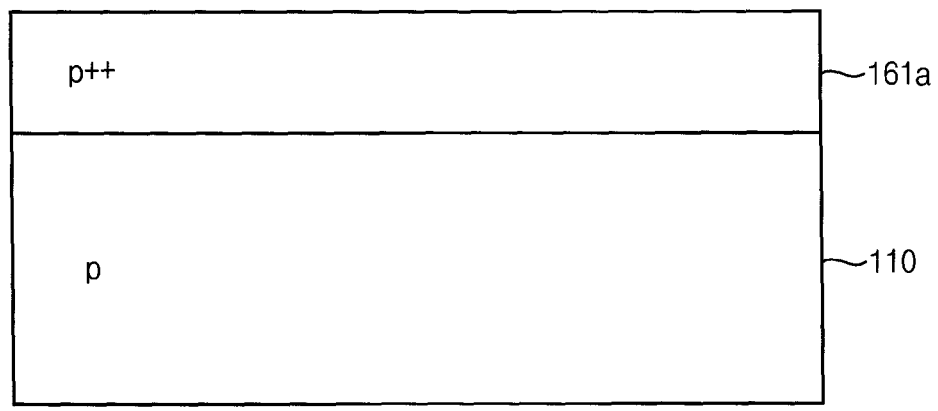
FIGS. 6A, 6B and 6C are views for reference in explaining the structure of an ambient light detection area included in a compensation unit of the depth pixel shown in FIG. 4.
Figure 6B:
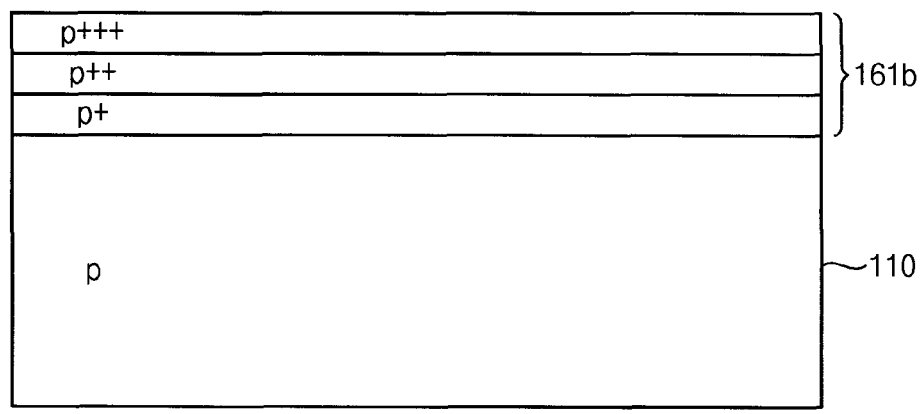
Figure 6C:
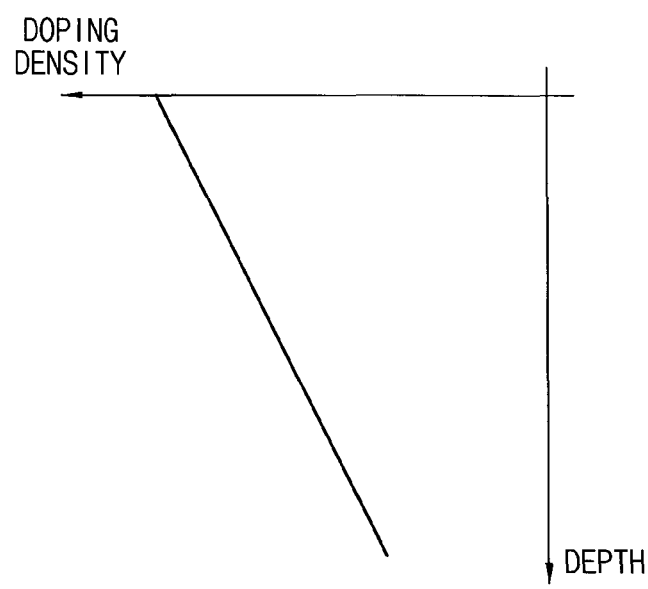

FIGS. 6A, 6B and 6C are views for describing structural examples of the ambient light detection area included in the compensation unit of the depth pixel shown in FIG. 4. FIGS. 6A and 6B are sectional views illustrating examples of a first ambient light detection area. FIG. 6C is a view illustrating a doping profile according to a depth of the first ambient light detection area.

Referring to FIG. 6A, the first ambient light detection area 161*a* is formed in the semiconductor substrate 110 by doping impurities having a conductive type which is the same as that of the semiconductor substrate 110 at concentration which is higher than a concentration of impurities in the semiconductor substrate 110. For instance, the semiconductor substrate 110 may be a p type semiconductor substrate and the first ambient light detection area 161*a* may be formed by doping p type impurities at concentration which is higher than a concentration of impurities in the semiconductor substrate 110.

Referring to FIG. 6B, the second ambient light detection area 161*b* is formed in the semiconductor substrate 110 by doping impurities having a conductive type which is the same as that of the semiconductor substrate 110 at concentration which is higher than a concentration of impurities in the semiconductor substrate 110. In this case, the doping concentration may gradually increase in a direction towards the first surface of the semiconductor substrate 110 (that is, a top surface of the semiconductor substrate 110 where gates are overlain) onto which the received light RX is incident. For instance, the semiconductor substrate 110 may be a p type semiconductor substrate and the second ambient light detection area 161*b* may be formed by doping p type impurities at concentration which is higher than a concentration of impurities in the semiconductor substrate 110, and such that the doping concentration gradually becomes higher in a direction towards the top surface of the semiconductor substrate 110. In this case, the first ambient light detection area may have the doping profile as shown in FIG. 6C in which the doping concentration is highest at the top surface and is gradually reduced from the top surface in proportion to depth.

The first ambient light detection area 161a shown in FIG. 6A and the second ambient light detection area 161b shown in FIG. 6B may generate/collect holes of the electron-hole pairs. Meanwhile, although not shown, the second ambient light detection area included in the second compensation unit may have a structure which is substantially the same as the structure of the first ambient light detection area.

Figure 7B:
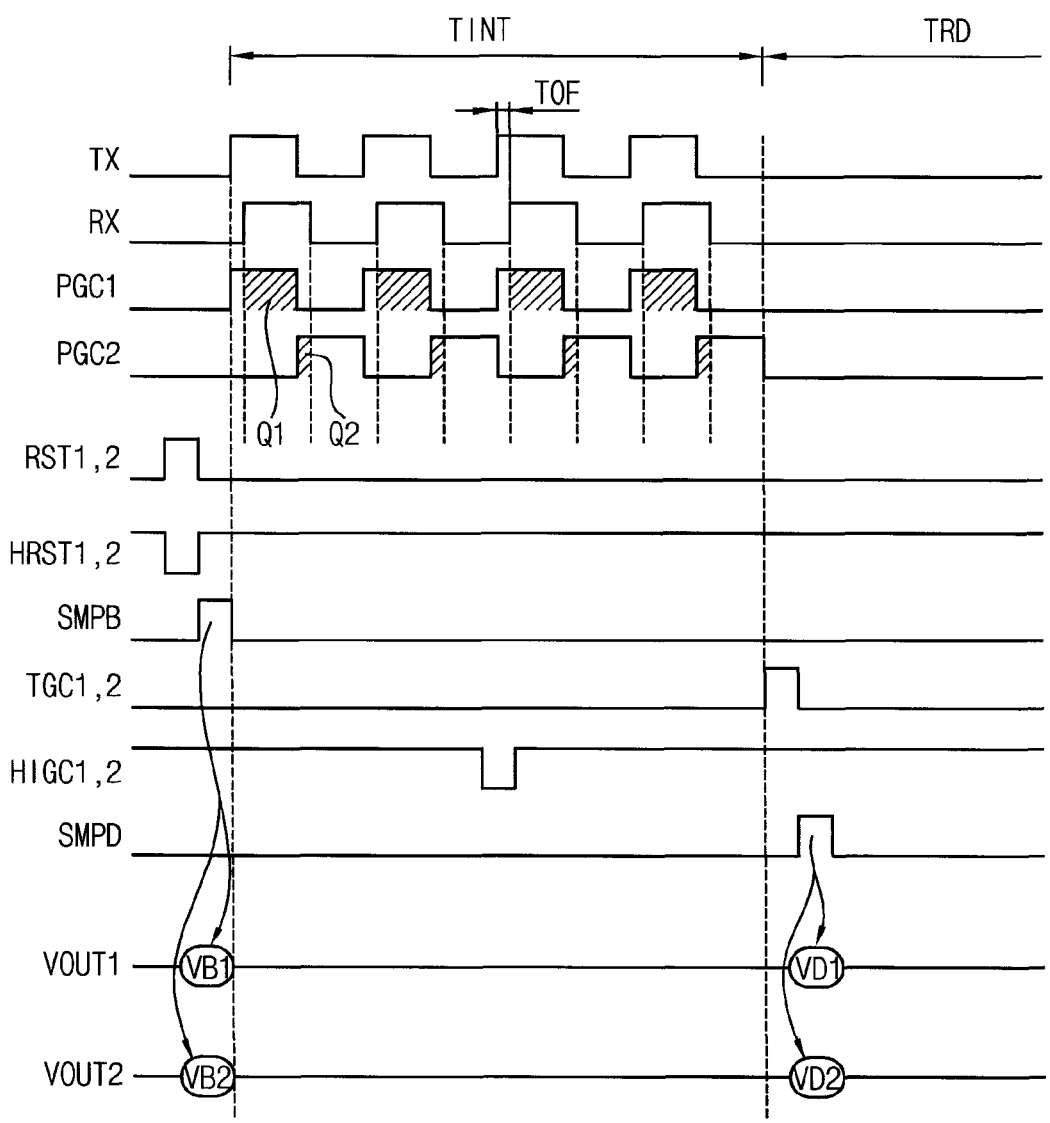

FIGS. 7A and 7B are timing charts for reference in describing operational examples of the depth pixel shown in FIG. 4. FIG. 7A illustrates an example embodiment in which the second and fourth charges (that is, holes) are generated and collected during the light collection period and injected into the floating diffusion area during the readout period. FIG. 7B illustrates an example embodiment in which the second and fourth charges (that is, holes) are generated and collected during the light collection period and injected into the floating diffusion area during the light collection period.

Referring to FIGS. 4, 5A, 5B and 7A, the depth pixel 100a activates first and second reset signals RST1 and RST2 before the light collection period TINT to initialize the floating diffusion areas 151 and 153 and activates third and fourth reset signals HRST1 and HRST2 to initialize the ambient light detection areas 161 and 171.

The transmission light TX illuminated onto the subject during the light collection period TINT is reflected from the subject and reaches the depth pixel 100a as the received light RX. The received light RX is delayed with respect to the transmission light TX by TOF (Time Of Flight).

The first and second photo control signals PGC1 and PGC2 having periodically variable intensity have a phase difference with respect to the transmission light TX during the light collection period TINT. For instance, as shown in FIG. 7A, the first photo control signal PGC1 may have the phase the same as that of the transmission light TX, and the second photo control signal PGC2 may have the phase which is opposite the phase of the transmission light TX (that is, a phase difference may be 180°). In detail, the first and second photo control signals PGC1 and PGC2 may periodically toggle between a first logic level and a second logic level during the light collection period and may have the first logic level during the readout period TRD.

Photo charges Q1 corresponding to the activation duration of the first photo control signal PGC1 are generated from the first photo detection area 151 and collected as the first charges, and photo charges Q2 corresponding to the activation duration of the second photo control signal PGC2 are generated from the second photo detection area 153 and collected as the second charges. Further, the second charges are generated from the first ambient light detection area 161 based on the ambient light components included in the received light RX and the fourth charges are generated from the second ambient light detection area 171.

As the readout period TRD starts, the first and second reset signals RST1 and RST2 are activated so that the floating diffusion areas 151 and 153 are initialized. After the floating diffusion areas 151 and 153 have been initialized, the first sampling control signal SMPB is activated so that the voltage of the first floating diffusion area 151, which is initialized to supply voltage VDD, is detected as a first noise voltage VB1 and the voltage of the second floating diffusion area 153, which is initialized to supply voltage VDD, is detected as a second noise voltage VB2. After the noise voltages VB1 and VB2 have been detected, first and second transmission control signals TGC1 and TGC2 are activated so that the first charges are transmitted to the first floating diffusion area 151 and the third charges are transmitted to the second floating diffusion area 153. At the same time, first and second injection control signals HIGC1 and HIGC2 are activated activated so that the second charges are injected into the first floating diffusion area 151 and the fourth charges are injected into the second floating diffusion area 153. After the charges have been accumulated/injected into the floating diffusion areas 151 and 153, the second sampling control signal SMPD is activated so that the voltage of the first floating diffusion area 151 corresponding to the sum of the first and second charges is detected as a first demodulated voltage VD1 and the voltage of the second floating diffusion area 153 corresponding to the sum of the third and fourth charges is detected as a second demodulated voltage VD2.

The effective voltages may be determined based on the detected noise voltages VB1 and VB2 and the detected demodulated voltages VD1 and VD2. In detail, the first effective voltage (V1=|VB1−VD1|) corresponding to the phase of the first photo control signal PGC1 may be determined based on the difference between the first noise voltage VB1 and the first demodulated voltage VD1, and the second effective voltage (V2=|VB2−VD2|) corresponding to the phase of the second photo control signal PGC2 may be determined based on the difference between the second noise voltage VB2 and the second demodulated voltage VD2. For instance, if the phase difference between the first photo control signal PGC1 and the transmission light TX is P1 and the phase difference between the second photo control signal PGC2 and the transmission light TX is P2, the phase of the transmission light TX can be calculated based on a weighted average, such as (P1V1+P2V2)/(V1+V2), so that the distance to the subject can be calculated.

Referring to FIGS. 4, 5A, 5B and 7B, the depth pixel 100a activates first and second reset signals RST1 and RST2 before the light collection period TINT to initialize the floating diffusion areas 151 and 153, and activates third and fourth reset signals HRST1 and HRST2 to initialize the ambient light detection areas 161 and 171. After the floating diffusion areas 151 and 153 have been initialized, the first sampling signal SMPB is activated so that the voltages of the floating diffusion areas 151 and 153, which are initialized to the supply voltage VDD, are detected as the first and second noise voltages VB1 and VB2.

Photo charges Q1 and Q2 corresponding to the activation duration of the first and second photo control signals PGC1 and PGC2 are generated from the first and second photo detection areas 151 and 153 and collected as the first and third charges by the received light RX reaching the depth pixel 100a during the light collection period TINT. Further, the second and fourth charges are generated from the first and second ambient light detection areas 161 and 171 based on the ambient light components.

In addition, the first and second injection control signals HIGC1 and HIGC2 are activated during the light collection period TINT so that the second and fourth charges are injected into the first and second photo detection areas 131 and 133, respectively. Although FIG. 7A illustrates that the injection control signals HIGC1 and HIGC2 are activated once during the light collection period TINT, according to example embodiments, the injection control signals HIGC1 and HIGC2 may be activated several times during the light collection period TINT. In this case, the second and fourth charges may be injected into the first and second photo detection areas 131 and 133 several times.

As the readout period TRD starts, the first and second transmission control signals TGC1 and TGC2 are activated so that the first and third charges are transmitted to the floating diffusion areas 151 and 153, respectively. After the charges are accumulated in the floating diffusion areas 151 and 153, the second sampling control signal SMPB is activated so that the voltage of the first floating diffusion area 151 corresponding to the sum of the first and second charges is detected as the first demodulated voltage VD1 and the voltage of the second floating diffusion area 153 corresponding to the sum of the third and fourth charges is detected as the second demodulated voltage VD2. The effective voltages may be determined based on the detected noise voltages VB1 and VB2 and the detected demodulated voltages VD1 and VD2.

Figure 8:
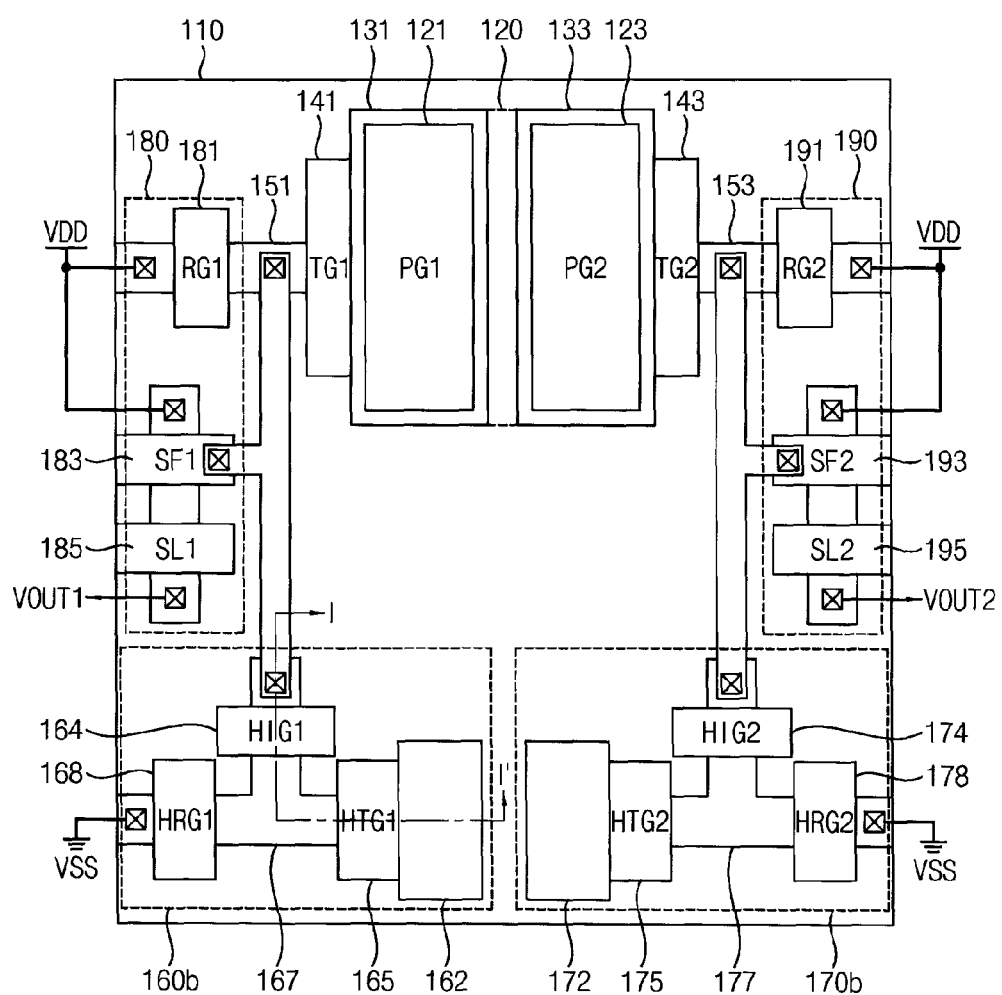
FIG. 8 is a plan view illustrating a depth pixel shown in FIG. 1 according to another example embodiment.
Figure 9:
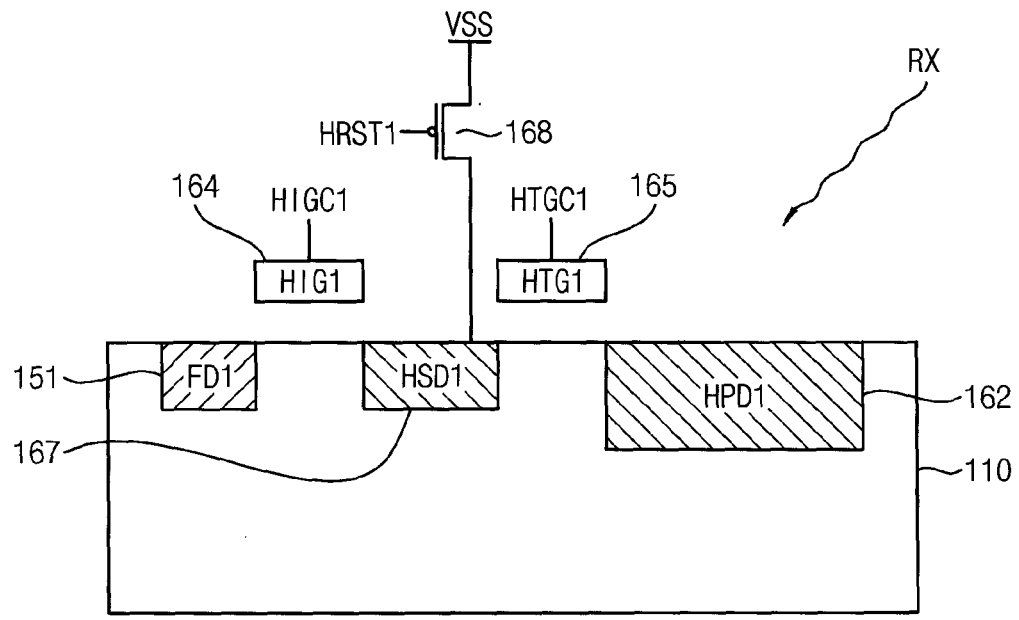
FIG. 9 is a view illustrating an example of a vertical structure of the depth pixel shown in FIG. 8.

FIG. 8 is a plan view illustrating a depth pixel shown in FIG. 1 according to another example embodiment. FIG. 9 is a sectional view taken along line I-I' of FIG. 8 and represents a vertical structure of the depth pixel shown in FIG. 8.

Referring to FIGS. 8 and 9, the depth pixel 100b includes a first photo gate 121, a first photo detection area 131, a first transmission gate 141, a first floating diffusion area 151 and a first compensation unit 160b. The depth pixel 100b may further include an output unit 180. In addition, the depth pixel 100b may further include a second photo gate 123, a second photo detection area 133, a second transmission gate 143, a second floating diffusion area 153, a second compensation unit 170b, a second output unit 190 and a channel stop area 120.

The depth pixel 100b of FIG. 8 may be substantially the same as the depth pixel 100a of FIG. 4, except for the configuration of the compensation units 160b and 170b. That is, the main sensing block of the depth pixel 100b shown in FIG. 8 may have a configuration which is substantially the same as the configuration of the main sensing block of the depth pixel 100a shown in FIG. 4.

The first compensation unit 160b may generate the second charges, which are different from the first charges, based on the ambient light components, and may supply the second charges to the first floating diffusion area 151. The second compensation unit 170b may generate the fourth charges, which are different from the third charges, based on the ambient light components, and may supply the fourth charges to the second floating diffusion area 153.

The first compensation unit 160b may include a first ambient light detection area 162, a first injection gate 164, a third transmission gate 165, a first storage area 167 and a third reset transistor 168. The first ambient light detection area 162 may generate the second charges based on the ambient light components. The third transmission gate 165 may be turned on/off in response to a third transmission control signal HTGC1. The first storage area 167 may store the second charges generated from the first ambient light detection area 162 when the third transmission gate 165 is turned on. That is, the first ambient light detection area 162 may be electrically connected to the first storage area 167 in response to the third transmission control signal HTGC1. At this time, the first ambient light detection area 162 and the first storage area 167 may be connected to each other through a channel formed over the semiconductor substrate 110. The first injection gate 164 may be turned on/off in response to the first injection control signal HIGC1. When first injection gate 164 is turned on after the third transmission gate 165 is turned on, the charge stored in the first storage area 167 may be injected into the first floating diffusion area 151. That is, the first storage area 167 may be electrically connected to the first floating diffusion area 151 in response to the first injection control signal HIGC1. At this time, the first storage area 167 and the first floating diffusion area 151 may be directly connected to each other through a channel formed over the semiconductor substrate 110 or may be indirectly connected to each other through a metal wire. The third reset transistor 168 discharges the charges accumulated in the storage area 167 in response to the third reset signal HRST1 to initialize the first storage area 167 to the level of ground voltage VSS.

The second compensation unit 170b may have a structure which is substantially the same as the structure of the first compensation unit 160b. The second compensation unit 170b may include a second ambient light detection area 172, which generates the fourth charges based on the ambient light components, a fourth injection gate 175 turned on/off in response to a fourth transmission control signal HTGC2, a second storage area 177 to store the fourth charges generated from the second ambient light detection area 172 when the fourth transmission gate 175 is turned on and a second injection gate 174 turned on/off in response to the second injection control signal HIGC2. When second injection gate 174 is turned on after the fourth transmission gate 175 is turned on, the fourth charges stored in the second storage area 177 may be injected into the second floating diffusion area 153. The second compensation unit 170b may include a fourth reset transistor 178 which discharges the charges accumulated in the second storage area 177 in response to the fourth reset signal HRST2 to initialize the second storage area 177 to the level of ground voltage VSS.

The ambient light detection areas 162 and 172 and the storage areas 167 and 177 included in the compensation units 160b and 170b may be formed in the semiconductor substrate 110, and the transmission gates 165 and 175 and the injection gates 164 and 174 may be formed over the semiconductor substrate 110. The ambient light detection areas 162 and 172 and the storage areas 167 and 177 may be formed by doping impurities having a conductive type which is the same as that of the semiconductor substrate 110 (for instance, p type impurities). In one example embodiment, a size of the ambient light detection areas 162 and 172 may be smaller than a size of the photo detection areas 131 and 133.

Figure 10A:
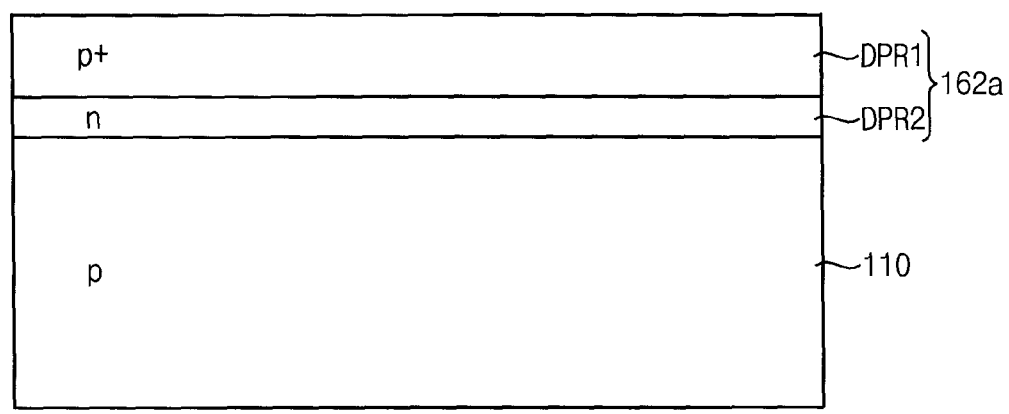
FIGS. 10A and 10B are views for reference in explaining the structure of an ambient light detection area included in a compensation unit of the depth pixel shown in FIG. 8.
Figure 10B:
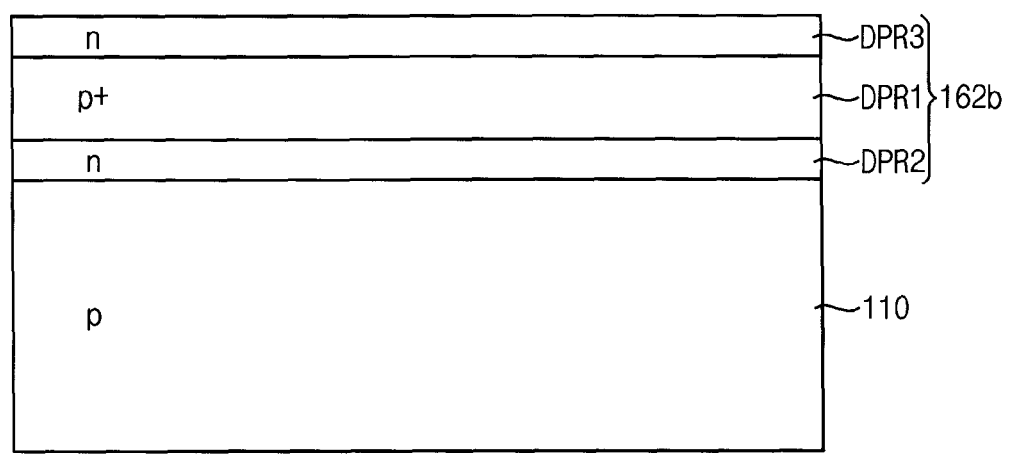

FIGS. 10A and 10B are views for describing structural examples the ambient light detection area included in the compensation unit of the depth pixel shown in FIG. 8. FIGS. 10A and 10B are sectional views illustrating examples of the first ambient light detection area shown in FIG. 8.

Referring to FIG. 10A, the first ambient light detection area 162a may be implemented as a photo diode. The ambient light detection area 162a may include a first impurity area DPR1 and a second impurity area DPR2. The first impurity area DPR1 is formed in the semiconductor substrate 110 by doping first impurities having a conductive type which is the same as that of the semiconductor substrate 110 at concentration which is higher than a concentration of impurities in the semiconductor substrate 110. The second impurity area DPR2 is formed under the first impurity area DPR1 in the semiconductor substrate 110 by doping second impurities having a conductive type which is different from that of the first impurities. For instance, the first impurities may be p type impurities and the second impurities may be n type impurities. The semiconductor substrate 110 may be a p type semiconductor substrate, the first impurity area DPR1 may be doped with p type impurities at concentration which is higher than a concentration of impurities in the semiconductor substrate 110, and the second impurity area DPR2 may be doped with n type impurities.

Referring to FIG. 10B, the first ambient light detection area 162b may be implemented as a pinned photo diode. The ambient light detection area 162b may include a first impurity area DPR1, a second impurity area DPR2 and a third impurity area DPR3. The first impurity area DPR1 and the second impurity area DPR2 are substantially the same as the first impurity area DPR1 and the second impurity area DPR2 of FIG. 10A. The third impurity area DPR3 is formed over the first impurity area DPR1 in the semiconductor substrate 110 by doping the second impurities. For instance, the semiconductor substrate 110 may be a p type semiconductor substrate, the first impurity area DPR1 may be doped with p type impurities at concentration which is higher than a concentration of impurities in the semiconductor substrate 110, and the second and third impurity areas DPR2 and DPR3 may be doped with the n type impurities.

The first ambient light detection area 162a shown in FIG. 10A and the first ambient light detection area 162b shown in FIG. 10B may generate/collect holes of the electron-hole pairs. Meanwhile, although not illustrated in the drawing, the second ambient light detection area included in the second compensation unit may have a structure which is substantially the same as the structure of the first ambient light detection area.

Figure 11A:
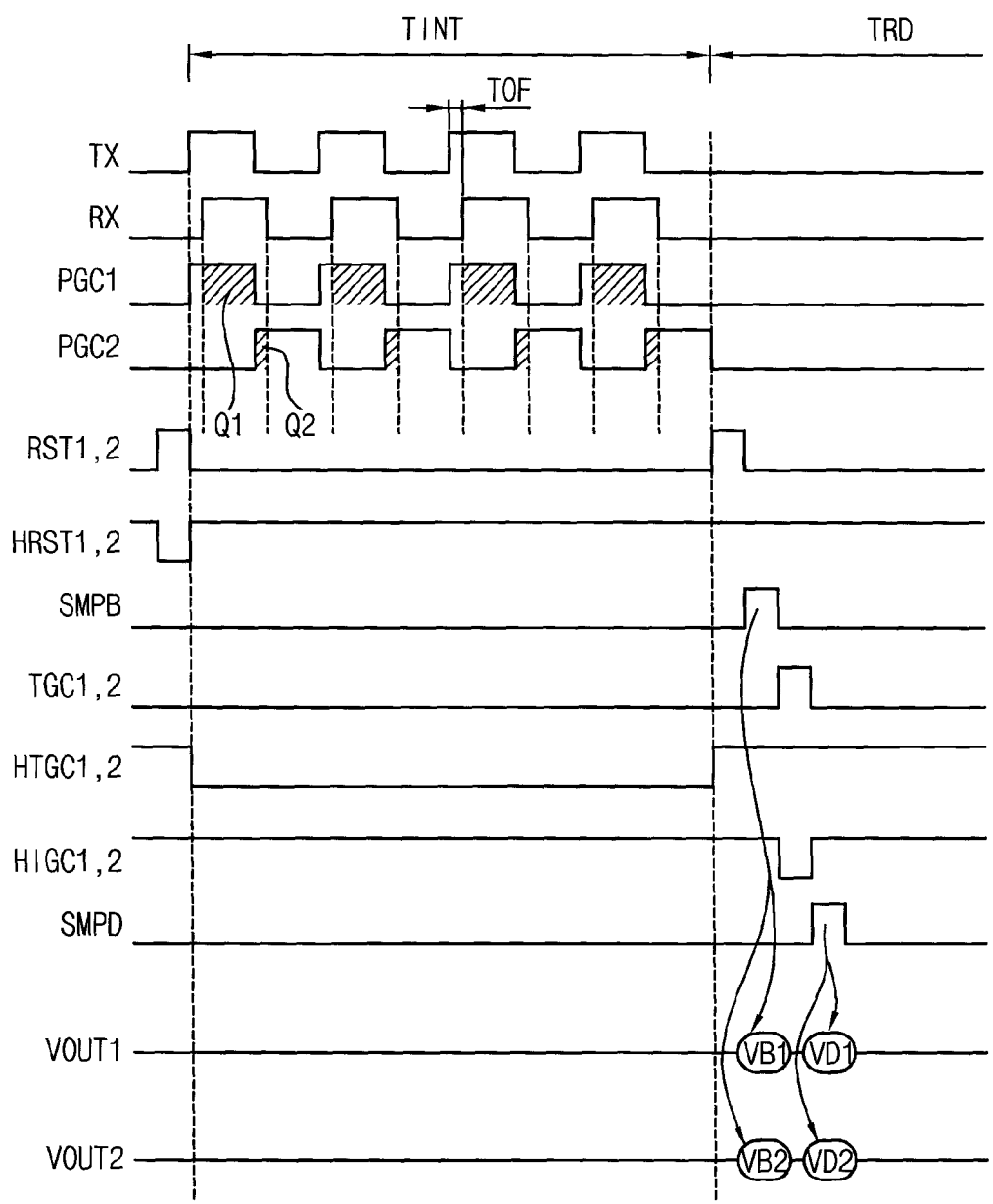

FIGS. 11A and 11B are timing charts for reference in describing operational examples of the depth pixel shown in FIG. 8. FIG. 11A illustrates an example embodiment in which the second and fourth charges (that is, holes) are generated and collected during the light collection period and injected into the floating diffusion area during the readout period. FIG. 11B illustrates an example embodiment in which the second and fourth charges (that is, holes) are generated and collected during the light collection period and injected into the floating diffusion area during the light collection period.

Referring to FIGS. 8, 9 and 11A, the depth pixel 100b activates reset signals RST1, RST2, HRST1 and HRST2 before the light collection period TINT to initialize the floating diffusion areas 151 and 153 and the storage areas 167 and 177.

The first and third charges are generated from the photo detection areas 131 and 133, respectively, by the received light RX reaching the depth pixel 100b during the light collection period TINT. Further, the second and fourth charges are generated from the ambient light detection areas 162 and 172 based on the ambient light components.

In addition, the third and fourth transmission control signals HTGC1 and HTGC2 are activated during the light collection period TINT so that the second and fourth charges are stored in the storage areas 167 and 177, respectively. Although FIG. 11A illustrates that the third and fourth transmission control signals HTGC1 and HTGC2 are kept in the activated state during the light collection period TINT, according to example embodiments, the third and fourth transmission control signals HTGC1 and HTGC2 may be kept in the activated state only for a partial duration of the light collection period TINT.

As the readout period TRD starts, the first and second reset signals RST1 and RST2 are activated so that the floating diffusion areas 151 and 153 are initialized. Then, the first sampling control signal SMPB is activated so that the voltages of the floating diffusion areas 151 and 153, which are initialized to supply voltage VDD, are detected as noise voltages VB1 and VB2. Then, the first and second transmission control signals TGC1 and TGC2 are activated so that the first and third charges are transmitted to the first and third floating diffusion area 151 and 153, respectively. At the same time, the first and second injection control signals HIGC1 and HIGC2 are activated so that the second and fourth charges are injected into the floating diffusion areas 151 and 153, respectively. Then, the second sampling control signal SMPD is activated so that the voltage of the first floating diffusion area 151 corresponding to the sum of the first and second charges and the voltage of the second floating diffusion area 153 corresponding to the sum of the third and fourth charges are detected as the demodulated voltages VD1 and VD2, respectively. The effective voltages may be determined based on the detected voltages VB1, VB2, VD1 and VD2.

Referring to FIGS. 8, 9 and 11B, the depth pixel 100b activates reset signals RST1, RST2, HRST1 and HRST2 before the light collection period TINT to initialize the floating diffusion areas 151 and 153 and the storage areas 167 and 177, and activates the first sampling signal SMPB so that the voltages of the floating diffusion areas 151 and 153, which are initialized to the supply voltage VDD, are detected as the noise voltages VB1 and VB2, respectively.

The first and third charges are generated from the photo detection areas 131 and 133, respectively, by the received light RX reaching the depth pixel 100b during the light collection period TINT. Further, the second and fourth charges are generated from the ambient light detection areas 162 and 172 based on the ambient light components.

In addition, the third and fourth transmission control signals HTGC1 and HTGC2 are activated during a partial duration of the light collection period TINT so that the second and fourth charges are stored in the storage areas 167 and 177, respectively. After the third and fourth transmission control signals HTGC1 and HTGC2 are activated, the injection control signals HIGC1 and HIGC2 are activated so that the second and fourth charges are injected into the floating diffusion areas 151 and 153, respectively.

As the readout period TRD starts, the first and second transmission control signals TGC1 and TGC2 are activated so that the first and third charges are transmitted to the floating diffusion areas 151 and 153, respectively. Then, the second sampling control signal SMPB is activated so that the voltage of the first floating diffusion area 151 corresponding to the sum of the first and second charges is detected as the first demodulated voltage VD1 and the voltage of the second floating diffusion area 153 corresponding to the sum of the third and fourth charges is detected as the second demodulated voltage VD2. The effective voltages may be determined based on the detected voltages VB1, VB2, VD1 and VD2.

Figure 12:
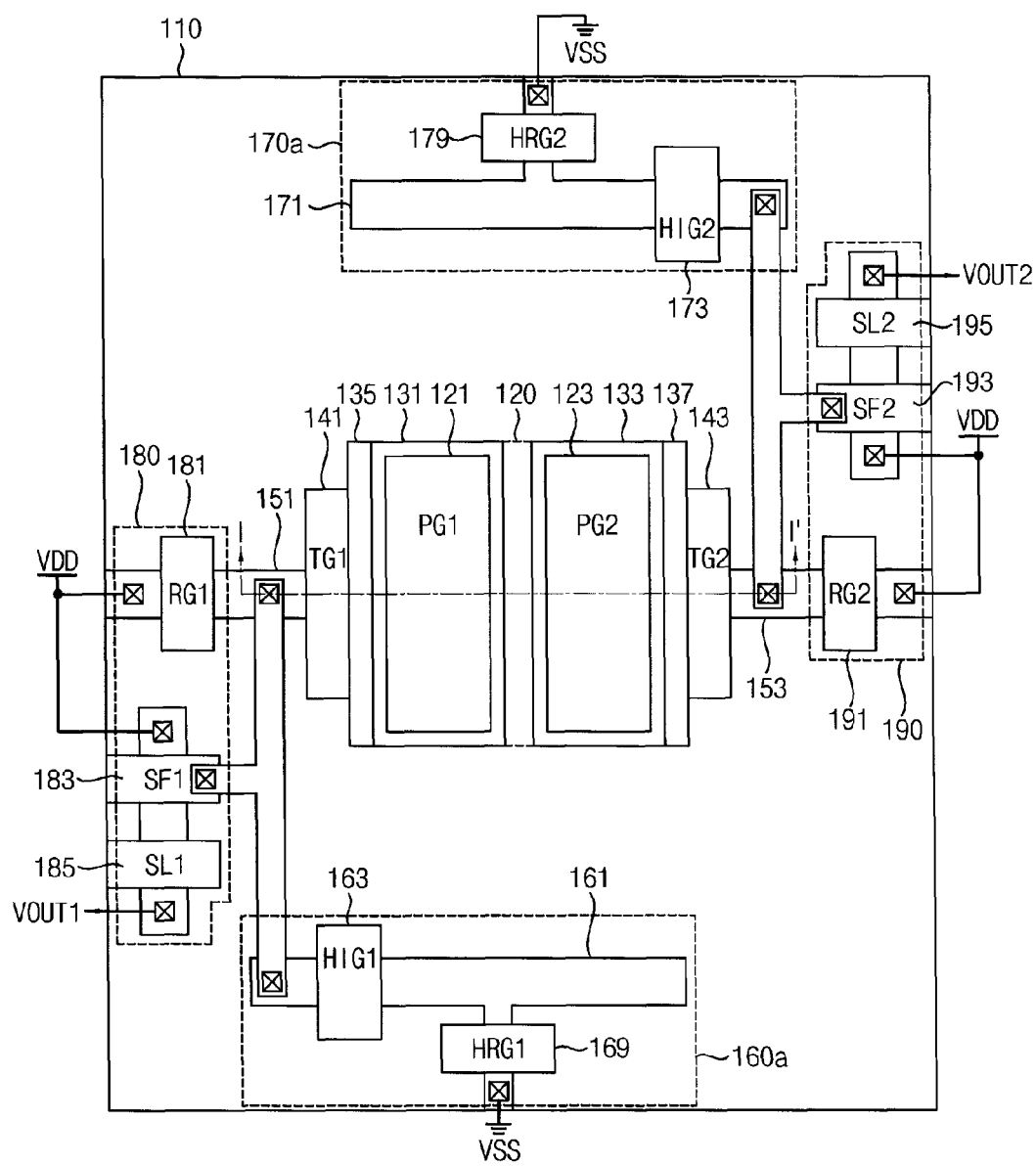
FIG. 12 is a plan view illustrating the depth pixel shown in FIG. 1 according to still another example embodiment.
Figure 13:
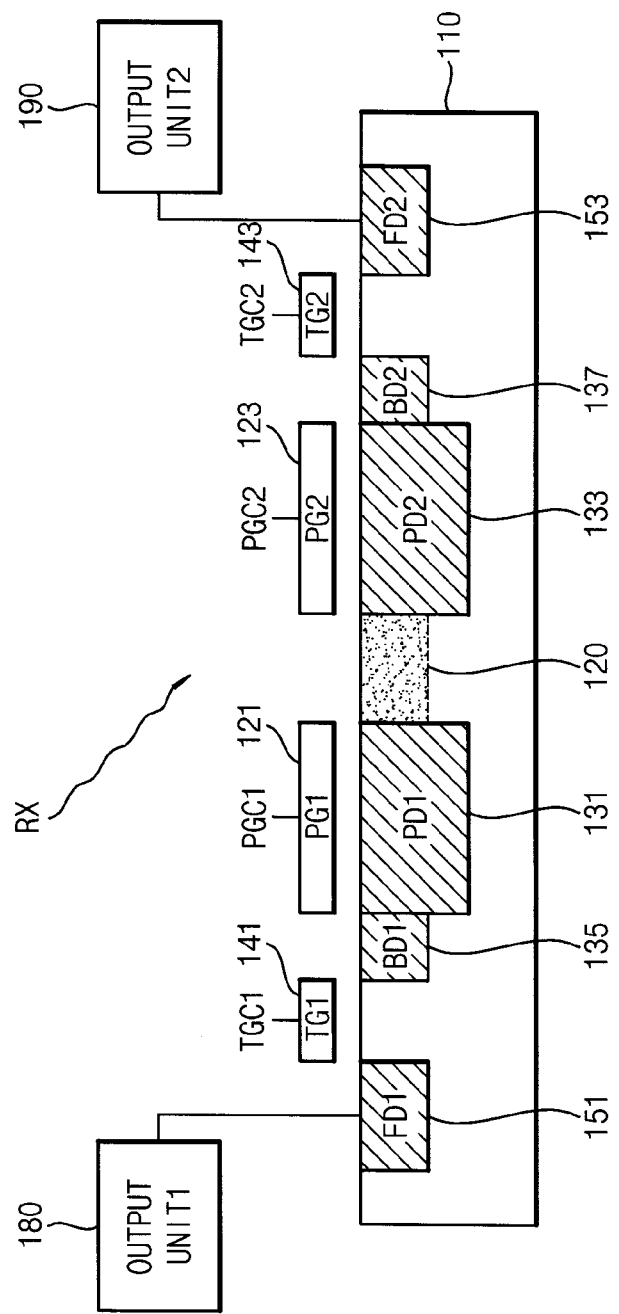
FIG. 13 is a view illustrating an example of a vertical structure of the depth pixel shown in FIG. 12.

FIG. 12 is a plan view illustrating the depth pixel shown in FIG. 1 according to still another example embodiment. FIG. 13 is a sectional view taken along line I-I' of FIG. 12 and represents a vertical structure of the depth pixel shown in FIG. 12.

Referring to FIGS. 12 and 13, the depth pixel 100c includes a first photo gate 121, a first photo detection area 131, a first bridge diffusion area 135, a first transmission gate 141, a first floating diffusion area 151, a first compensation unit 160a, a first output unit 180, a second photo gate 123, a second photo detection area 133, a second bridge diffusion area 137, a second transmission gate 143, a second floating diffusion area 153, a second compensation unit 170a and a second output unit 190. The depth pixel 100c may further include a channel stop area 120.

The depth pixel 100c of FIG. 12 may be substantially the same as the depth pixel 100a of FIG. 4, except that the depth pixel 100c further includes the bridge diffusion areas 135 and 137 serving as temporal storage areas. The depth pixel 100c of FIG. 12 may operate in a manner similar to the example embodiment of FIG. 7A or 7B, except that the first and third charges are temporally stored in the bridge diffusion areas 135 and 137, respectively, instead of the photo detection areas 131 and 133.

The first bridge diffusion area 135 may be formed adjacent to the first photo detection area 131. The first photo gate 121 may be formed over the first photo detection area 131 to store the first charges generated from the first photo detection area 131 in the first bridge diffusion area 135 in response to the first photo control signal PGC1. The first bridge diffusion area 135 is electrically connected to the first floating diffusion area 151 in response to the first transmission control signal TGC1 applied to the first transmission gate 141 so that the first charges may be transmitted from the first bridge diffusion area 135 to the first floating diffusion area 151.

The second bridge diffusion area 137 may be formed adjacent to the second photo detection area 133. The second photo gate 123 may be formed over the second photo detection area 133 to store the third charges generated from the second photo detection area 133 in the second bridge diffusion area 137 in response to the second photo control signal PGC2. The second bridge diffusion area 137 is electrically connected to the second floating diffusion area 153 in response to the second transmission control signal TGC2 applied to the second transmission gate 143 so that the third charges may be transmitted from the second bridge diffusion area 137 to the second floating diffusion area 153.

The bridge diffusion areas 135 and 137 may be formed in the semiconductor substrate 110. Similar to the photo detection areas 131 and 133 and the floating diffusion areas 151 and 153, the bridge diffusion areas 135 and 137 may be formed by doping impurities having a conductive type opposite to that of the semiconductor 110.

Figure 14:
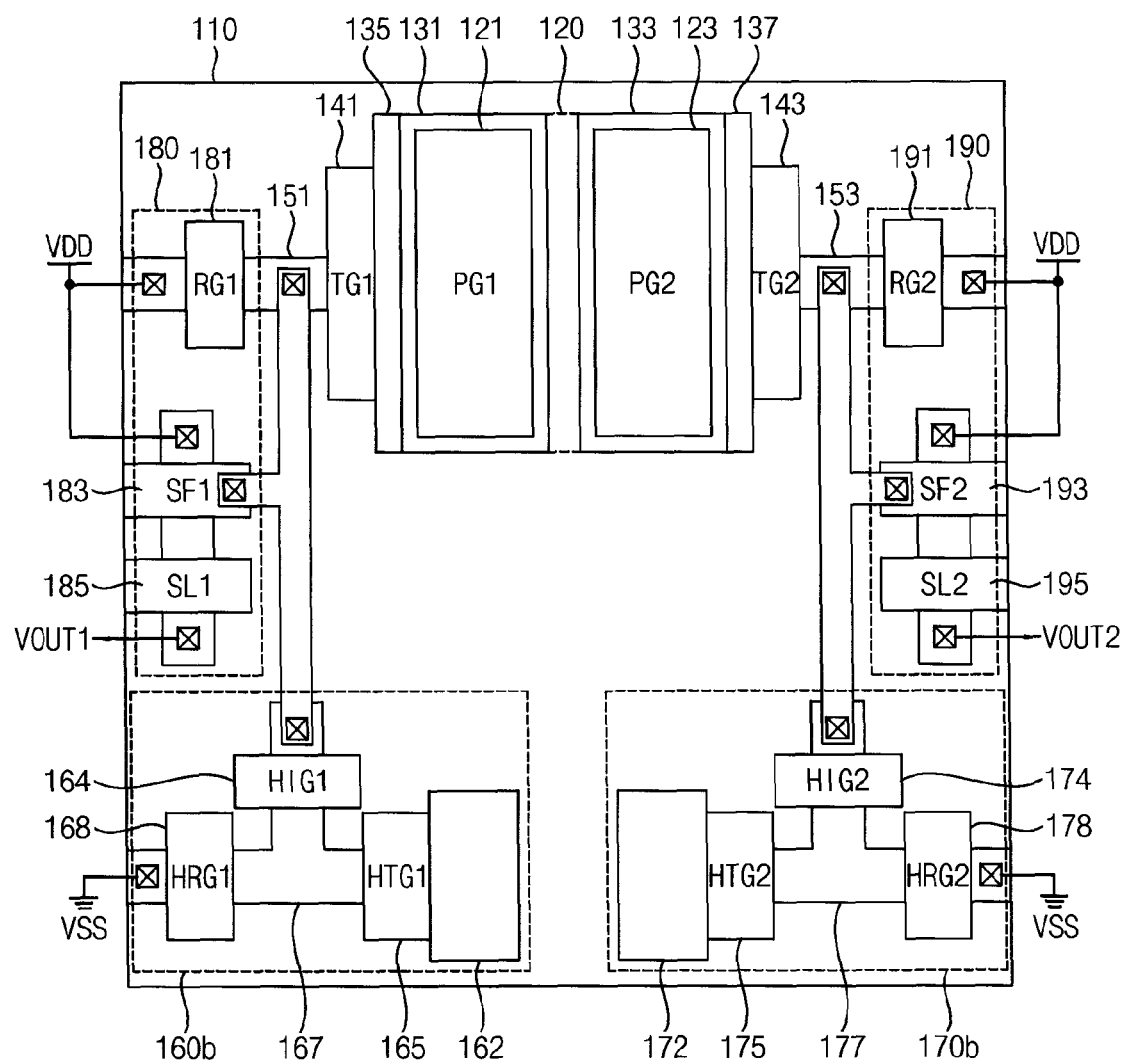
FIG. 14 is a plan view illustrating the depth pixel shown in FIG. 1 according to still yet another example embodiment.

FIG. 14 is a plan view illustrating the depth pixel shown in FIG. 1 according to still yet another example embodiment.

Referring to FIG. 14, the depth pixel 100d includes a first photo gate 121, a first photo detection area 131, a first bridge diffusion area 135, a first transmission gate 141, a first floating diffusion area 151, a first compensation unit 160b, a first output unit 180, a second photo gate 123, a second photo detection area 133, a second bridge diffusion area 137, a second transmission gate 143, a second floating diffusion area 153, a second compensation unit 170b and a second output unit 190. The depth pixel 100d may further include a channel stop area 120.

The depth pixel 100d of FIG. 14 may be substantially the same as the depth pixel 100b of FIG. 8, except that the depth pixel 100d further includes the bridge diffusion areas 135 and 137 serving as temporal storage areas. The depth pixel 100d of FIG. 14 may operate in a manner similar to the example embodiment of FIG. 11A or 11B, except that the first and third charges are temporally stored in the bridge diffusion areas 135 and 137, respectively, instead of the photo detection areas 131 and 133. The bridge diffusion areas 135 and 137 may have configurations which are substantially the same as configurations of the bridge diffusion areas 135 and 137 shown in FIG. 12.

Figure 15:
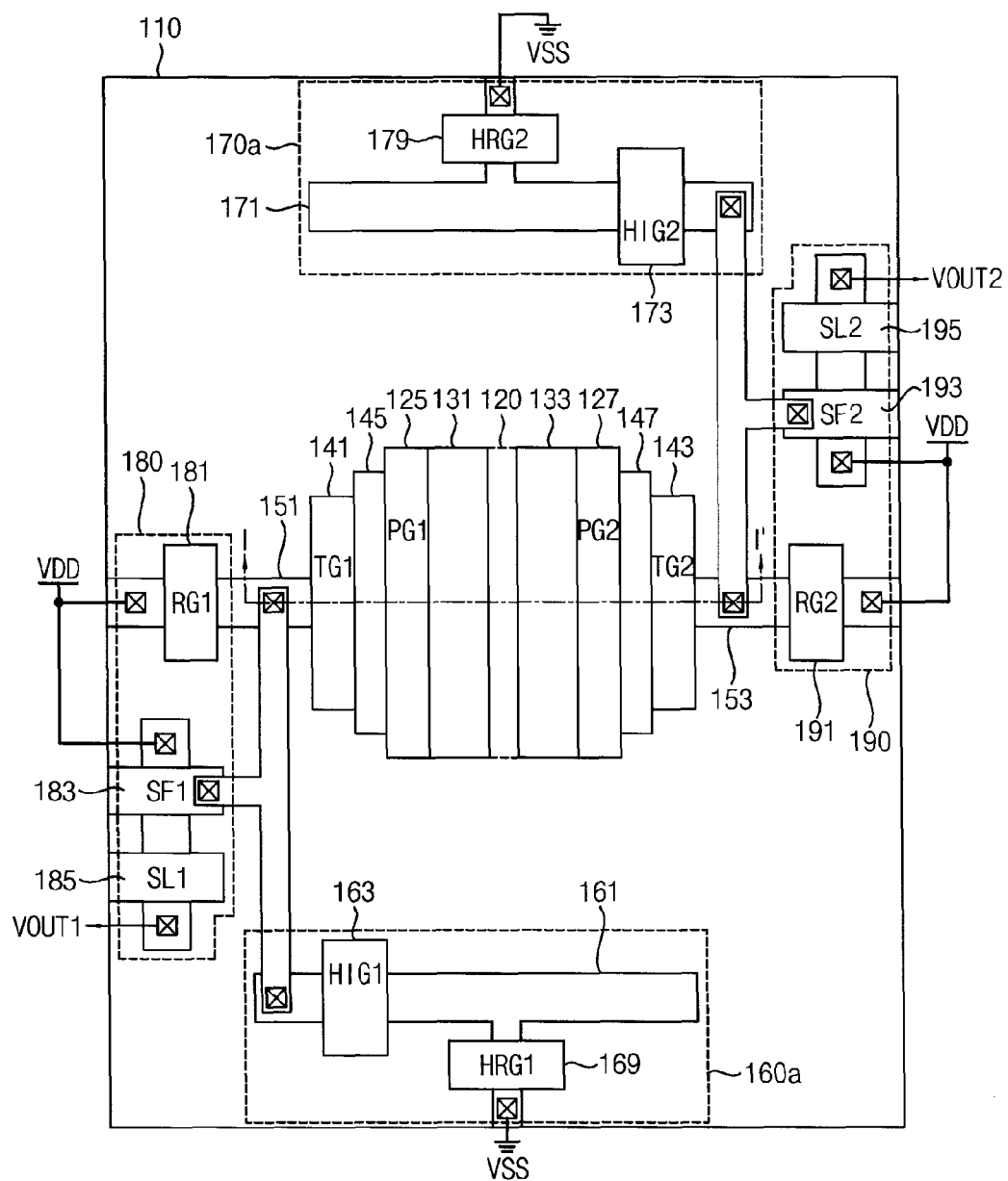
FIG. 15 is a plan view illustrating the depth pixel shown in FIG. 1 according to still yet another example embodiment.
Figure 16:
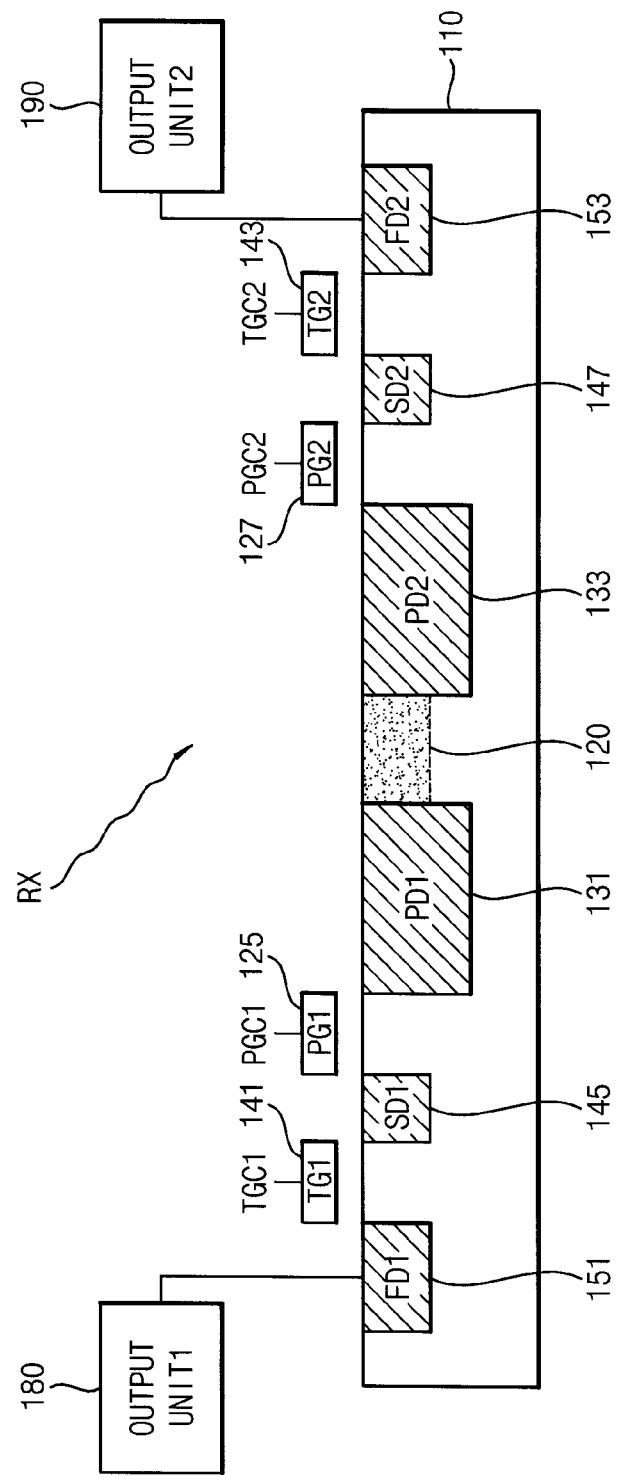
FIG. 16 is a view illustrating an example of a vertical structure of the depth pixel shown in FIG. 15.

FIG. 15 is a plan view illustrating the depth pixel shown in FIG. 1 according to still yet another example embodiment. FIG. 16 is a sectional view taken along line I-I' of FIG. 15 and represents a vertical structure of the depth pixel shown in FIG. 15.

Referring to FIGS. 15 and 16, the depth pixel 100e includes a first photo gate 125, a first photo detection area 131, a first storage area 145, a first transmission gate 141, a first floating diffusion area 151, a first compensation unit 160a, a first output unit 180, a second photo gate 127, a second photo detection area 133, a second storage area 147, a second transmission gate 143, a second floating diffusion area 153, a second compensation unit 170a and a second output unit 190. The depth pixel 100e may further include a channel stop area 120.

The depth pixel 100e of FIG. 15 may be substantially the same as the depth pixel 100a of FIG. 4, except that the configurations of the photo gates 125 and 127 are changed and the depth pixel 100e further includes the storage areas 145 and 147 serving as temporal storage areas. The depth pixel 100e of FIG. 15 may operate in a manner similar to the example embodiment of FIG. 7A or 7B, except that the first and third charges are temporally stored in the storage areas 145 and 147, respectively, instead of the photo detection areas 131 and 133.

The first storage area 145 may be spaced apart from the first photo detection area 131. The first photo gate 125 may be formed over the semiconductor substrate 110 between the first photo detection area 131 and the first storage area 145 to store the first charges generated from the first photo detection area 131 in the first storage area 145 in response to the first photo control signal PGC1. That is, the photo charges corresponding to the phase of the first photo control signal PGC1 applied to the first photo gate 125 may be collected as the first charges and stored in the first storage area 145. The first storage area 145 is electrically connected to the first floating diffusion area 151 in response to the first transmission control signal TGC1 applied to the first transmission gate 141 so that the first charges may be transmitted from the first storage area 145 to the first floating diffusion area 151.

The second storage area 147 may be spaced apart from the second photo detection area 133. The second photo gate 127 may be formed over the semiconductor substrate 110 between the second photo detection area 133 and the second storage area 147 to store the third charges generated from the second photo detection area 133 in the second storage area 147 in response to the second photo control signal PGC2. The second storage area 147 is electrically connected to the second floating diffusion area 153 in response to the second transmission control signal TGC2 applied to the second transmission gate 143 so that the third charges may be transmitted from the second storage area 147 to the second floating diffusion area 153.

The storage areas 145 and 147 may be formed in the semiconductor substrate 110. Similar to the photo detection areas 131 and 133 and the floating diffusion areas 151 and 153, the storage areas 145 and 147 may be formed by doping impurities having a conductive type opposite to that of the semiconductor 110.

Figure 17:
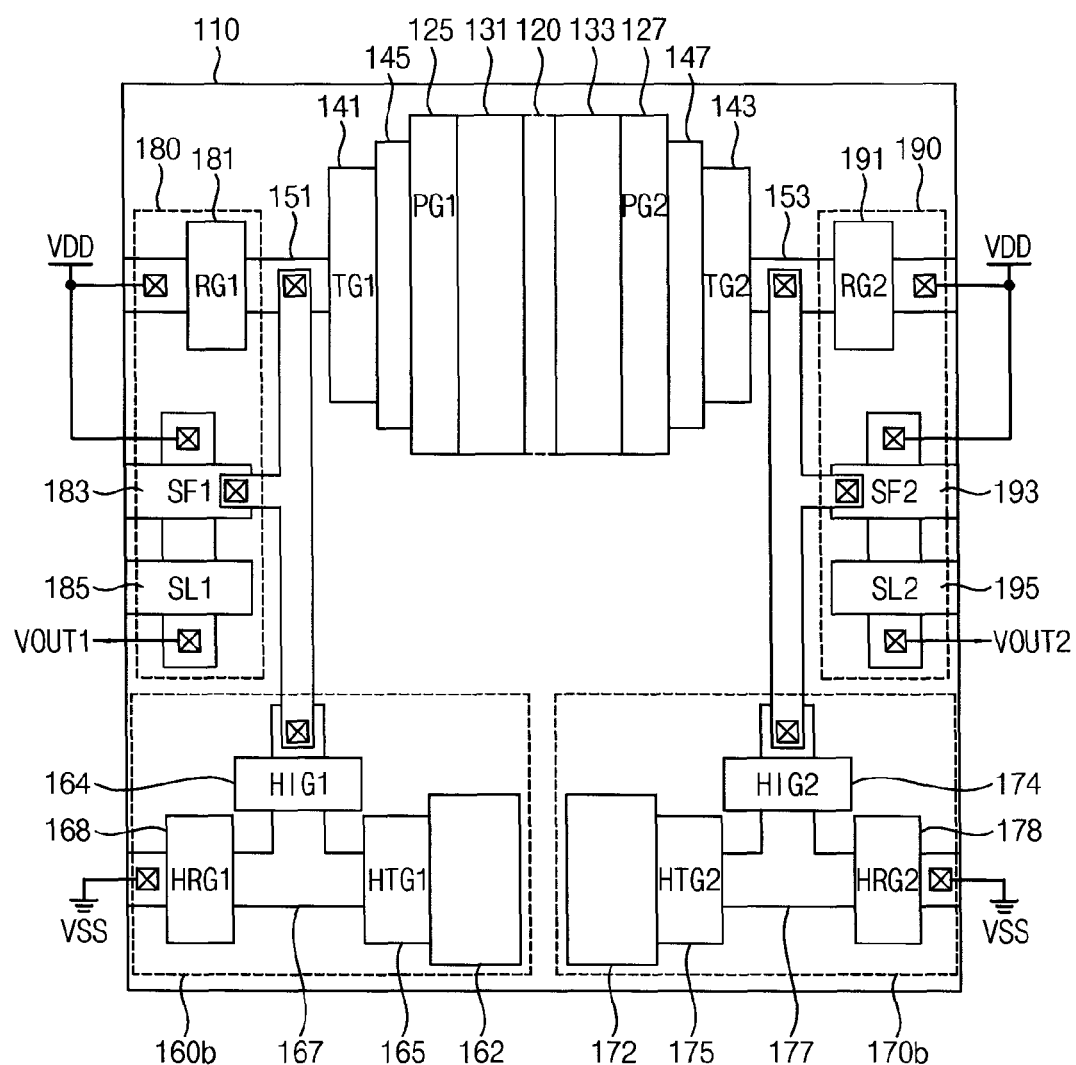
FIG. 17 is a plan view illustrating the depth pixel shown in FIG. 1 according to still yet another example embodiment.

FIG. 17 is a plan view illustrating the depth pixel shown in FIG. 1 according to still yet another example embodiment.

Referring to FIG. 17, the depth pixel 100f includes a first photo gate 125, a first photo detection area 131, a first storage area 145, a first transmission gate 141, a first floating diffusion area 151, a first compensation unit 160b, a first output unit 180, a second photo gate 127, a second photo detection area 133, a second storage area 147, a second transmission gate 143, a second floating diffusion area 153, a second compensation unit 170b and a second output unit 190. The depth pixel 100f may further include a channel stop area 120.

The depth pixel 100f of FIG. 17 may be substantially the same as the depth pixel 100b of FIG. 8, except that the configurations of the photo gates 125 and 127 are changed and the depth pixel 100f further includes the storage areas 145 and 147 serving as temporal storage areas. The depth pixel 100f of FIG. 17 may operate in a manner similar to the example embodiment of FIG. 11A or 11B, except that the first and third charges are temporally stored in the storage areas 145 and 147, respectively, instead of the photo detection areas 131 and 133. The photo gates 125 and 127 and the storage areas 145 and 147 may have configurations which are substantially the same as configurations of the photo gates 125 and 127 and the storage areas 145 and 147 shown in FIG. 15.

Figure 18:
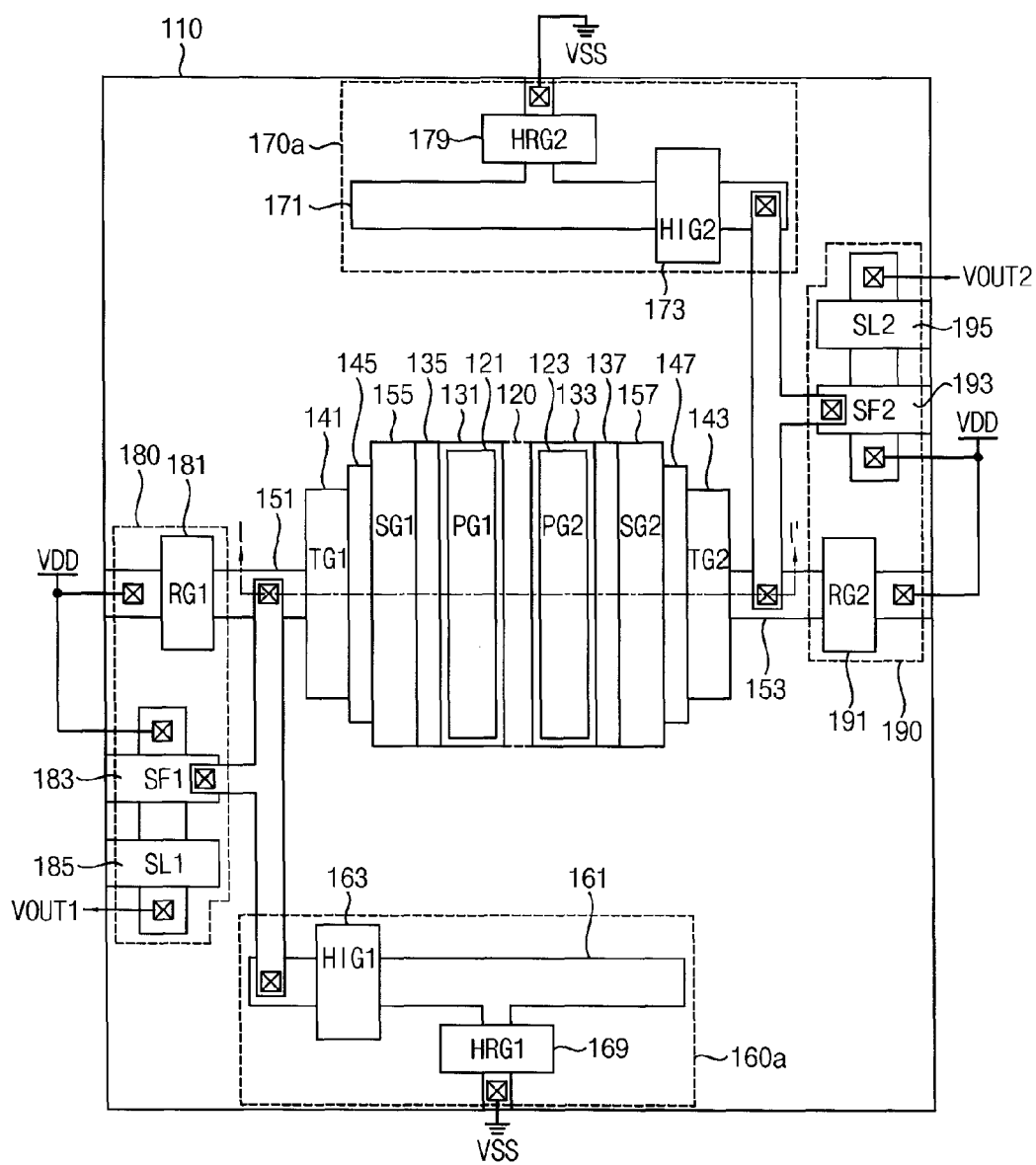
FIG. 18 is a plan view illustrating the depth pixel shown in FIG. 1 according to still yet another example embodiment.
Figure 19:
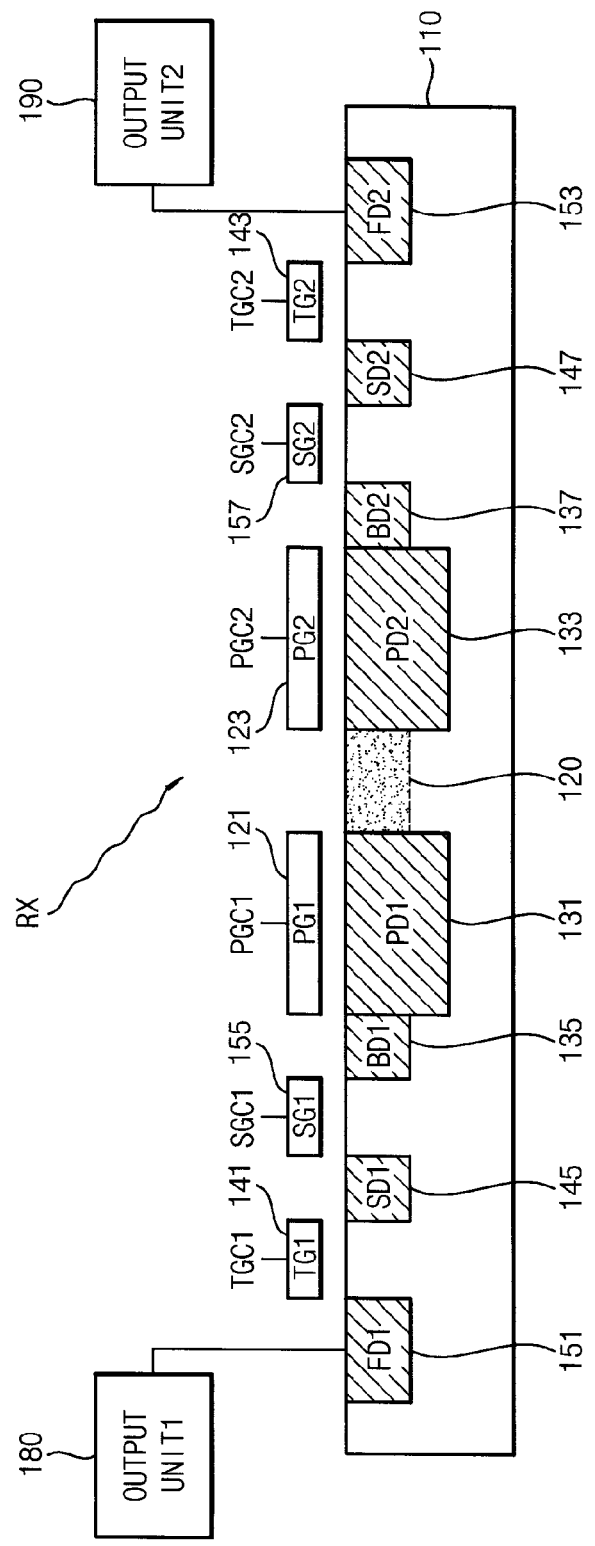
FIG. 19 is a view illustrating an example of a vertical structure of the depth pixel shown in FIG. 18.

FIG. 18 is a plan view illustrating the depth pixel shown in FIG. 1 according to still yet another example embodiment. FIG. 19 is a sectional view taken along line I-I' of FIG. 18 and represents a vertical structure of the depth pixel shown in FIG. 18.

Referring to FIGS. 18 and 19, the depth pixel 100g includes a first photo gate 121, a first photo detection area 131, a first bridge diffusion area 135, a first storage gate 155, a first storage area 145, a first transmission gate 141, a first floating diffusion area 151, a first compensation unit 160a, a first output unit 180, a second photo gate 123, a second photo detection area 133, a second bridge diffusion area 137, a second storage gate 157, a second storage area 147, a second transmission gate 143, a second floating diffusion area 153, a second compensation unit 170a and a second output unit 190. The depth pixel 100g may further include a channel stop area 120.

The depth pixel 100g of FIG. 18 may be substantially the same as the depth pixel 100a of FIG. 4, except that the depth pixel 100g further includes the bridge diffusion areas 135 and 137 and the storage areas 145 and 147, which serve as temporal storage areas, and the storage gates 155 and 157.

The first and second bridge diffusion areas 135 and 137 may be formed adjacent to the first and second photo detection areas 131 and 133, respectively. The first and second storage areas 145 and 147 may be spaced apart from the first and second bridge diffusion areas 135 and 137, respectively. The first and second photo gates 121 and 123 may be formed over the first and second photo detection areas 131 and 133, respectively, to store the first and third charges generated from the first and second photo detection areas 131 and 133 in the first and second bridge diffusion areas 135 and 137, respectively, in response to the first and second photo control signals PGC1 and PGC2, respectively.

The first and second storage gates 155 and 157 may be formed over the semiconductor substrate 110 between the first and second bridge diffusion areas 135 and 137 and the first and second storage areas 145 and 147, respectively. The first and second bridge diffusion areas 135 and 135 are electrically connected to the first and second storage areas 145 and 147 in response to first and second storage control signals SGC1 and SGC2 applied to the first and second storage gates 155 and 157, respectively, so that the first and third charges may be transmitted from the first and second bridge diffusion areas 135 and 137 to the first and second storage areas 145 and 147, respectively.

The first and second transmission gates 141 and 143 may be formed over the semiconductor substrate 110 between the first and second storage areas 145 and 147 and the first and second floating diffusion areas 151 and 153, respectively. The first and second storage areas 145 and 147 are electrically connected to the first and second floating diffusion areas 151 and 153 in response to first and second transmission control signals TGC1 and TGC2 applied to the first and second transmission gates 141 and 143, respectively, so that the first and third charges may be transmitted from the first and second storage areas 145 and 147 to the first and second floating diffusion areas 151 and 153, respectively.

Figure 20B:
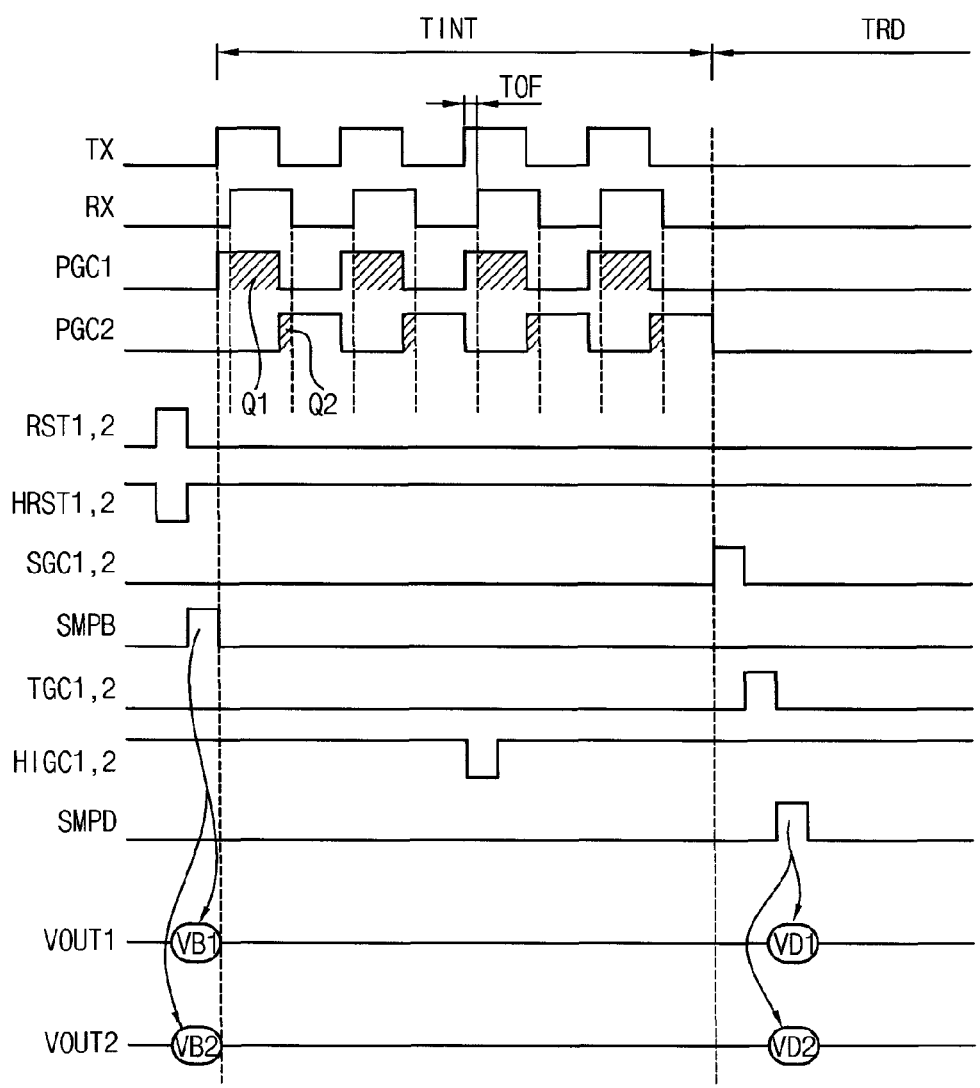

FIGS. 20A and 20B are timing charts for reference in describing operational examples of the depth pixel shown in FIG. 18. FIG. 20A illustrates an example embodiment in which the second and fourth charges (that is, holes) are injected into the floating diffusion area during the readout period, and FIG. 20B illustrates an example embodiment in which the second and fourth charges (that is, holes) are injected into the floating diffusion area during the light collection period.

Referring to FIGS. 18, 19, and 20A, an operation the depth pixel 100g before and during the light collection period TINT may be substantially the same as the operation of the example embodiment shown in FIG. 7A.

As the readout period TRD starts, the first and second reset signals RST1 and RST2 are activated so that the floating diffusion areas 151 and 153 are initialized. Then, the storage control signals SGC1 and SGC2 are activated so that the first and third charges are transmitted to the storage areas 145 and 147, respectively. After that, the first sampling control signal SMPB is activated so that the voltages of the first and second floating diffusion areas 151 and 153, which are initialized to supply voltage VDD, are detected as the noise voltages VB1 and VB2. Then, the transmission control signals TGC1 and TGC2 are activated so that the first and third charges are transmitted to the first and second floating diffusion areas 151 and 153, respectively. At the same time, injection control signals HIGC1 and HIGC2 are activated so that the second and fourth charges are injected into the first and second floating diffusion areas 151 and 153, respectively. Then, the second sampling control signal SMPD is activated so that the voltages of the first and second floating diffusion areas 151 and 153 corresponding to the sum of the first and second charges and the sum of the third and fourth charges are detected as the demodulated voltages VD1 and VD2. The effective voltages may be determined based on the detected voltages VB1, VB2, VD1 and VD2.

Referring to FIGS. 18, 19, and 20B, an operation the depth pixel 100g before and during the light collection period TINT may be substantially the same as the operation of the example embodiment shown in FIG. 7B.

As the readout period TRD starts, the storage control signals SGC1 and SGC2 are activated so that the first and third charges are transmitted to the floating diffusion areas 151 and 153, respectively. Then, the transmission control signals TGC1 and TGC2 are activated so that the first and third charges are transmitted to the first and second floating diffusion areas 151 and 153, respectively. In addition, the second sampling control signal SMPD is activated so that the voltages of the first and second floating diffusion areas 151 and 153 corresponding to the sum of the first and second charges and the sum of the third and fourth charges are detected as the demodulated voltages VD1 and VD2. The effective voltages may be determined based on the detected voltages VB1, VB2, VD1 and VD2.

Figure 21:
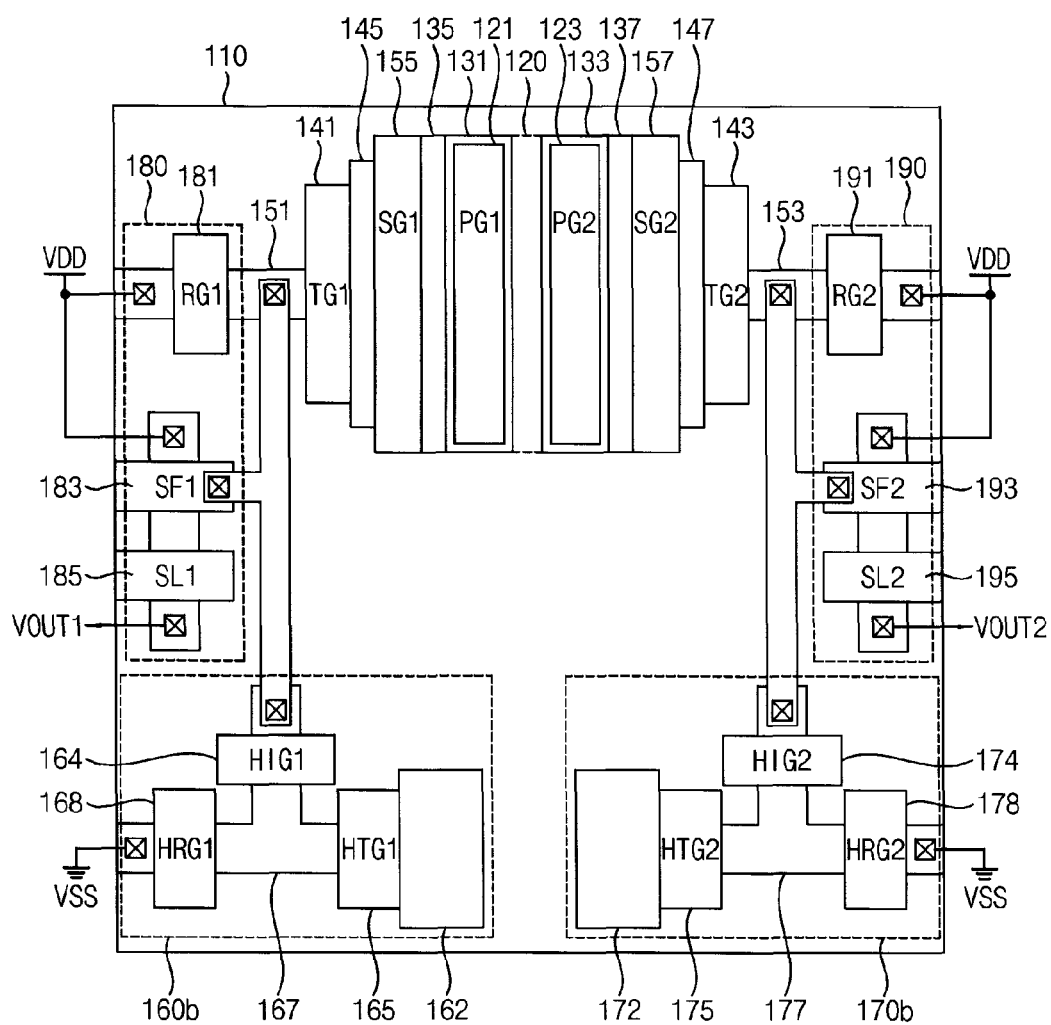
FIG. 21 is a plan view illustrating the depth pixel shown in FIG. 1 according to still yet another example embodiment.

FIG. 21 is a plan view illustrating the depth pixel shown in FIG. 1 according to still yet another example embodiment.

Referring to FIG. 21, the depth pixel 100h includes a first photo gate 121, a first photo detection area 131, a first bridge diffusion area 135, a first storage gate 155, a first storage area 145, a first transmission gate 141, a first floating diffusion area 151, a first compensation unit 160b, a first output unit 180, a second photo gate 123, a second photo detection area 133, a second bridge diffusion area 137, a second storage gate 157, a second storage area 147, a second transmission gate 143, a second floating diffusion area 153, a second compensation unit 170b and a second output unit 190. The depth pixel 100h may further include a channel stop area 120.

The depth pixel 100h of FIG. 21 may be substantially the same as the depth pixel 100a of FIG. 8, except that the depth pixel 100h further includes the bridge diffusion areas 135 and 137 and the storage areas 145 and 147, which serve as temporal storage areas, and the storage gates 155 and 157. The bridge diffusion areas 135 and 137, the storage areas 145 and 147 and the storage gates 155 and 157 may have configurations which are substantially the same as configurations of the bridge diffusion areas 135 and 137, the storage areas 145 and 147 and the storage gates 155 and 157 shown in FIG. 18.

Figure 22A:
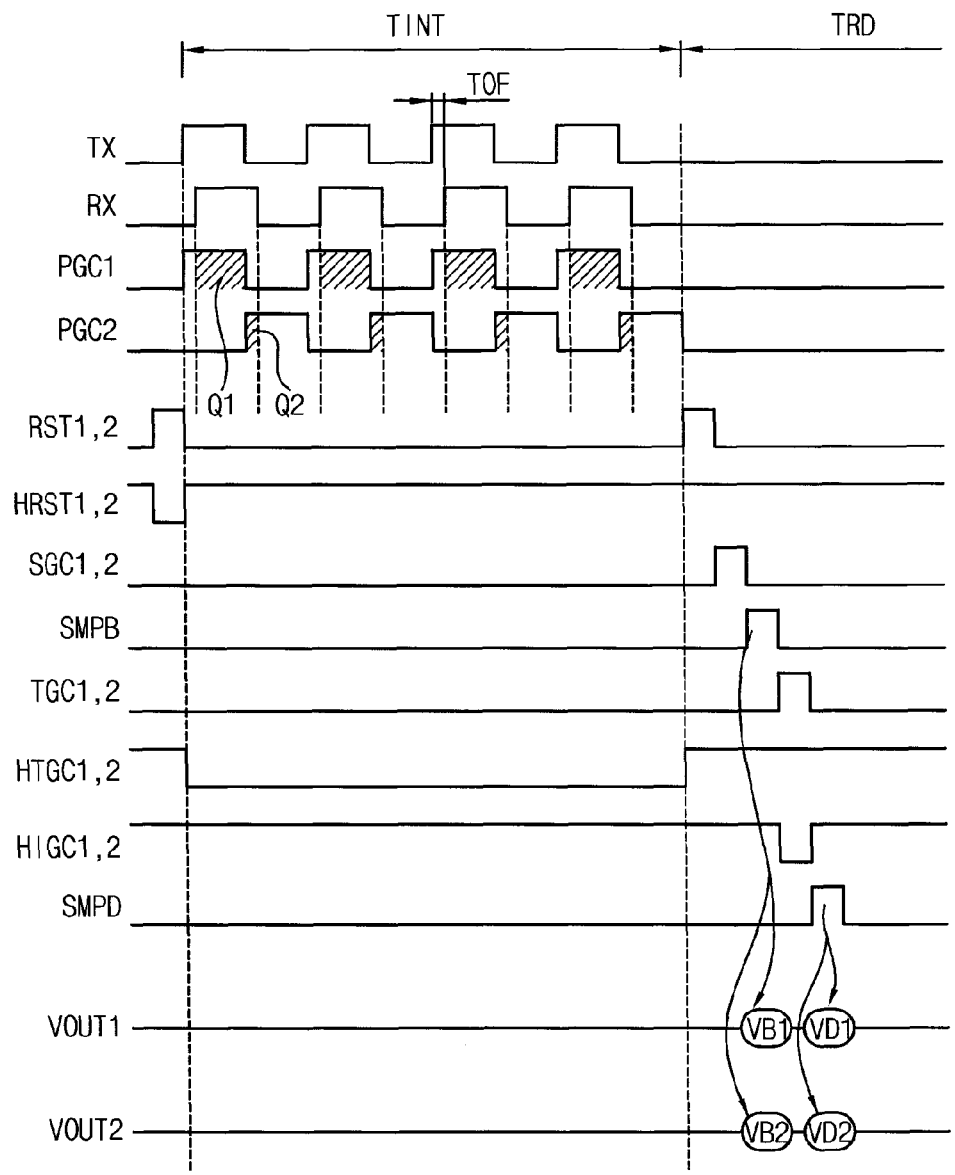
FIGS. 22A and 22B are timing charts for reference in explaining an operational example of the depth pixel shown in FIG. 21.
Figure 22B:
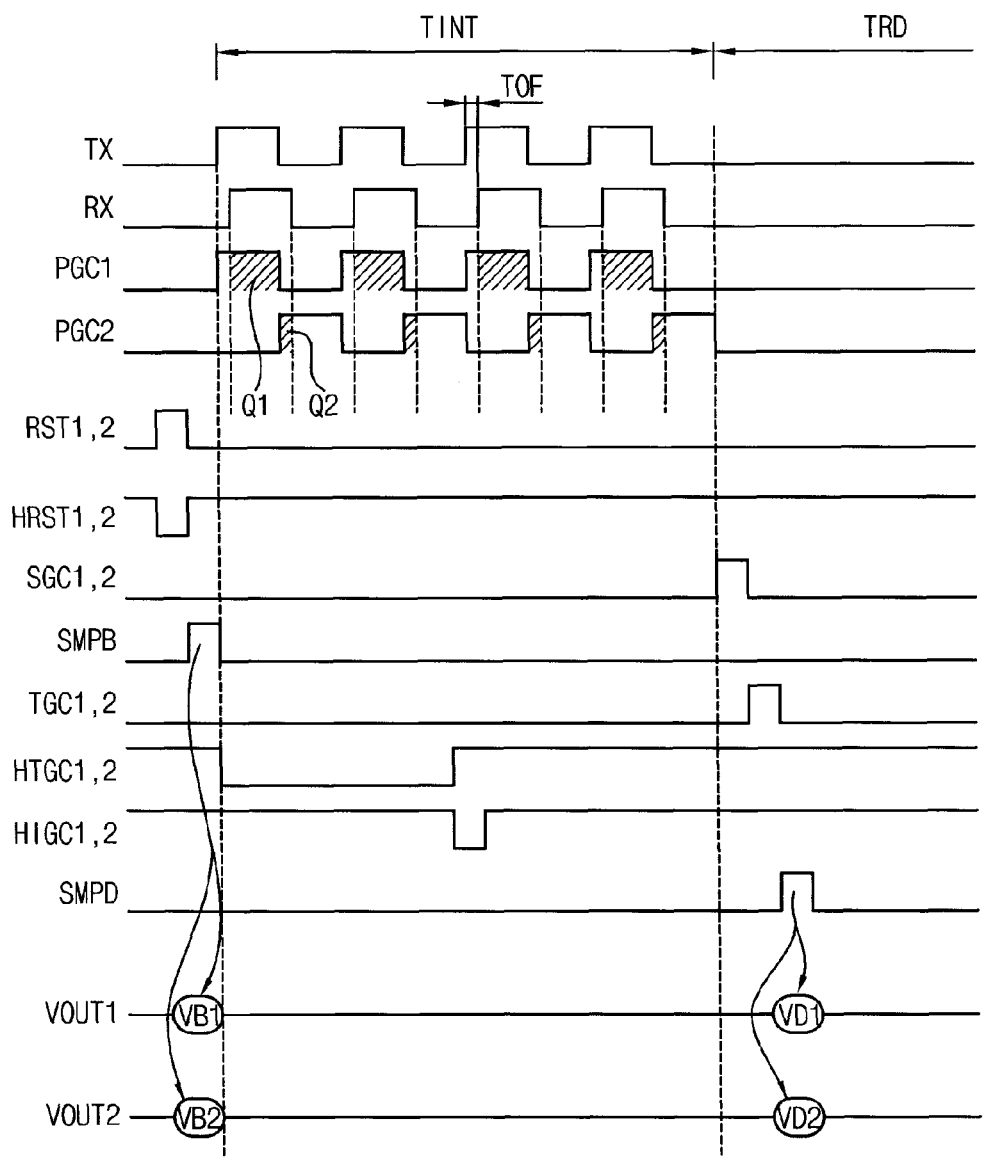

FIGS. 22A and 22B are timing charts for reference in describing operational examples of the depth pixel shown in FIG. 21. FIG. 22A illustrates an example embodiment in which the second and fourth charges (that is, holes) are injected into the floating diffusion area during the readout period, and FIG. 22B illustrates an example embodiment in which the second and fourth charges (that is, holes) are injected into the floating diffusion area during the light collection period.

Referring to FIGS. 21 and 22A, the depth pixel 100h may operate in a manner similar to the embodiment shown in FIG. 11A. However, the present example embodiment may further include a step of activating the storage control signals SGC1 and SGC2 during the readout period TRD to transmit the first and third charges to the storage areas 145 and 147, respectively. This step may be performed after the step of activating the first and second reset signals RST1 and RST2 and after the step of activating the first sampling control signal SMPB.

Referring to FIGS. 21 and 22B, the depth pixel 100h may operate in a manner similar to the embodiment shown in FIG. 11B. However, the present example embodiment may further include a step of activating the storage control signals SGC1 and SGC2 during the readout period TRD to transmit the first and third charges to the storage areas 145 and 147, respectively. This step may be performed before the step of activating the first and second transmission signals TGC1 and TGC2.

Figure 23:
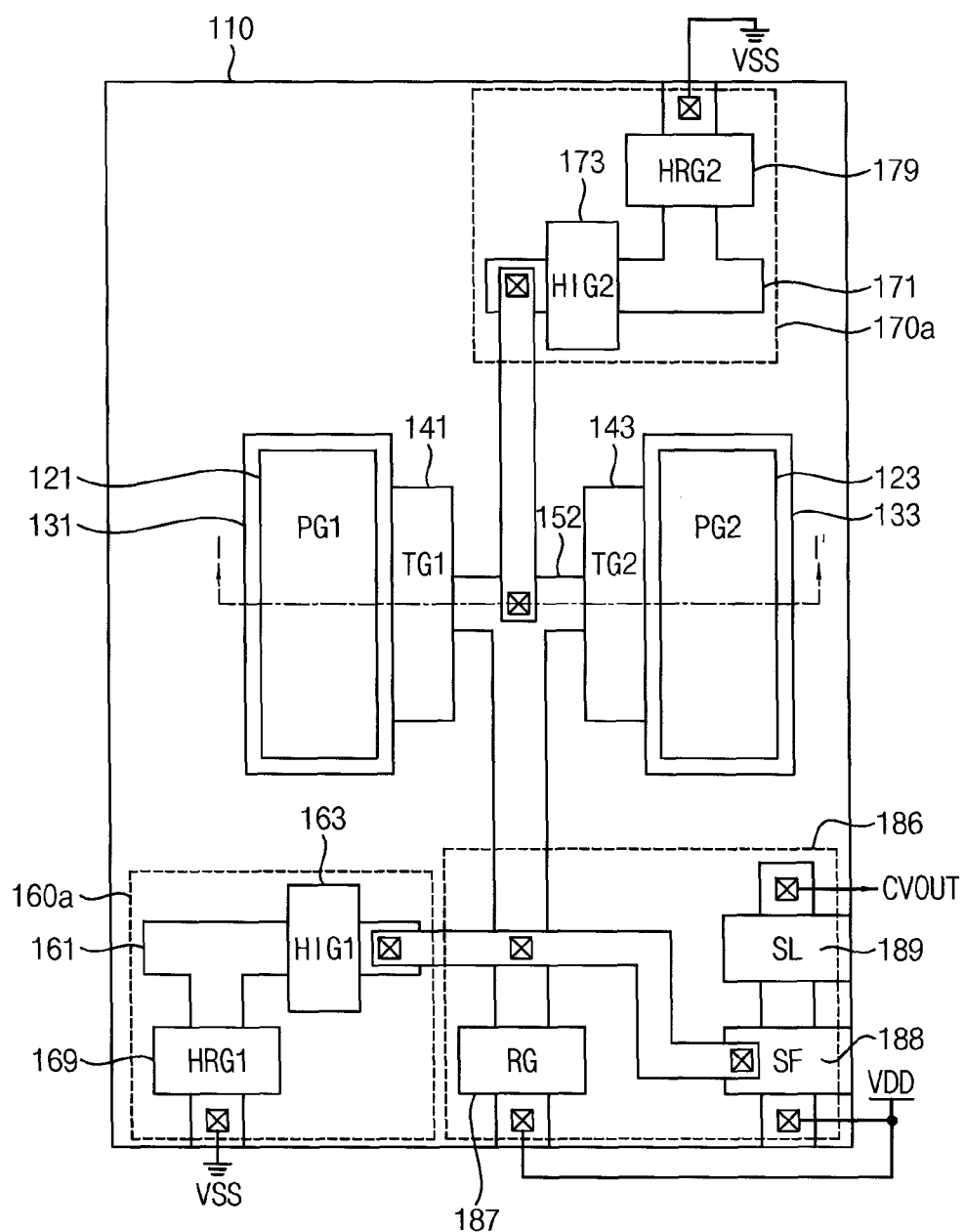
FIG. 23 is a plan view illustrating the depth pixel shown in FIG. 1 according to still yet another example embodiment.
Figure 24:
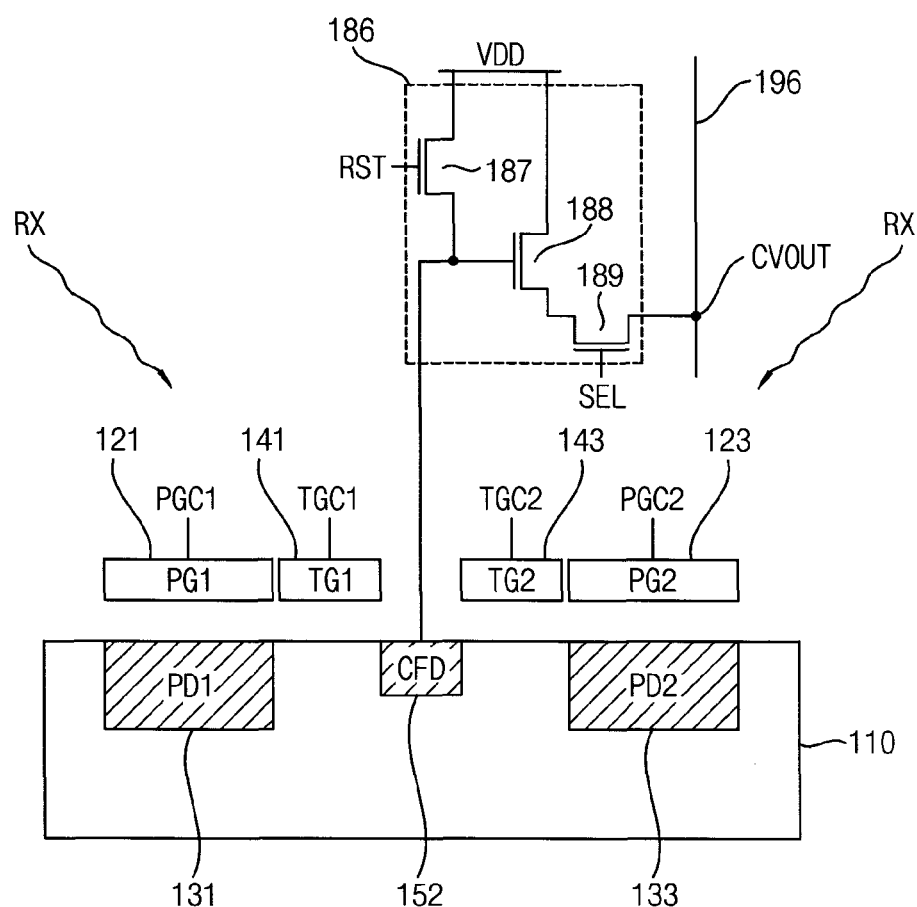
FIG. 24 is a view illustrating an example of a vertical structure of the depth pixel shown in FIG. 23.

FIG. 23 is a plan view illustrating the depth pixel shown in FIG. 1 according to still yet another example embodiment. FIG. 24 is a sectional view taken along line I-I' of FIG. 23 and represents a vertical structure of the depth pixel shown in FIG. 23.

Referring to FIGS. 23 and 24, the depth pixel 100i may include a first photo gate 121, a first photo detection area 131, a first transmission gate 141, a common floating diffusion area 152, a first compensation unit 160a, a common output unit 186, a second photo gate 123, a second photo detection area 133, a second transmission gate 143 and a second compensation unit 170a.

The depth pixel 100i of FIG. 23 includes one common floating diffusion area 152 and one common output unit 186 to sequentially detect the noise voltages VB1 and VB2 and the demodulated voltages VD1 and VD2. The common floating diffusion area 152 and the common output unit 186 are shared by two half pixels. The first half pixel may include the photo gate 121, the first photo detection areas 131, the first transmission gate 141, and the first compensation unit 160a, and the second half pixel may include the second photo gate 123, the second photo detection area 133, the second transmission gate 143 and the second compensation unit 170a. The photo gates 121 and 123, the photo detection areas 131 and 133, the transmission gates 141 and 143 and the compensation units 160a and 170a may have configurations which are substantially the same as configurations of the photo gates 121 and 123, the photo detection areas 131 and 133, the transmission gates 141 and 143 and the compensation units 160a and 170a shown in FIG. 4.

When the photo gates 121 and 123 are turned on in response to the photo control signals PGC1 and PGC2, the photo detection areas 131 and 133 may generate the first and third charges, respectively, based on the received light RX. The ambient light detection areas 161 and 171 may generate the second and fourth charges based on the ambient light components. When the transmission gates 141 and 143 are turned on in response to the transmission control signals TGC1 and TGC2, the first and third charges may be accumulated in the common floating diffusion area 152. When the injection gates 163 and 173 are turned on in response to the injection control signals HIGC1 and HIGC2, the second and fourth charges may be injected into the common floating diffusion area 152. Since the depth pixel 100g includes one common floating diffusion area 152, the transmission control signals TGC1 and TGC2 and the injection control signals HIGC1 and HIGC2 may be activated in mutually different timings.

The common output unit 186 may generate the electric signal corresponding to the charges accumulated in the common floating diffusion area 152. The common output unit 186 may include a reset transistor 187, a drive transistor 188 and a select transistor 189. The reset transistor 187 discharges the charges accumulated in the common floating diffusion area 152 in response to the reset signal RST to initialize the common floating diffusion area 152 to the level of power supply VDD. The drive transistor 188 may amplify the voltage of the common floating diffusion area 152. The select transistor 189 may supply the voltage amplified by the drive transistor 188 to an output line 196 as an output voltage CVOUT in response to a select signal SEL1.

Figure 25:
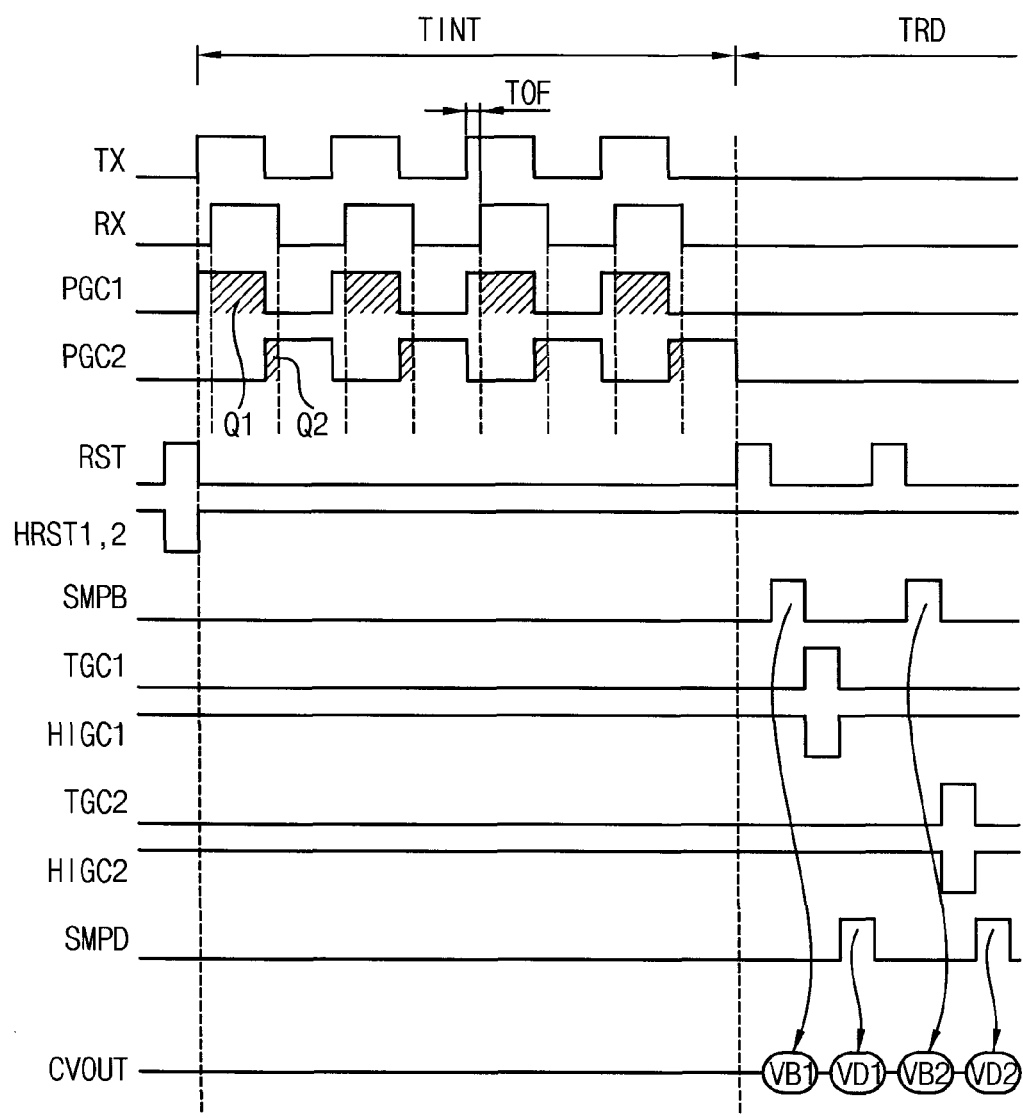
FIG. 25 is a timing chart for reference in explaining an operational example of the depth pixel shown in FIG. 23.

FIG. 25 is a timing chart for reference in describing an operational example of the depth pixel shown in FIG. 23. FIG. 25 illustrates an example embodiment in which the second and fourth charges (that is, holes) are injected into the common floating diffusion area during the readout period.

Referring to FIGS. 23, 24, and 25, the operation the depth pixel 100i before and during the light collection period TINT may be substantially the same as the operation of the example embodiment shown in FIG. 7A.

As the readout period TRD starts, the reset signal RST is activated so that the common floating diffusion area 152 is initialized. Then, the first sampling control signal SMPB is activated so that the voltage of the common floating diffusion area 152, which is initialized to supply voltage VDD, is detected as the first noise voltage VB1. In addition, the first transmission control signal TGC1 is activated so that the first charges are transmitted to the common floating diffusion area 152. At the same time, the first injection control signal HIGC1 is activated so that the second charges are injected into the common floating diffusion area 152. Then, the second sampling control signal SMPD is activated so that the voltage of the common floating diffusion areas 151 and 153 corresponding to the sum of the first and second charges is detected as the first demodulated voltage VD1. After that, the reset signal RST is activated again to initialize the common floating diffusion area 152, and the first sampling control signal SMPD is activated again so that the voltage of the common floating diffusion area 152, which is initialized to supply voltage VDD, is detected as the second noise voltage VB2. Then, the second transmission control signal TGC2 is activated so that the third charges are transmitted to the common floating diffusion area 152. At the same time, the second injection control signal HIGC2 is activated so that the fourth charges are injected into the common floating diffusion area 152. Then, the second sampling control signal SMPD is activated again so that the voltage of the common floating diffusion area 152 corresponding to the sum of the third and fourth charges is detected as the second demodulated voltage VD2. The effective voltages may be determined based on the detected voltages VB1, VB2, VD1 and VD2.

Figure 26:
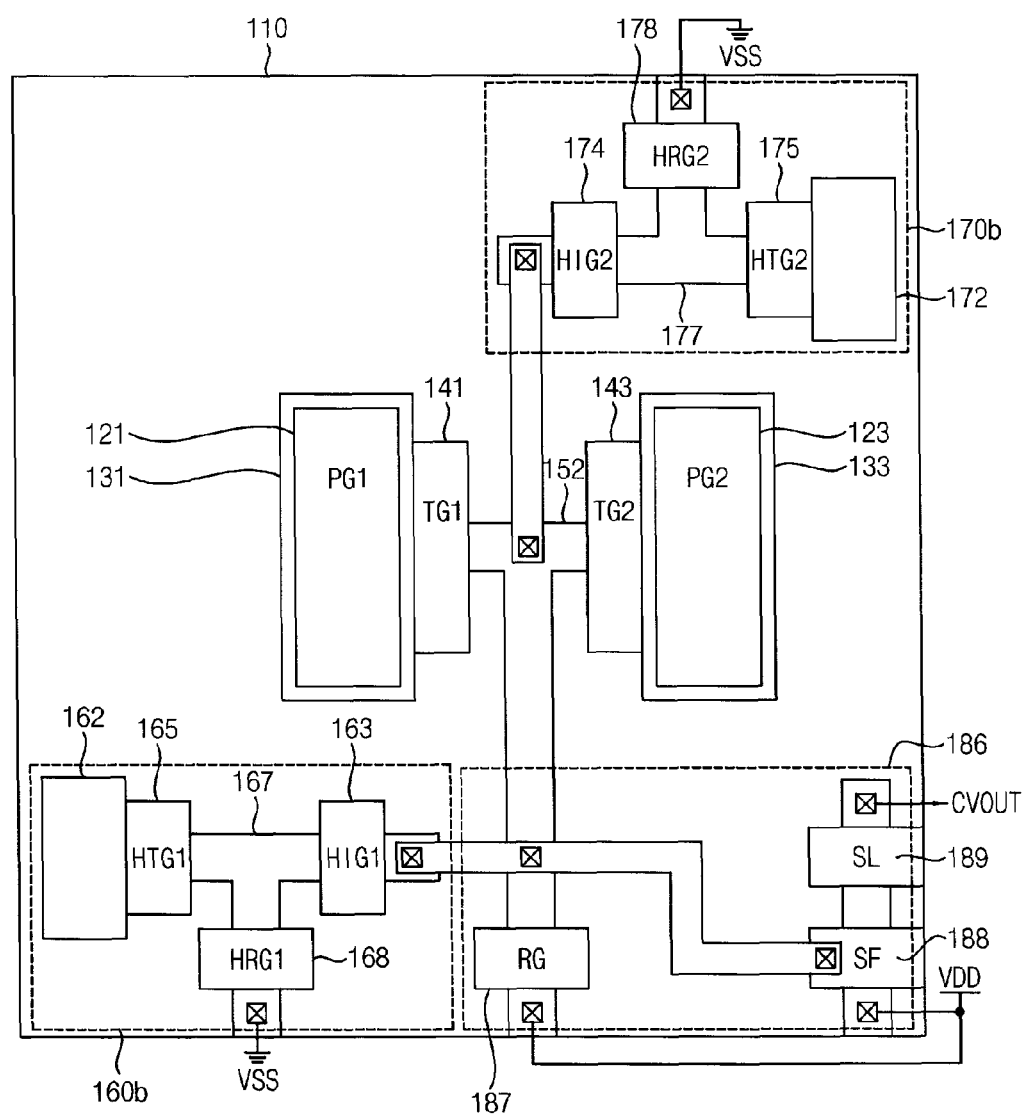
FIG. 26 is a plan view illustrating the depth pixel shown in FIG. 1 according to still yet another example embodiment.

FIG. 26 is a plan view illustrating a depth pixel shown in FIG. 1 according to still yet another example embodiment.

Referring to FIG. 26, the depth pixel 100*j* may include a first photo gate 121, a first photo detection area 131, a first transmission gate 141, a common floating diffusion area 152, a first compensation unit 160*b*, a common output unit 186, a second photo gate 123, a second photo detection area 133, a second transmission gate 143 and a second compensation unit 170*b*.

The depth pixel 100*j* of FIG. 26 may be substantially the same as the depth pixel 100*i* of FIG. 23, except for the configuration of the compensation units 160*b* and 170*b*. The configuration of the compensation units 160*b* and 170*b* may be substantially the same as the configuration of the compensation units 160*b* and 170*b* shown in FIG. 8.

Figure 27:
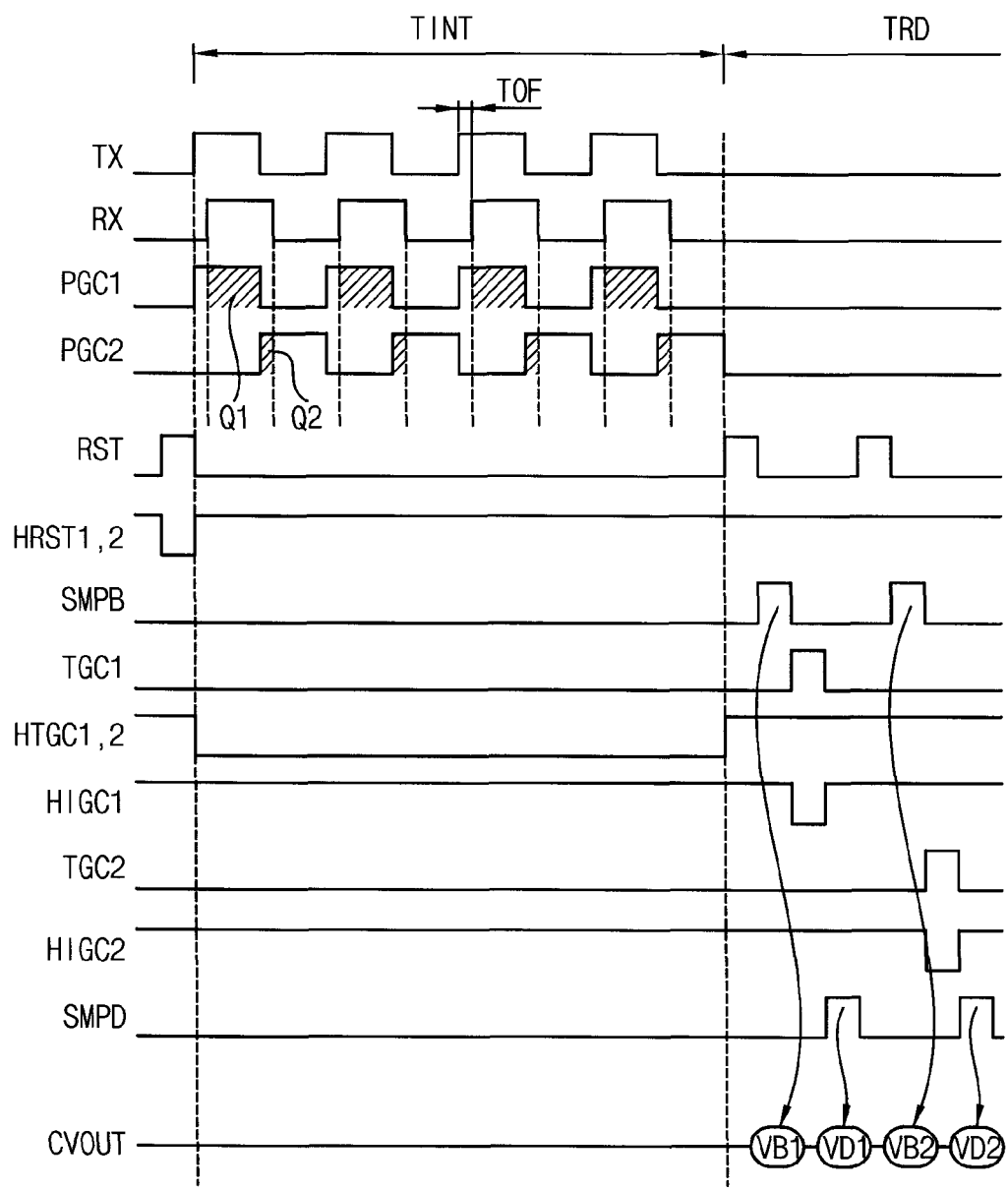
FIG. 27 is a timing chart for reference in explaining an operational example of the depth pixel shown in FIG. 26.

FIG. 27 is a timing chart for reference in describing an operational example of the depth pixel shown in FIG. 26. FIG. 27 illustrates an example embodiment in which the second and fourth charges (that is, holes) are injected into the common floating diffusion area during the readout period.

Referring to FIG. 27, the operation the depth pixel 100*j* before and during the light collection period TINT may be substantially the same as the operation of the example embodiment shown in FIG. 11A, and the operation the depth pixel 100*j* during the readout period TRD may be substantially the same as the operation of the example embodiment shown in FIG. 25.

Meanwhile, although not shown, the depth pixels 100*i* and 100*j* of FIGS. 23 and 26, which include one common floating diffusion area 152 and one common output unit 186, may further include at least one of the bridge diffusion areas 135 and 137 and the storage areas 145 and 147 (that is, temporal storage areas) as described above with reference to FIGS. 12, 14, 15, 17, 18 and 21.

Figure 28:
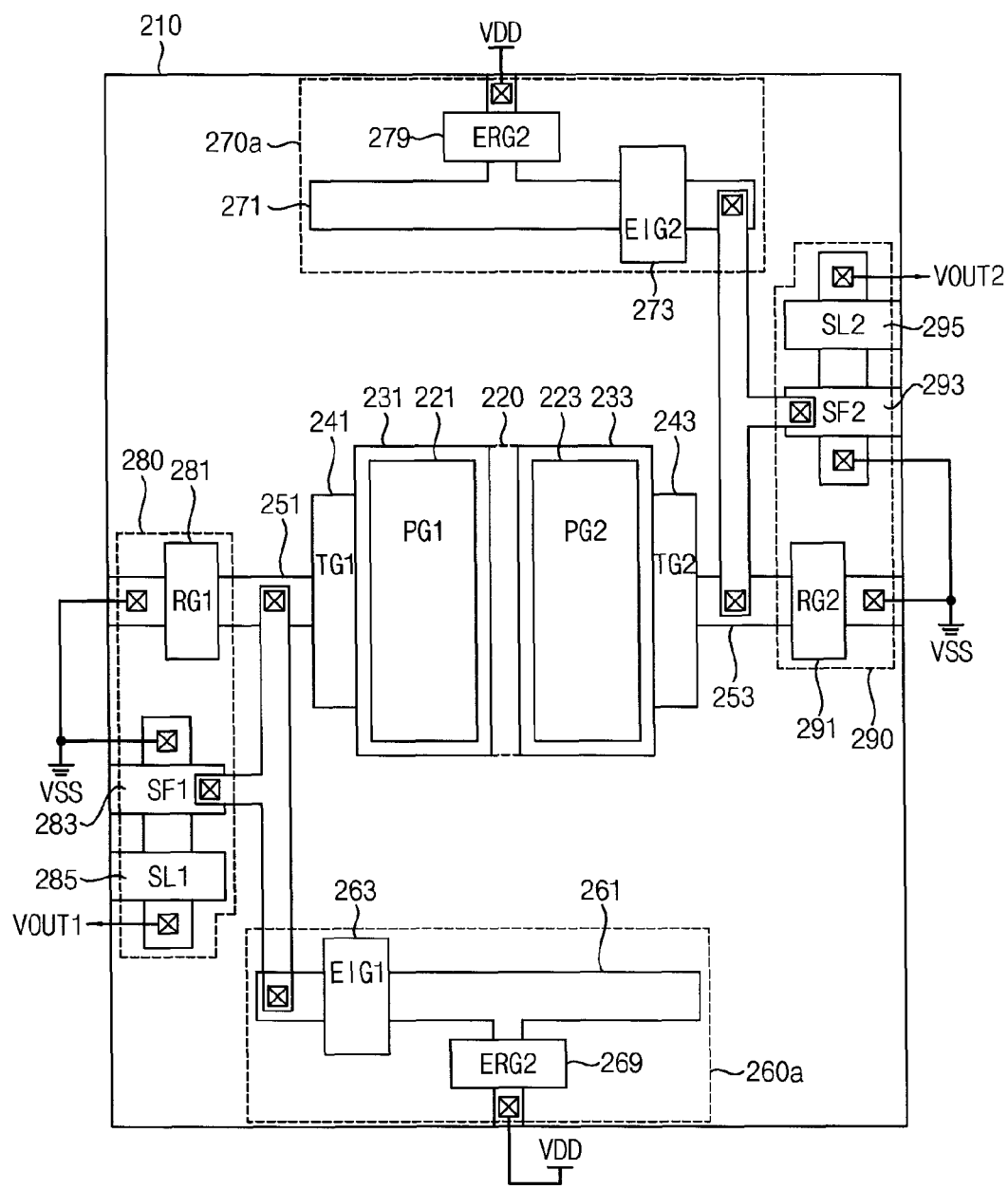
FIGS. 28 and 29 are plan views illustrating the depth pixel shown in FIG. 1 according to still yet another example embodiment.
Figure 29:
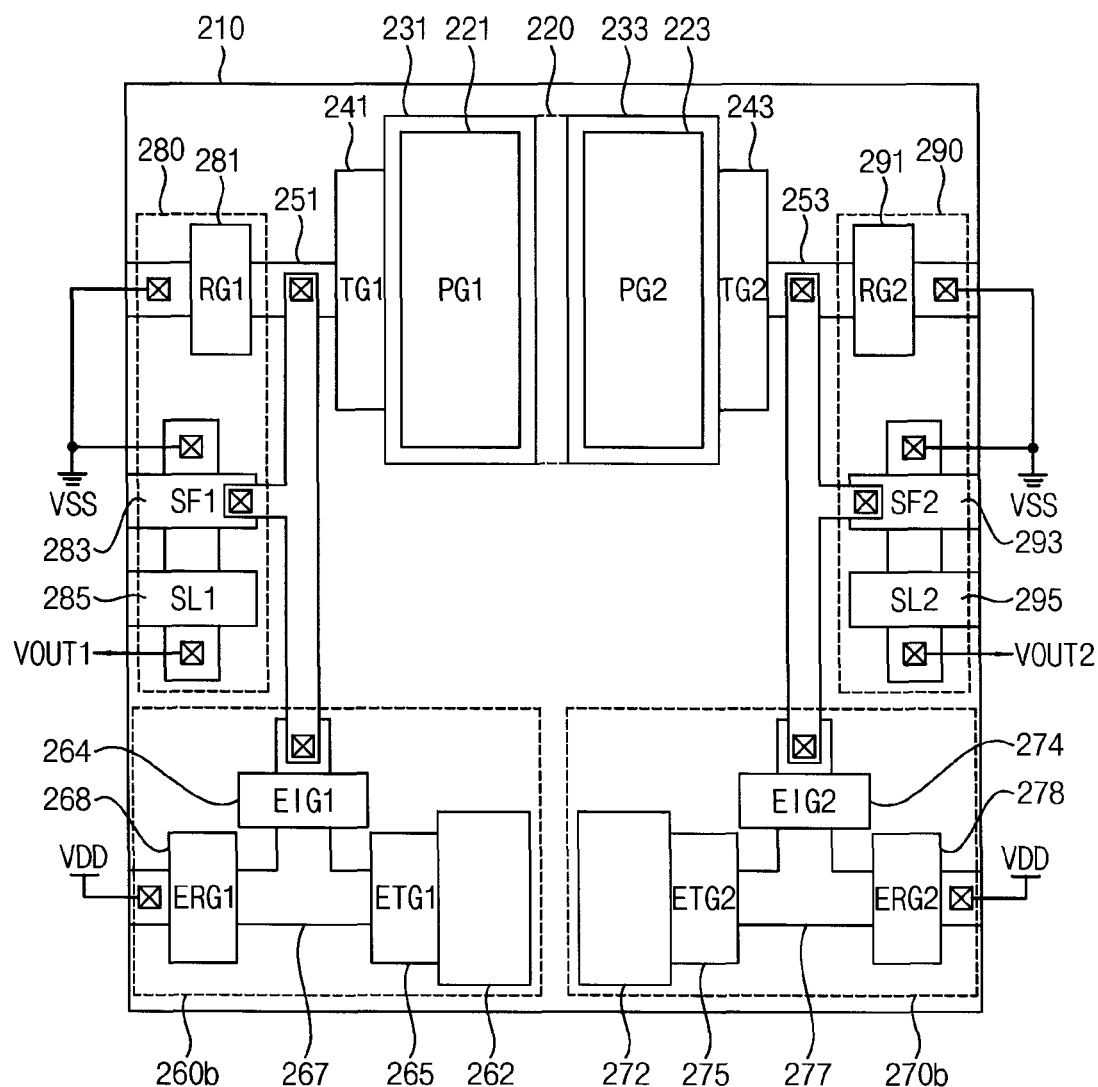

FIGS. 28 and 29 are plan views illustrating the depth pixel shown in FIG. 1 according to still yet another example embodiment.

Referring to FIG. 28, the depth pixel 200*a* includes a first photo gate 221, which is formed in or over a semiconductor substrate 210, a first photo detection area 231, a first transmission gate 241, a first floating diffusion area 251, a first compensation unit 260*a*, a first output unit 280, a second photo gate 223, a second photo detection area 233, a second transmission gate 243, a second floating diffusion area 253, a second compensation unit 270*a* and a second output unit 290. The depth pixel 200*a* may further include a channel stop area 220.

The depth pixel 200*a* of FIG. 28 may have configuration which is substantially the same as a configuration of the depth pixel 100*a* of FIG. 4. In detail, the main sensing block including the photo gates 221 and 223, photo detection areas 231 and 233, transmission gates 241 and 243, floating diffusion areas 251 and 253 and output units 280 and 290 may have a configuration which is substantially the same as a configuration shown in FIG. 5A, and the compensation block including the compensation units 260*a* and 270*a* may have a configuration which is substantially the same as a configuration shown in FIG. 5B. The output units 280 and 290 may include reset transistors 281 and 291, drive transistors 283 and 293 and select transistors 285 and 295, respectively and the compensation units 260*a* and 270*a* may include ambient light detection areas 261 and 271, injection gates 263 and 273 and reset transistors 269 and 279, respectively.

In case of the depth pixel 200*a* shown in FIG. 28, the main sensing block may generate/collect holes based on the received light RX and the compensation block may generate/collect holes based on the ambient light components. In this case, the semiconductor substrate 210 may be a p type semiconductor substrate, and the photo detection areas 231 and 233 and floating diffusion areas 251 and 253 may be formed by doping p type impurities at concentration which is higher than a concentration of impurities in the semiconductor substrate 210 so that the photo detection areas 231 and 233 may generate/collect holes of the electron-hole pairs. In addition, the ambient light detection areas 261 and 271 are formed by doping the n type impurities at a concentration which is higher than concentration of impurities in the semiconductor substrate 210 or at a concentration which gradually increases in a direction towards the top surface of the semiconductor substrate 110, so that the ambient light detection areas 261 and 271 may generate/collect holes of the electron-hole pairs.

Referring to FIG. 29, the depth pixel 200*b* includes a first photo gate 221, a first photo detection area 231, a first transmission gate 241, a first floating diffusion area 251, a first compensation unit 260*b*, a first output unit 280, a second photo gate 223, a second photo detection area 233, a second transmission gate 243, a second floating diffusion area 253, a second compensation unit 270*b* and a second output unit 290. The depth pixel 200*b* may further include a channel stop area 220.

The depth pixel 200*b* of FIG. 29 may be substantially the same as the depth pixel 200*a* of FIG. 28, except for the configuration of the compensation units 260*b* and 270*b*. That is, the main sensing block of the depth pixel 200*b* shown in FIG. 29 may have a configuration which is substantially the same as the configuration of the main sensing block of the depth pixel 200*a* shown in FIG. 28.

The compensation block including the compensation units 260*b* and 270*b* may have a configuration which is substantially the same as the configuration shown in FIG. 9. The compensation units 260*b* and 270*b* may include ambient light detection areas 262 and 272, injection gates 264 and 274, transmission gates 265 and 275, storage areas 267 and 277 and reset transistors 268 and 278, respectively. The ambient light detection areas 262 and 272 and the storage areas 267 and 277 may be doped with n type impurities which are the same type as the impurities doped in the semiconductor substrate 210. The ambient light detection areas 262 and 272 may be implemented as photo diodes or pinned diodes to generate/collect holes of the electron-hole pairs.

Meanwhile, although not shown, the depth pixels 200*a* and 200*b* of FIGS. 28 and 29, in which the main sensing block may generate/collect holes based on the received light RX and the compensation block may generate/collect holes based on the ambient light components, may further include at least one of the bridge diffusion areas 135 and 137 and the storage areas 145 and 147 (that is, temporal storage areas) as described above with reference to FIGS. 12, 14, 15, 17, 18 and 21, and may include one common floating diffusion area 152 and one common output unit 186 as described above with reference to FIGS. 23 and 26.

Figure 30:
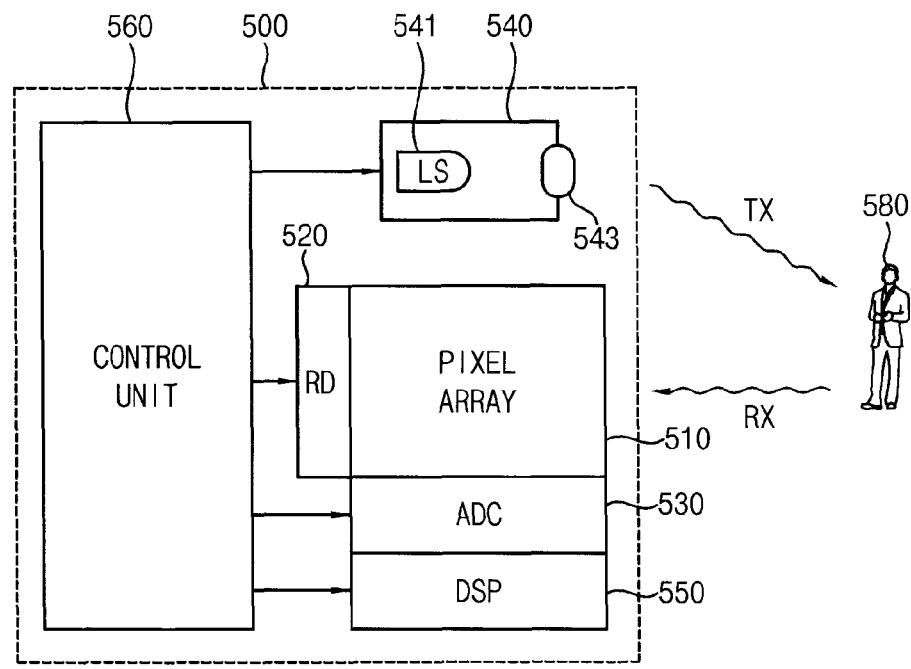
FIG. 30 is a block diagram illustrating a three-dimensional image sensor according to example embodiments.
Figure 31:
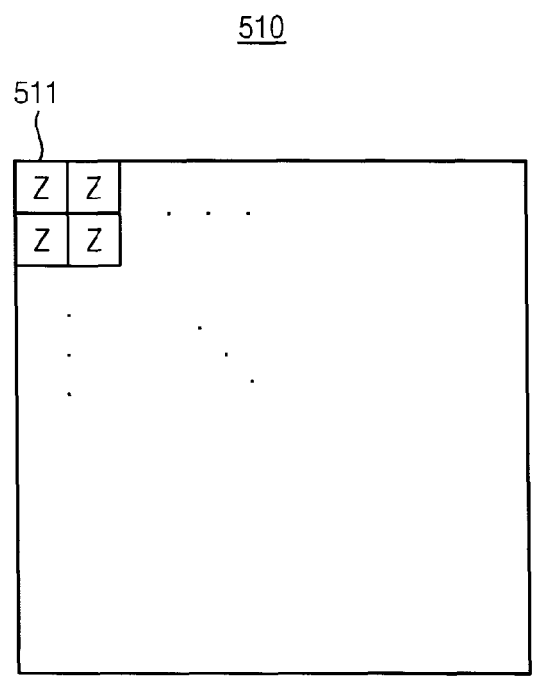
FIG. 31 is a view illustrating an example of the pixel array included in the three-dimensional image sensor shown in FIG. 30.

FIG. 30 is a block diagram illustrating a three-dimensional image sensor according to example embodiments. FIG. 31 is a view illustrating an example of a pixel array included in the three-dimensional image sensor shown in FIG. 30.

Referring to FIGS. 30 and 31, the three-dimensional image sensor 500 includes a pixel array 510, a row driving unit 520, an ADC (Analog-to-Digital Conversion) unit 530, a light source unit 540, a DSP (Digital Signal Processing) unit 550 and a control unit 560.

The light source unit 540 transmits modulated transmission light TX to illuminate a subject 580. The light source unit 540 may include a light source 541 and a lens 543. The light source 541 may generate a light having a predetermined wavelength (for instance, infrared or near-infrared). The light source 541 may be implemented as a light emitting diode (LED) or a laser diode and may generate light having periodically variable intensity. For instance, the light emitted from the light source 541 may be modulated to have continuous pulses, such as a pulse wave, a sine wave or a cosine wave. The lens 543 may concentrate the light emitted from the light source 541 onto the subject 580 as the transmission light TX.

The pixel array 510 includes a plurality of depth pixels 511. The pixel array 510 generates information indicative of the distance from the three-dimensional image sensor 500 to the subject 580 based on the received light RX reflected from the subject 580. That is, each of the depth pixels 511 may provide information indicative of the distance from the three-dimensional image sensor 500 to the subject 580. The received light RX may include components of reflected light and ambient light, which are emitted from the light source 540 and reflected from the subject 580. In one embodiment, the three-dimensional image sensor 500 may use infrared rays or near-infrared rays included in the components of reflected light and ambient light. In this case, an infrared filter or a near-infrared filter may be formed on the depth pixels 511.

Each of the depth pixels 511 may be the depth pixel 10 shown in FIG. 1 and may be implemented as described above with reference to FIGS. 4, 8, 12, 14, 15, 17, 18, 21, 23, 26, 28 and 29. That is, each depth pixel 511 may include a compensation unit having a photo detection area which generates first charges corresponding to one of an electron-hole pair (for instance, electrons) based on the received light RX, and an ambient light detection area which generates second charges corresponding to the other of an electron-hole pairs (for instance, hole) based on the ambient light components. Since some of the first charges are extinguished after being combined with the second charges, the three-dimensional image sensor including the depth pixel 511 can accurately measure the distance to the subject 580 without performance degradation even when the ambient light is relatively strong.

The row driving unit 520 is connected to each row of the pixel array 510 and may generate a driving signal to drive each row. For instance, the row driving unit 520 can drive the depth pixels 511 included in the pixel array 510 in a unit of a row.

The ADC unit 530 is connected to each column of the pixel array 510 to convert an analog signal output from the row driving unit 520 into a digital signal. In one example embodiment, the ADC unit 530 may include a plurality of analog-digital converters to perform a column ADC for converting the analog signals output from each column line into the digital signals in parallel (that is, simultaneously). In another example embodiment, the ADC unit 530 may include a single analog-digital converter to perform a single ADC for sequentially converting the analog signals into the digital signals.

According to example embodiments, the ADC unit 530 may include a CDS (correlated double sampling) unit to extract effective signal components. In one example embodiment, the CDS unit may perform analog double sampling to extract effective signal components based on the difference between an analog reset signal representing reset components and an analog data signal representing signal components. In another example embodiment, the CDS unit may perform digital double sampling, in which the analog reset signal and the analog data signal are converted into digital signals, respectively, and then the difference between the two digital signals is extracted as the effective signal component. In still another example embodiment, the CDS unit may perform dual correlated double which includes both analog double sampling and digital double sampling.

The DSP unit 550 receives the digital signal output from the ADC unit 530 and processes the image data for the digital signal. For instance, the DSP unit 550 may perform image interpolation, color correction, white balance, gamma correction and color conversion.

The controller 560 may control the row driving unit 520, the ADC unit 530, the light source unit 540 and the DSP unit 550. The controller 560 may supply control signals, such as a clock signal and a timing control signal that are used to operate the row driving unit 520, the ADC unit 530, the light source unit 540 and the DSP unit 550. In one example embodiment, the control unit 560 may include a logic control circuit, a phase lock loop (PLL) circuit, a timing control circuit and a communication interface circuit.

Figure 32:
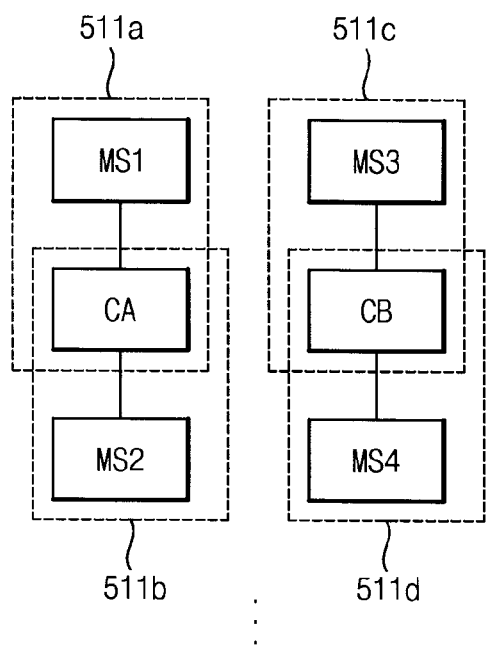
FIG. 32 is a view illustrating another example of a pixel array included in the three-dimensional image sensor shown in FIG. 30.

FIG. 32 is a view illustrating another example of the pixel array included in the three-dimensional image sensor shown in FIG. 30.

Referring to FIGS. 30 and 32, the pixel array 510 may include a plurality of depth pixels 511a, 511b, 511c and 511d.

The depth pixels 511a and 511c are aligned in the first row of the pixel array 510, and the depth pixels 511b and 511d are aligned in the second row of the pixel array 510. The depth pixels 511a and 511b may be aligned in the first column of the pixel array 510 and the depth pixels 511c and 511d may be aligned in the second column of the pixel array 510. The depth pixels 511a, 511b, 511c and 511d may include main sensing blocks MS1, MS2, MS3 and MS4 and compensation blocks CA and CB, respectively. As described above with reference to FIG. 4, the main sensing blocks MS1, MS2, MS3 and MS4 may include photo gates, photo detection areas, transmission gates, floating diffusion areas and output units, respectively, and the compensation units CA and CB may include compensation units, respectively.

As described above with reference to FIG. 30, since the depth pixels included in the pixel array 510 are driven in a unit of a row, two depth pixels of the depth pixels 511a, 511b, 511c and 511d, which are aligned in mutually different rows and adjacent to each other, may share one compensation block. For instance, the depth pixels 511a and 511b may share the compensation block CA and the depth pixels 511c and 511d may share the compensation block CB. In other words, the first depth pixel 511a may include the first main sensing block MS1 having first and second photo gates, first and second photo detection areas, first and second transmission gates, first and second floating diffusion areas and first and second output units and the second depth pixel 511b may include the second main sensing block MS2 having third and fourth photo gates, third and fourth photo detection areas, third and fourth transmission gates, third and fourth floating diffusion areas and third and fourth output units. In addition, the first compensation block CA including the first and second compensation units may be shared by the first and second depth pixels 511a and 511b.

Figure 33:
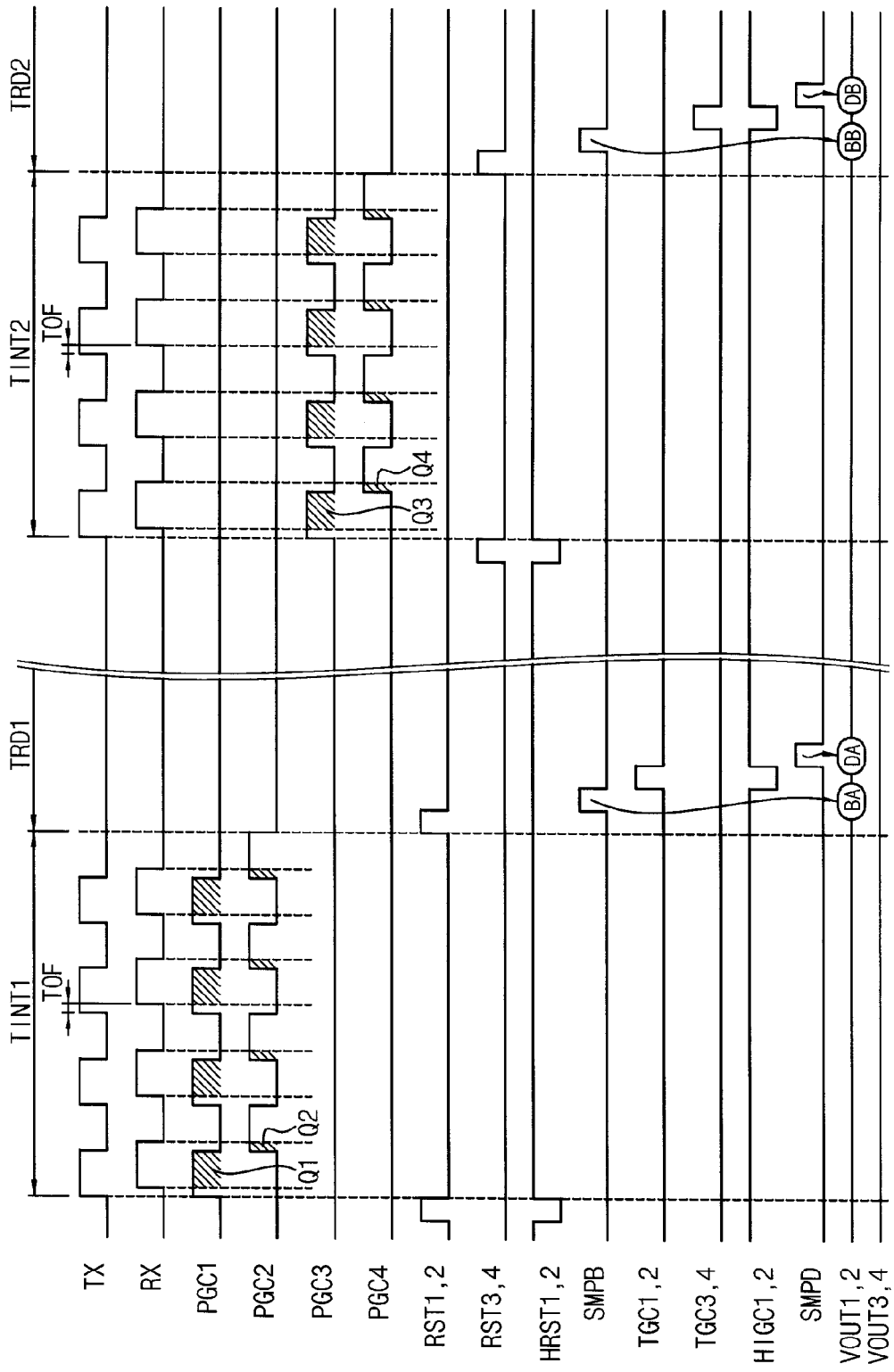
FIG. 33 is a timing chart for reference in explaining an operational example of the three-dimensional image sensor shown in FIG. 30.

FIG. 33 is a timing chart for reference is describing an operational example of the three-dimensional image sensor shown in FIG. 30. FIG. 33 illustrates an example embodiment where the pixel array 510 included in the three-dimensional image sensor 500 shown in FIG. 30 is configured such that two adjacent depth pixels share one compensation block as shown in FIG. 32, and in particular, compensation units of the compensation block are implemented as shown in FIG. 4.

Referring to FIGS. 30, 32 and 33, signals PGC1, PGC2, RST1, RST2, TGC1, TGC2, VOUT1 and VOUT2 are related to the first main sensing block MS1 of the first depth pixel 511a, signals PGC3, PGC4, RST3, RST4, TGC3, TGC4, VOUT3 and VOUT4 are related to the second main sensing block MS2 of the second depth pixel 511b, and signals HRST1, HRST2, HIGC1, and HIGC2 are related to the first compensation block CA shared by the first and second depth pixels 511a and 511b.

In FIG. 33, the first depth pixel 511a is driven during the first light collection period TINT1 and the first readout period TRD1 so that the noise voltages BA and demodulated voltages DA are detected, and the second depth pixel 511b is driven during the second light collection period TINT2 and the second readout period TRD2 so that the noise voltages BB and demodulated voltages DB are detected. The operation of the first depth pixel 511a and the operation of the second depth pixel 511b may be substantially the same as the operation of the example embodiment shown in FIG. 7A, except that the first compensation block CA is shared by the first and second depth pixels 511a and 511b.

Although not shown in the drawing, the operation of the first depth pixel 511a and the operation of the second depth pixel 511b may be substantially the same as the operation of the example embodiments shown in FIGS. 7B, 11A and 11B.

Figure 34:
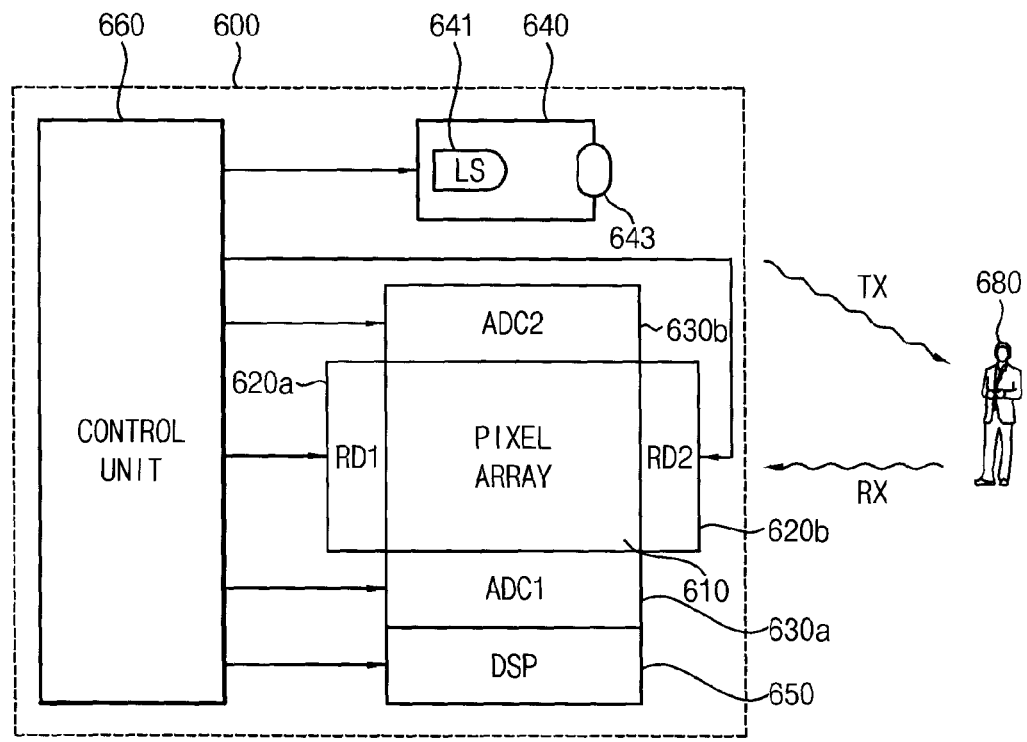
FIG. 34 is a block diagram illustrating a three-dimensional image sensor according to example embodiments.
Figure 35A:
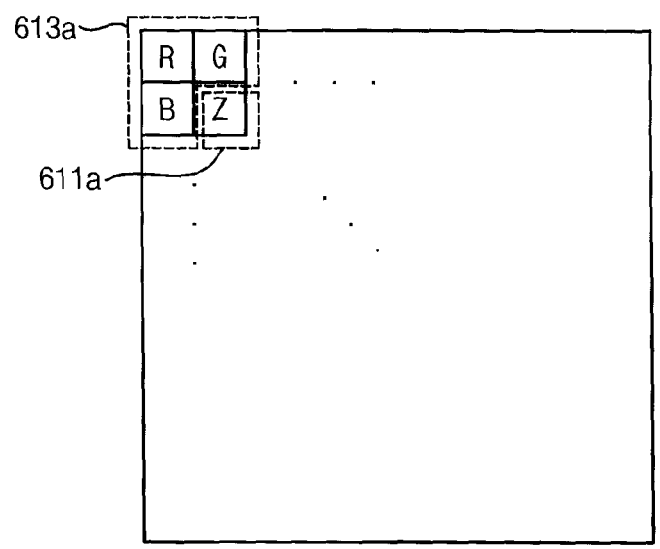
FIGS. 35A and 35B are views illustrating examples of a pixel array included in the three-dimensional image sensor shown in FIG. 34.
Figure 35B:
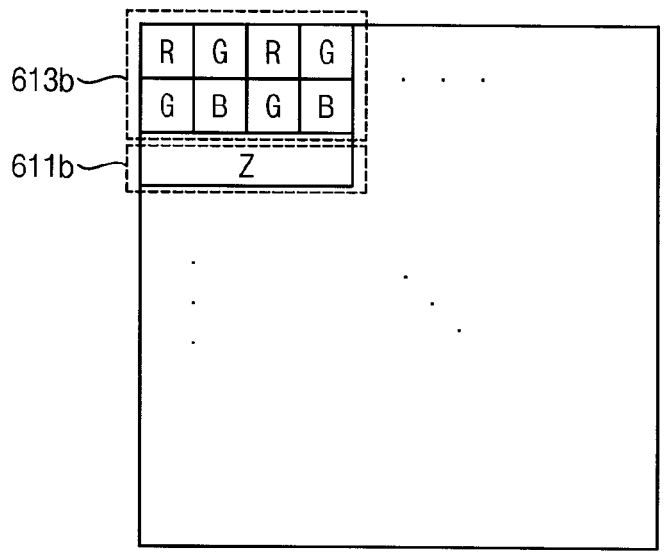

FIG. 34 is a block diagram illustrating the three-dimensional image sensor according to example embodiments. FIGS. 35A and 35B are views illustrating examples of the pixel array included in the three-dimensional image sensor shown in FIG. 34.

Referring to FIGS. 34, 35A and 35B, the three-dimensional image sensor 600 includes a pixel array 610, a first row driving unit 620a, a second row driving unit 620b, a first ADC unit 630a, a second ADC unit 630b, a light source unit 640, a DSP unit 650 and a control unit 660.

The light source unit 640 transmits modulated transmission light TX to illuminate a subject 680. The light source unit 640 may include a light source 641 and a lens 643. The light source unit 640 may be substantially the same as the light source unit 540 shown in FIG. 30.

The pixel array 610 generates information indicative of the distance from the three-dimensional image sensor 600 to the subject 680 based on the received light RX reflected from the subject 680. The pixel array 610 may include a plurality of depth pixels and a plurality of color pixels. According to example embodiments, the ratio and positioning of depth pixels relative to color pixels included in the pixel array 610 may vary. For instance, the pixel array 610a may include depth pixels 611a (Z) and color pixels 613a (RGB) as shown in FIG. 35A, or the pixel array 610b may include depth pixels 611b (Z) and color pixels 613b (RGB) as shown in FIG. 35B. Infrared (or near-infrared) filters may be formed on the depth pixels and color filters (for instance, red, green and blue filters) may be formed on the color pixels.

The first row driving unit 620a is connected to each row of the color pixels and may generate a first driving signal to drive each row of the color pixels. The second row driving unit 620b is connected to each row of the distance pixels and may generate a second driving signal to drive each row of the depth pixels. The first ADC unit 630a is connected to each column of the color pixels to convert a first analog signal output from each column of the color pixels into a first digital signal. The second ADC unit 630b is connected to each column of the depth pixels to convert a second analog signal output from each column of the depth pixels into a second digital signal. The DSP unit 650 receives the first and second digital signals from the first and second ADC units 630a and 630b to process the image data for the first and second digital signals. The control unit 660 may control the first row driving unit 620a, the second row driving unit 620b, the first ADC unit 630a, the second ADC unit 630b, the light source unit 640 and the DSP unit 650.

Figure 36:
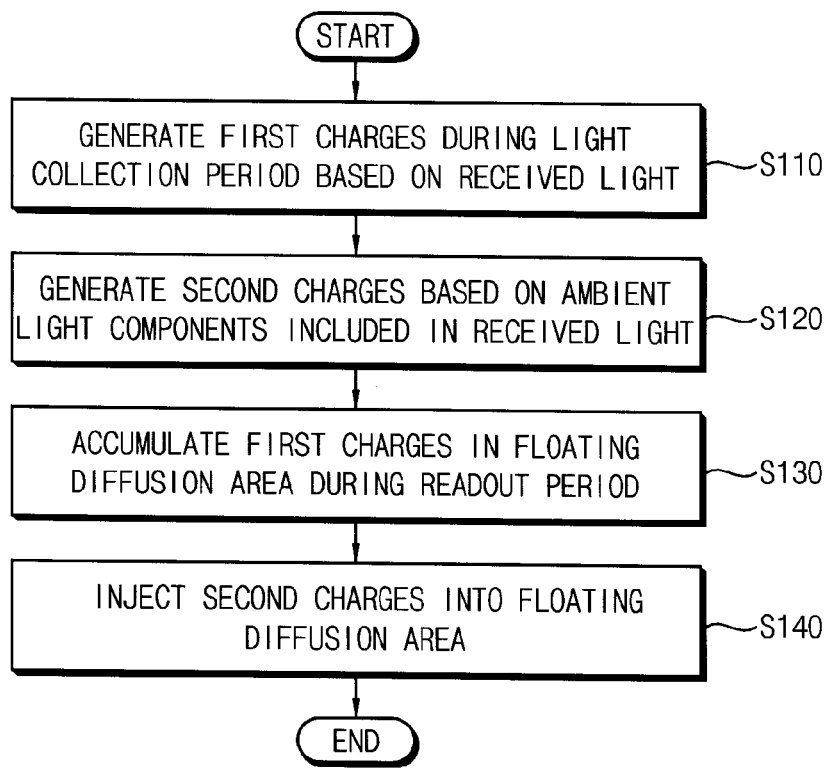
FIG. 36 is a flowchart for reference in describing a method of operating a depth pixel of a three-dimensional image sensor according to example embodiments.

FIG. 36 is a flowchart illustrating a method of operating the depth pixel of the three-dimensional image sensor according to example embodiments.

Referring to FIGS. 1, 2, 3, 30 and 36, in the method of driving the depth pixel of the three-dimensional image sensor, the first charges are generated based on the received light RX reflected from the subject 580 during the light collection period TINT (step S110). The photo detection area may generate/collect the first charges, and the first charges may correspond to one of an electron-hole pair (for instance, electrons).

Then, the second charges, which are different from the first charges, are generated based on the ambient light components included in the received light RX (step S120). The compensation unit 60, in particular, the ambient light detection area of the compensation unit 60 may generate/collect the second charges, and the second charges may correspond to the other of an electron-hole pair (for instance, holes). In one example embodiment, the second charges may be generated during the light collection period TINT.

The first charges are accumulated in the floating diffusion area 50 during the readout period TRD (step S130). The second charges are injected into the floating diffusion area 50 (step S140). Some of the first charges are extinguished after being combined with the second charges in the floating diffusion area 50 so that the depth error otherwise caused by the ambient light components can be compensated. In one example embodiment, as shown in FIGS. 7A and 11A, the second charges may be injected into the floating diffusion area 50 during the readout period TRD. In another example embodiment, as shown in FIGS. 7B and 11B, the second charges may be injected into the floating diffusion area 50 during the light collection period TINT.

Figure 37:
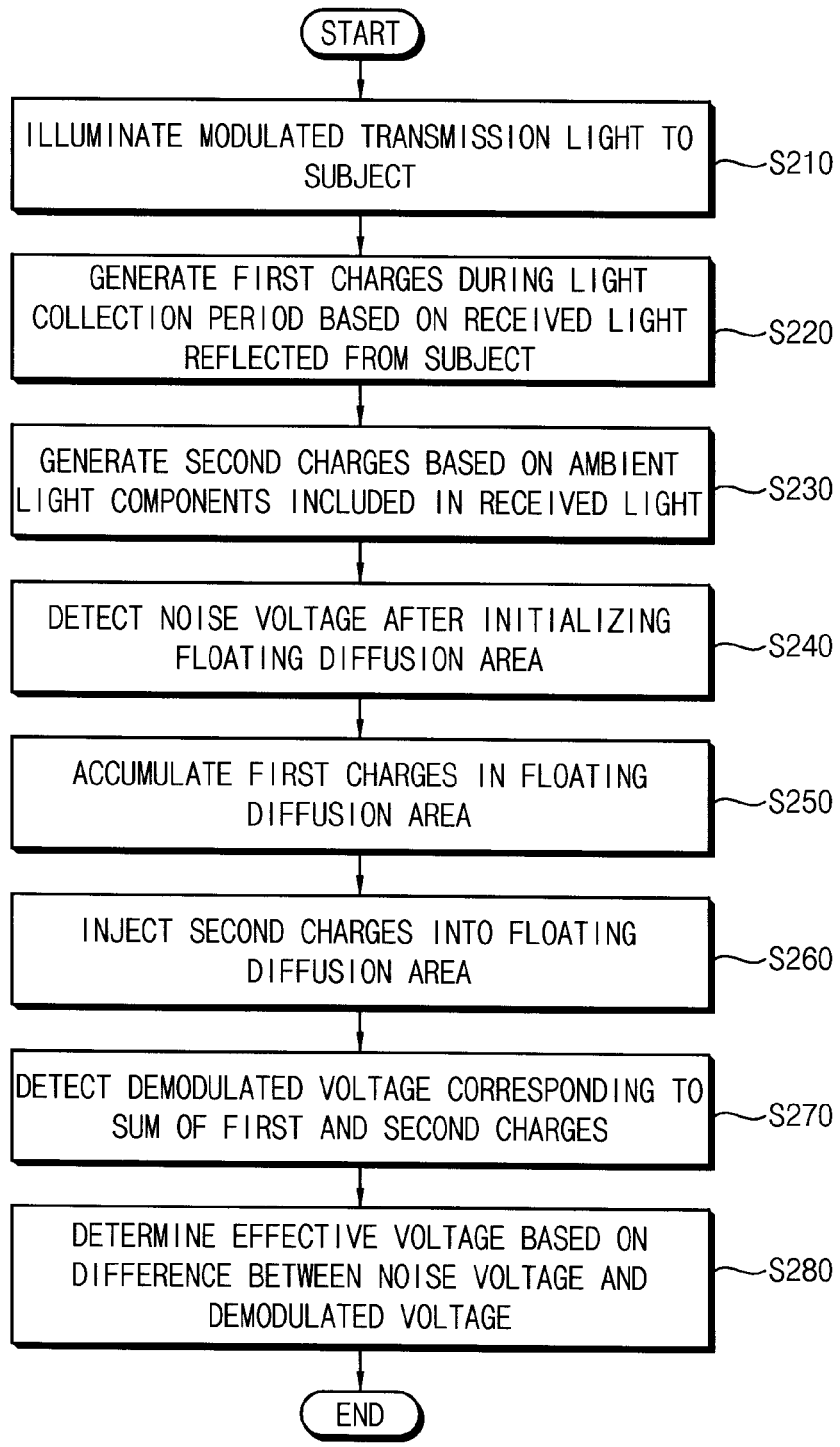
FIG. 37 is a flowchart for reference in describing a method of measuring a distance in a three-dimensional image sensor according to example embodiments.

FIG. 37 is a flowchart illustrating a method of measuring a distance in the three-dimensional image sensor according to example embodiments.

Referring to FIGS. 1, 2, 3, 30 and 37, in a method of measuring a distance in the three-dimensional image sensor, a modulated transmission light TX is illuminated onto the subject 580 (step S210). The transmission light TX may, for example, be modulated to have a pulse wave, a sine wave or a cosine wave.

The first charges are generated based on the received light RX reflected from the subject 580 during the light collection period TINT (step S220). The second charges, which are different from the first charges, are generated based on the ambient light components included in the received light RX (step S230). Steps S220 and S230 may be substantially the same as steps S110 and S120 of FIG. 36.

After the floating diffusion area 50 is initialized, the noise voltage VB corresponding to the voltage of the floating diffusion area 50 is detected (step S240). For instance, the reset signal RST is activated to initialize the floating diffusion area 50 to the level of supply voltage VDD, and the sampling control signal SMPB is activated to detect the voltage of the initialized floating diffusion area 50 as the noise voltage VB.

After the noise voltage VB is detected, the first charges are accumulated in the floating diffusion area 50 during the readout period TRD (step S250). The second charges are injected into the floating diffusion area 50 (step S260). Steps S250 and S260 may be substantially the same as steps S130 and S140 of FIG. 36.

The demodulated voltage VD corresponding to the sum of the first and second charges is detected (step S270). The effective voltage is determined based on the difference between the noise voltage VB and the demodulated voltage VD (step S280).

Figure 38:
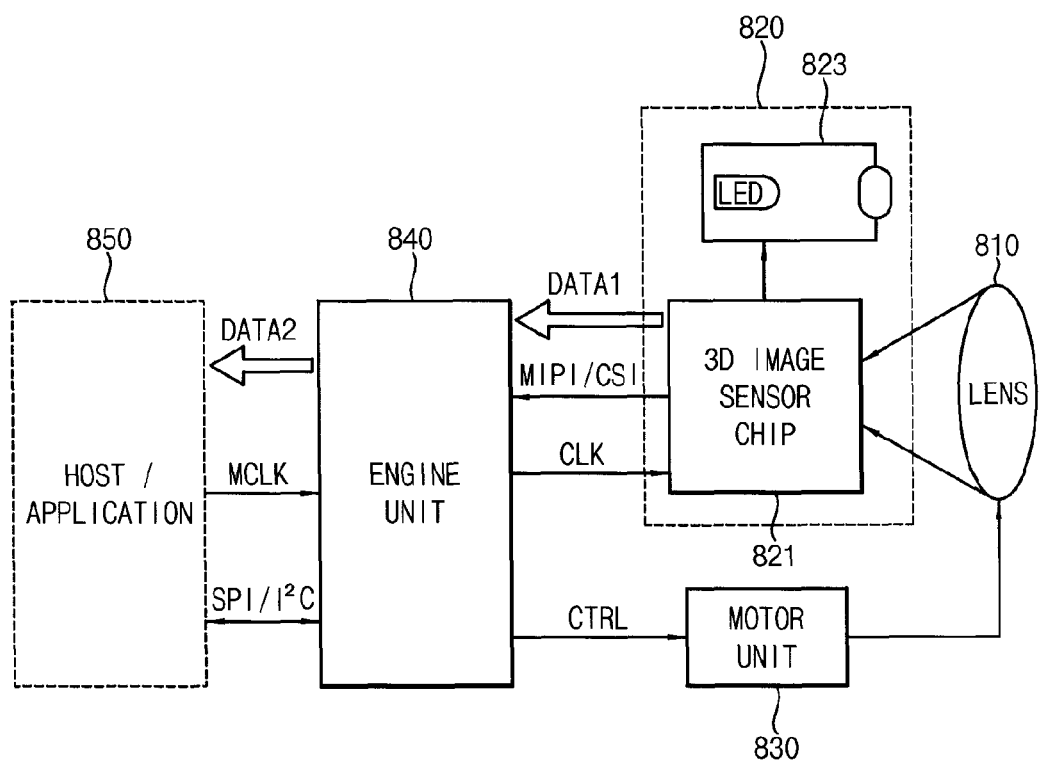
FIG. 38 is a block diagram illustrating an application where the three-dimensional image sensor according to example embodiments is applied to a camera.

FIG. 38 is a block diagram illustrating an application where the three-dimensional image sensor according to example embodiments is applied to a camera.

Referring to FIG. 38, the camera 800 may include a light receiving lens 810, a three-dimensional image sensor 820, a motor unit 830, and an engine unit 840. The three-dimensional image sensor 820 may be the three-dimensional image sensor shown in FIG. 30 or FIG. 34, and may include an image sensor chip 821 and a light source module 823. According to example embodiments, the image sensor chip 821 and the light source module 823 may be provided separately from each other, or at least a part of the light source module 823 may be included in the image sensor chip 821. In addition, the light receiving lens 810 may be prepared as a part of the three-dimensional image sensor 820.

The light receiving lens 810 can concentrate incident light onto a light receiving area (for instance, depth pixels and/or color pixels) of the image sensor chip 821. The image sensor chip 821 may generate data DATA1 including distance information and/or color image information based on visible rays or infrared rays incident through the light receiving lens 810. For instance, the data DATA1 generated from the image sensor chip 821 may include distance data generated by using infrared rays or near-infrared rays emitted from the light source module 823 and may further include RGB data (RGB) of a Bayer pattern generated by using external visible rays. In this manner, the image sensor chip 821 may serve as a three-dimensional color image sensor for providing distance information and color image information.

The image sensor chip 821 includes depth pixels and color pixels to provide distance information and color image information. Each depth pixel includes the compensation unit having the photo detection area which generates the first charges corresponding to one of an electron-hole pair (for instance, electrons) based on the received light RX and the ambient light detection area which generates the second charges corresponding to the other of the electron-hole pair (for instance, holes) based on the ambient light components. Since some of the first charges are extinguished after being combined with the second charges, the image sensor chip including the depth pixel can accurately measure the distance to the subject without performance degradation even when the ambient light is relatively strong.

The image sensor chip 821 can provide the data DATA1 to the engine unit 840 based on a clock signal CLK. According to example embodiments, the image sensor chip 821 may interface with the engine unit 840 through an MIPI (Mobile Industry Processor Interface) and/or a CSI (Camera Serial Interface).

The motor unit 830 may adjust the focus of the light receiving lens 810 in response to the control signal CTRL received from the engine unit 840, or may perform shuttering. According to example embodiments, the relative position between the light source and lens in the light source module 823 may be controlled by the motor unit 830 or the image sensor chip 821.

The engine unit 840 controls the image sensor 820 and the motor unit 830. In addition, the engine unit 840 can process the data DATA1 received from the image sensor chip 821. For instance, the engine unit 840 can generate three-dimensional color data based on the data DATA1 received from the image sensor chip 821. In another example embodiment, the engine unit 840 may generate YUV data including a brightness component, a difference between the brightness component and a blue color component, and a difference between the brightness component and a red color component based on the RGB data included in the data DATA1, or may generate compressed data, such as JPEG (Joint Photography Experts Group) data. The engine unit 840 may be connected to a host/application 850 to provide data DATA2 to the host/application 850 based on a master clock MCLK. In addition, the engine unit 840 may interface with the host/application 850 through an SPI (Serial Peripheral Interface) and/or an I²C (Inter Integrated Circuit).

Figure 39:
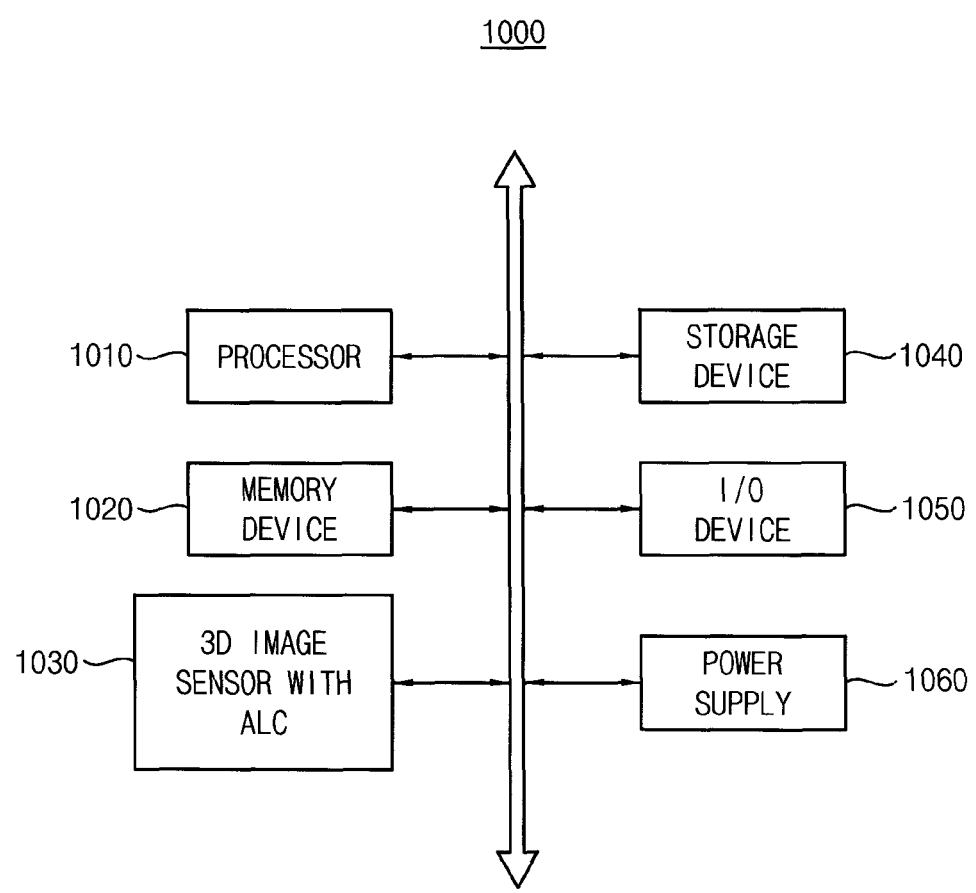
FIG. 39 is a block diagram illustrating an application where the three-dimensional image sensor according to example embodiments is applied to a computing system.

FIG. 39 is a block diagram illustrating an application in which the three-dimensional image sensor according to example embodiments is applied to a computing system.

Referring to FIG. 39, the computing system 1000 may include a processor 1010, a memory device 1020, a three-dimensional image sensor 1030, a storage device 1040, an input/output device 1050 and a power supply 1060. Although not shown in FIG. 39, the computing system 1000 may further include ports capable of establishing communication with a video card, a sound card, a memory card, a USB device or other electronic devices.

The processor 1010 may perform specific calculations or tasks. According to example embodiments, the processor 1010 may include a micro-processor or a CPU (Central Processing Unit). The processor 1010 can establish communication with the memory device 1020, the storage device 1040 and the input/output device 1050 through an address bus, a control bus and a data bus. According to example embodiments, the processor 1010 may be further connected to an expansion bus, such as a PCI (Peripheral Component Interconnect) bus.

The memory device 1020 may store data required to operate the computing system 1000. For instance, the memory device 1020 may be implemented as a volatile memory, such as a DRAM (Dynamic Random Access Memory), an SRAM (Static Random Access Memory) or a mobile DRAM. In addition, the memory device 1020 may be implemented as a nonvolatile memory, such as an EEPROM (Electrically Erasable Programmable Read-Only Memory), a flash memory, a PRAM (Phase Change Random Access Memory), an RRAM (Resistance Random Access Memory), an NFGM (Nano Floating Gate Memory), a PoRAM (Polymer Random Access Memory), an MRAM (Magnetic Random Access Memory), an FRAM (Ferroelectric Random Access Memory), a PRAM (Phase Change Random Access Memory), an RRAM (Resistance Random Access Memory), an NFGM (Nano Floating Gate Memory), a PoRAM (Polymer Random Access Memory), an MRAM (Magnetic Random Access Memory) or an FRAM (Ferroelectric Random Access Memory).

The storage device 1040 may include a solid state drive, a hard disk drive or a CD-ROM. The input/output device 1050 may include an input unit, such as a keyboard, a keypad or a mouse, and an output unit, such as a printer or a display. The power supply 1060 may supply power required to operate the computing system 1000.

The three-dimensional image sensor 1030 can be connected to the processor 1010 through the buses or other communication links to establish communication with the processor 1010. As described above, the three-dimensional image sensor 1030 may be the three-dimensional image sensor that provides distance information and color image information. The three-dimensional image sensor 1030 may include depth pixels and color pixels to provide distance information and color image information. Each depth pixel includes the compensation unit having the photo detection area which generates the first charges corresponding to one of an electron-hole pair (for instance, electrons) based on the received light RX, and the ambient light detection area which generates the second charges corresponding to the other of the electron-hole pair (for instance, holes) based on the ambient light components. Since some of the first charges are extinguished after being combined with the second charges, the three-dimensional image sensor 1030 including the depth pixels can accurately measure the distance to the subject without performance degradation even when the ambient light is relatively strong.

The three-dimensional image sensor 1030 may be packaged according to any of various packaging technologies. For instance, at least a part of the three-dimensional image sensor 1030 may be mounted by using package technologies, such as PoP (Package on Package), Ball grid arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP) and Wafer-Level Processed Stack Package (WSP).

Meanwhile, the computing system 1000 must be any of various types of computing systems employing a three-dimensional image sensor. For instance, the computing system 1000 may include a mobile phone, a smart phone, a PDA (personal digital assistant), a PMP (portable multimedia player), a digital camera, a PC (Personal Computer), a server computer, a workstation, a laptop computer, a digital television, a set-top box), a music player), a portable game console) and a navigation system.

Figure 40:
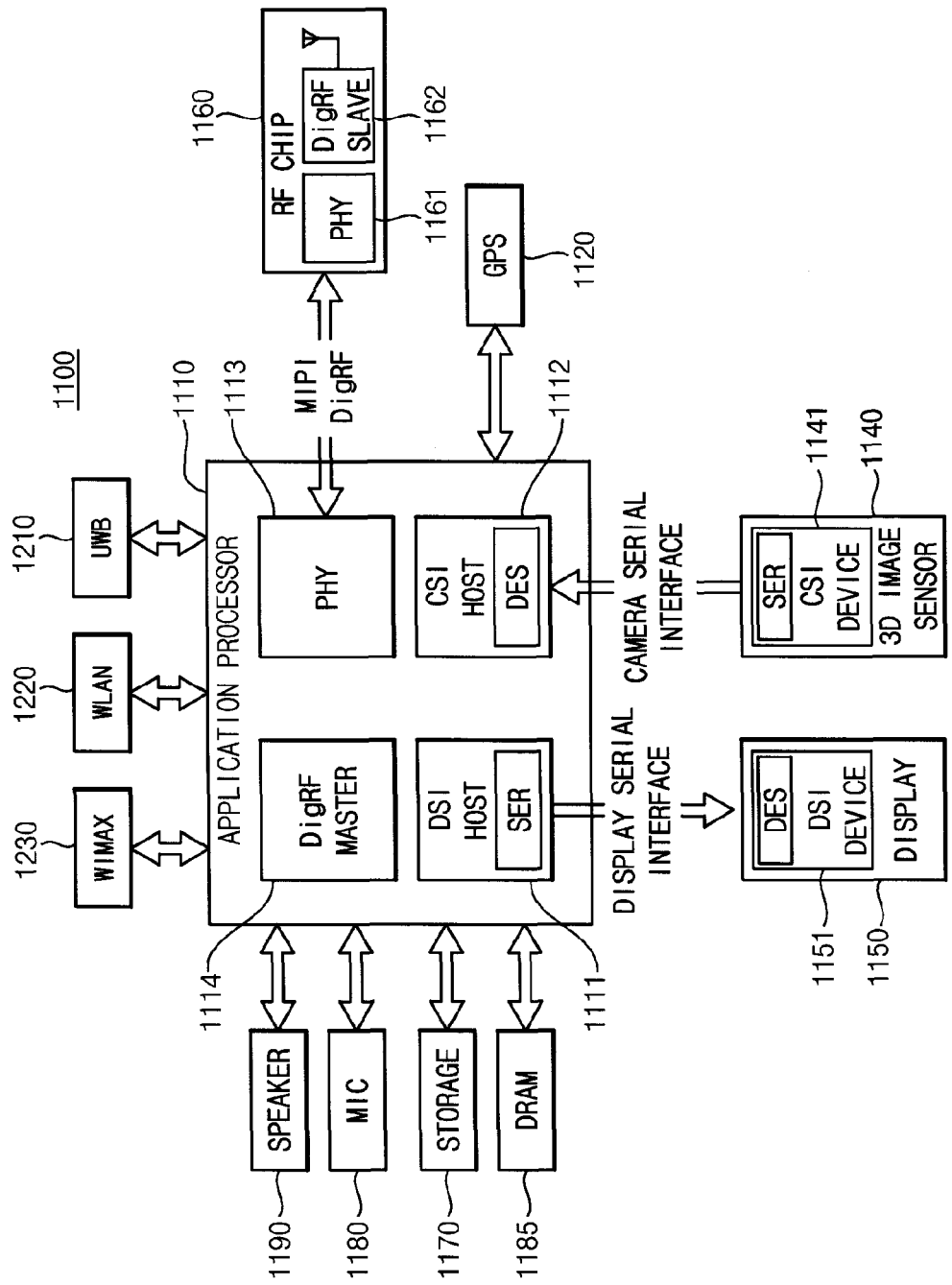
FIG. 40 is a block diagram illustrating one example of an interface used in the computing system of FIG. 39.

FIG. 40 is a block diagram illustrating one example of an interface used in the computing system of FIG. 39.

Referring to FIG. 40, the computing system 1100 may be implemented as a data processing device (for instance, a portable phone, a PDA, a portable multimedia player or a smart phone) that uses or supports an MIPI (mobile industry processor interface). The computing system 1100 may include an application processor 1110, a three-dimensional image sensor 1140, and a display device 1150.

A CSI host 1112 of the application processor 1110 may perform a serial communication with a CSI device 1141 of the three-dimensional image sensor 1140 via a camera serial interface (CSI). In one example embodiment, the CSI host 1112 may include a de-serializer DES and the CSI device 1141 may include a serializer SER. A DSI host 1111 of the application processor 1110 may perform a serial communication with a DSI device 1151 of the display device 1150 via a display serial interface (DSI). In one example embodiment, the DSI host 1111 may include a serializer SER and the DSI device 1151 may include a de-serializer DES.

The computing system 1000 may further include a radio frequency (RF) chip 1160 performing a communication with the application processor 1110. A physical layer (PHY) 1113 of the computing system 1100 and a physical layer (PHY) 1161 of the RF chip 1160 may perform data communications based on a MIPI DigRF. The application processor 1110 may further include a DigRF MASTER 1114 that controls the data communication of the PHY 1161.

Meanwhile, the computing system 1000 may include a global positioning system (GPS) 1120, a storage 1170, a microphone 1180, a DRAM 1185, and a speaker 1190. In addition, the computing system 1100 may perform data communications using an ultra-wideband (UWB) 1120, a wireless local area network (WLAN) 1220, and a worldwide interoperability for microwave access (WIMAX) 1230. However, the above structure of the computing system 1100 and the interface are for illustrative purpose only, and the example embodiments may not be limited thereto.

Example embodiments may be applied to a three-dimensional image sensor and to an electronic device including the same. For example, example embodiments may be applied to various devices such as a portable phone, a smart phone, a tablet PC, a laptop computer, a personal digital assistant (PDA), a portable media player (PMP), a digital camera, a music player, a game console and a navigation system.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A depth pixel of a three-dimensional image sensor, the depth pixel comprising:
    a first photo gate which is turned on/off in response to a first photo control signal;
    a first photo detection area configured to generate first charges having a first polarity based on a received light reflected from a subject when the first photo gate is turned on;
    a first transmission gate which is turned on/off in response to a first transmission control signal;
    a first floating diffusion area configured to accumulate the first charges generated from the first photo detection area when the first transmission gate is turned on; and
    a first compensation unit configured to generate second charges having a second polarity which is different from the first polarity based on ambient light components included in the received light to supply the second charges to the first floating diffusion area.

2. The depth pixel of claim 1, wherein the first compensation unit comprises:
a first ambient light detection area configured to generate the second charges based on the ambient light components; and
a first injection gate which is turned on/off in response to a first injection control signal.

3. The depth pixel of claim 2, wherein the second charges generated from the first ambient light detection area are injected into the first floating diffusion area when the first injection gate is turned on.

4. The depth pixel of claim 2, wherein a size of the first ambient light detection area is smaller than a size of the first photo detection area.

5. The depth pixel of claim 2, wherein the first ambient light detection area includes an impurity region formed in a semiconductor substrate, a conductive type of the impurity region is the same as that of the semiconductor substrate, and an impurity concentration of the impurity region is greater than that of the semiconductor substrate.

6. The depth pixel of claim 5, wherein an impurity concentration of the impurity region gradually increases in a direction towards a surface of the semiconductor substrate to which the received light is incident.

7. The depth pixel of claim 2, wherein the first compensation unit further comprises a first reset transistor configured to initialize the first ambient light detection area in response to a first reset signal.

8. The depth pixel of claim 2, wherein the first compensation unit further comprises:
a second transmission gate which is turned on/off in response to a second transmission control signal; and
a first storage area configured to store the second charges generated from the first ambient light detection area when the second transmission gate is turned on.

9. The depth pixel of claim 8, wherein the second charges stored in the first storage area are injected into the first floating diffusion area when the first injection gate is turned on after the second transmission gate is turned on.

10. The depth pixel of claim 8, wherein the first ambient light detection area comprises:
a first impurity region formed in a semiconductor substrate, a conductive type of the first impurity region is the same as that of the semiconductor substrate, and an impurity concentration of the first impurity region is greater than that of the semiconductor substrate; and
a second impurity region formed under the first impurity region in the semiconductor substrate, the second impurity region having a conductive type different from the conductive type of the first impurity region.

11. The depth pixel of claim 10, wherein the first ambient light detection area further comprises a third impurity region formed over the first impurity region in the semiconductor substrate, the third impurity region having the same conductive type as the second impurity region.

12. The depth pixel of claim 8, wherein the first compensation unit further comprises a first reset transistor configured to initialize the first storage area in response to a first reset signal.

13. The depth pixel of claim 1, further comprising:
a second photo gate which is turned on/off in response to a second photo control signal;
a second photo detection area configured to generate third charges based on the received light when the second photo gate is turned on;
a second transmission gate which is turned on/off in response to a second transmission control signal;
a second floating diffusion area configured to accumulate the third charges generated from the second photo detection area when the second transmission gate is turned on; and
a second compensation unit configured to generate fourth charges which are different from the third charges based on the ambient light components to supply the fourth charges to the second floating diffusion area.

14. The depth pixel of claim 13, further comprising a channel stop area located between the first photo detection area and the second photo detection area.

15. The depth pixel of claim 1, wherein the first photo control signal is periodically toggled between a first logic level and a second logic level during a light collection period, and has a first logic level during a readout period, and
the second charges are generated and collected during the light collection period and injected into the first floating diffusion area during the light collection period or the readout period.

16. The depth pixel of claim 1, further comprising a first output unit configured to generate an output voltage corresponding to a sum of the first and second charges.

17. The depth pixel of claim 16, wherein the first output unit comprises:
a first reset transistor configured to initialize the first floating diffusion area in response to a first reset signal;
a first drive transistor configured to amplify a voltage of the first floating diffusion area; and
a first select transistor configured to output the voltage amplified by the first drive transistor as the output voltage.

18. A depth pixel of a three-dimensional image sensor, the depth pixel comprising:
first and second photo detection areas configured to generate first charges having a first polarity based on a received light reflected from a subject;
first and second floating diffusion areas configured to accumulate the first charges generated from the first and second photo detection areas, respectively; and
first and second compensation units configured to generate second charges having a second polarity which is different from the first polarity based on ambient light components included in the received light to supply the second charges to the first and second floating diffusion areas, respectively.

19. The depth pixel of claim 18, further comprising:
first and second bridge diffusion areas adjacent to the first and second photo detection areas, respectively; and
first and second photo gates formed over the first and second photo detection areas, respectively, and configured to store the first charges generated from the first and second photo detection areas in the first and second bridge diffusion areas, respectively, in response to first and second photo control signals.

20. The depth pixel of claim 18, further comprising:
first and second storage areas spaced apart from the first and second photo detection areas, respectively; and
first and second photo gates configured to electrically connect the first and second photo detection areas to the first and second storage areas, respectively, in response to first and second photo control signals.

21. The depth pixel of claim 18, further comprising:
first and second bridge diffusion areas adjacent to the first and second photo detection areas, respectively;
first and second storage areas spaced apart from the first and second bridge diffusion areas, respectively;

first and second photo gates formed over the first and second photo detection areas, respectively, and configured to store the first charges generated from the first and second photo detection areas in the first and second bridge diffusion areas, respectively, in response to first and second photo control signals; and first and second storage gates configured to electrically connect the first and second bridge diffusion areas to the first and second storage areas, respectively.

22. A three-dimensional image sensor comprising:

a light source unit configured to illuminate a subject with modulated transmission light; and a pixel array comprising a plurality of depth pixels and configured to generate distance information indicative of a distance to the subject based on a received light reflected from the subject, wherein a first depth pixel among the plural depth pixels comprises:

a first photo gate which is turned on/off in response to a first photo control signal;

a first photo detection area configured to generate first charges having a first polarity based on the received light when the first photo gate is turned on;

a first transmission gate which is turned on/off in response to a first transmission control signal;

a first floating diffusion area configured to accumulate the first charges generated from the first photo detection area when the first transmission gate is turned on; and a first compensation unit configured to generate second charges having a second polarity which is different from the first polarity based on ambient light components included in the received light to supply the second charges to the first floating diffusion area.

23. The three-dimensional image sensor of claim 22, wherein a second depth pixel among the plural depth pixels, which is adjacent to the first depth pixel, comprises:

a second photo gate which is turned on/off in response to a second photo control signal;

a second photo detection area configured to generate third charges based on the received light when the second photo gate is turned on;

a second transmission gate which is turned on/off in response to a second transmission control signal; and a second floating diffusion area configured to accumulate the third charges generated from the second photo detection area when the second transmission gate is turned on, wherein the first compensation unit is shared by the first and second depth pixels, and is configured to generate the second charges which are different from the third charges.

* * * * *